(12) United States Patent
Tanisho et al.

(10) Patent No.: US 8,402,414 B2
(45) Date of Patent: Mar. 19, 2013

(54) SUPPORT COMPUTER PRODUCT, APPARATUS AND METHOD FOR WIRING OF INTEGRATED CIRCUIT DESIGN

(75) Inventors: Motoyuki Tanisho, Kawasaki (JP); Toshiyasu Sakata, Kawasaki (JP); Yoshitaka Nishio, Kawasaki (JP); Ikuo Ohtsuka, Kawasaki (JP); Kazunori Kumagai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 34 days.

(21) Appl. No.: 13/034,135

(22) Filed: Feb. 24, 2011

(65) Prior Publication Data

US 2011/0231810 A1    Sep. 22, 2011

(30) Foreign Application Priority Data

Mar. 19, 2010   (JP) ................................. 2010-065180

(51) Int. Cl.
*G06F 17/50* (2006.01)

(52) U.S. Cl. ........ 716/126; 716/130; 716/131; 716/132; 716/135; 716/139

(58) Field of Classification Search .................. 716/126, 716/130–131, 132, 135, 139
See application file for complete search history.

(56) References Cited

U.S. PATENT DOCUMENTS

| 5,657,242 | A  | * | 8/1997  | Sekiyama et al. | ............ 716/126 |
| 5,757,089 | A  | * | 5/1998  | Ishizuka        | ....................... 307/147 |
| 6,832,362 | B2 | * | 12/2004 | Nuber           | ........................... 716/114 |
| 7,143,385 | B2 | * | 11/2006 | Itou et al.     | ...................... 716/131 |
| 8,056,042 | B2 | * | 11/2011 | Miyagawa        | ..................... 716/129 |

FOREIGN PATENT DOCUMENTS

JP         2006-011684         1/2006

* cited by examiner

*Primary Examiner* — Nghia Doan
(74) *Attorney, Agent, or Firm* — Squire Sanders (US) LLP

(57) ABSTRACT

A computer-readable, non-transitory medium stores therein a design support program that causes a computer executing tentative wiring processing between a first terminal group and a second terminal group in a tentative wiring area to execute a process. The process includes detecting unwired nets occurring in the tentative wiring area consequent to the tentative wiring processing; updating the tentative wiring area by expanding the tentative wiring area according to the number of unwired nets, if any unwired nets are detected at the detecting; controlling to execute the tentative wiring processing and the subsequent detecting with respect to the tentative wiring area updated at the updating; and determining the tentative wiring area to be a wiring area if no unwired nets are detected at the detecting.

9 Claims, 53 Drawing Sheets

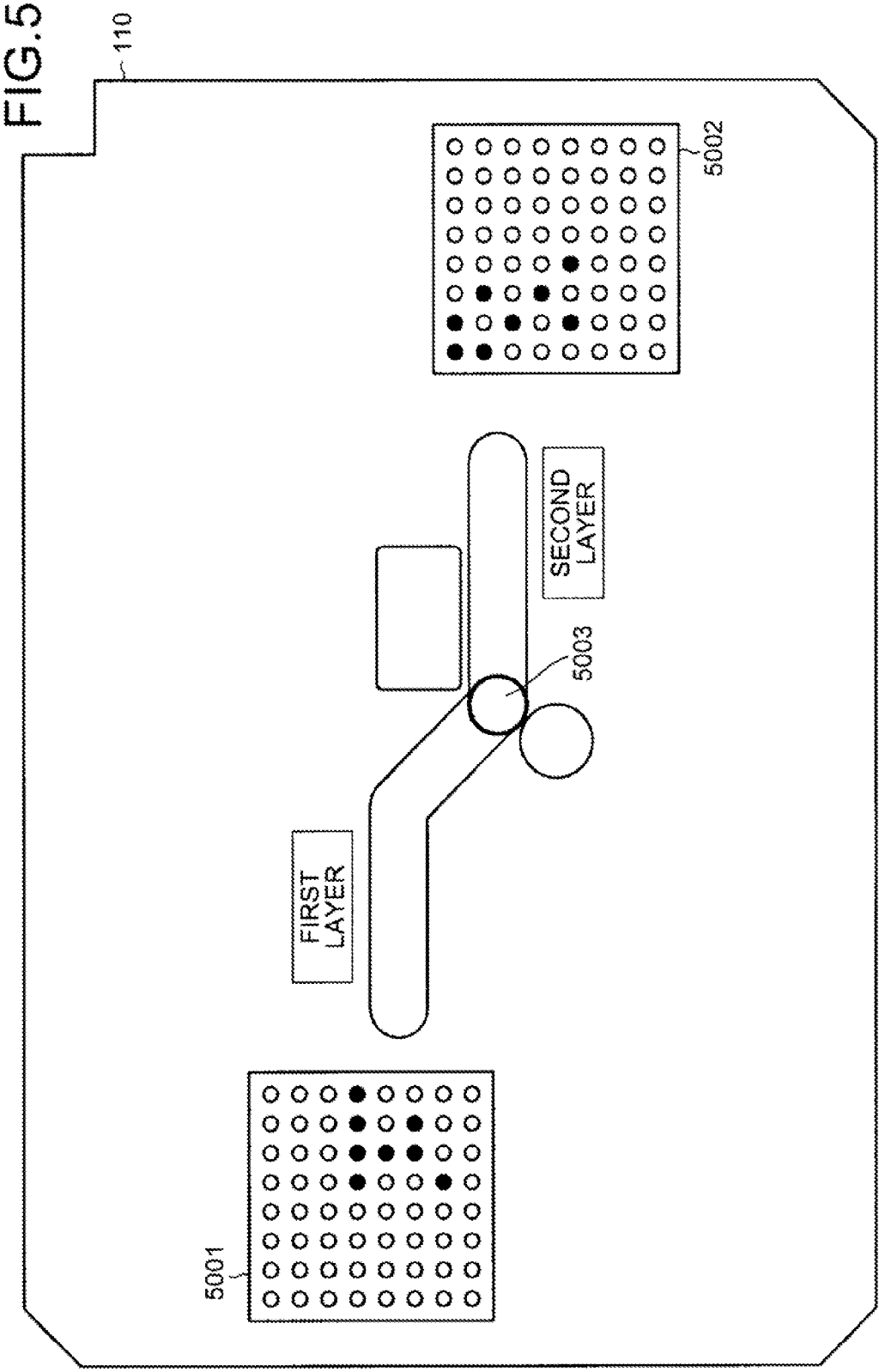

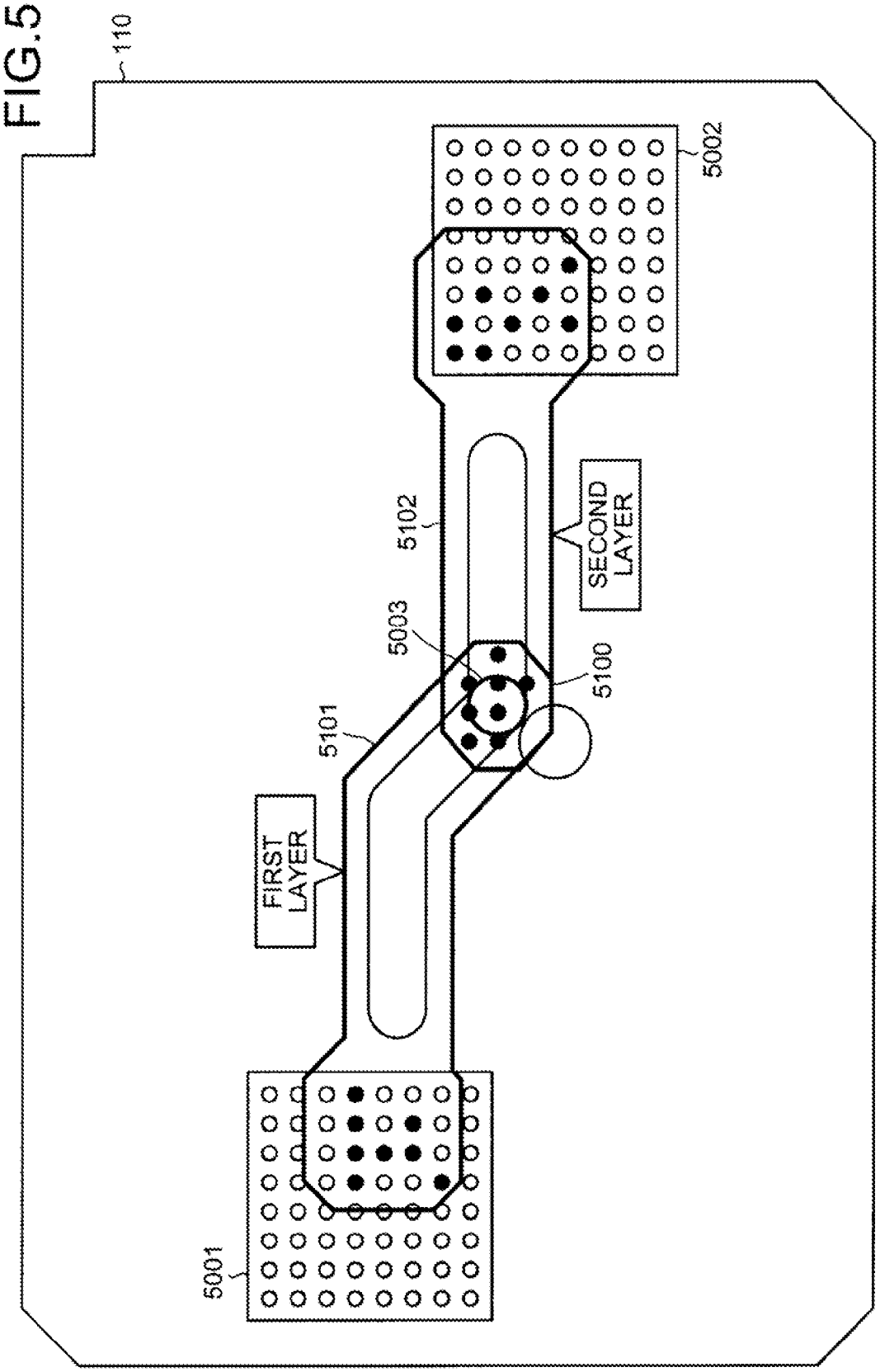

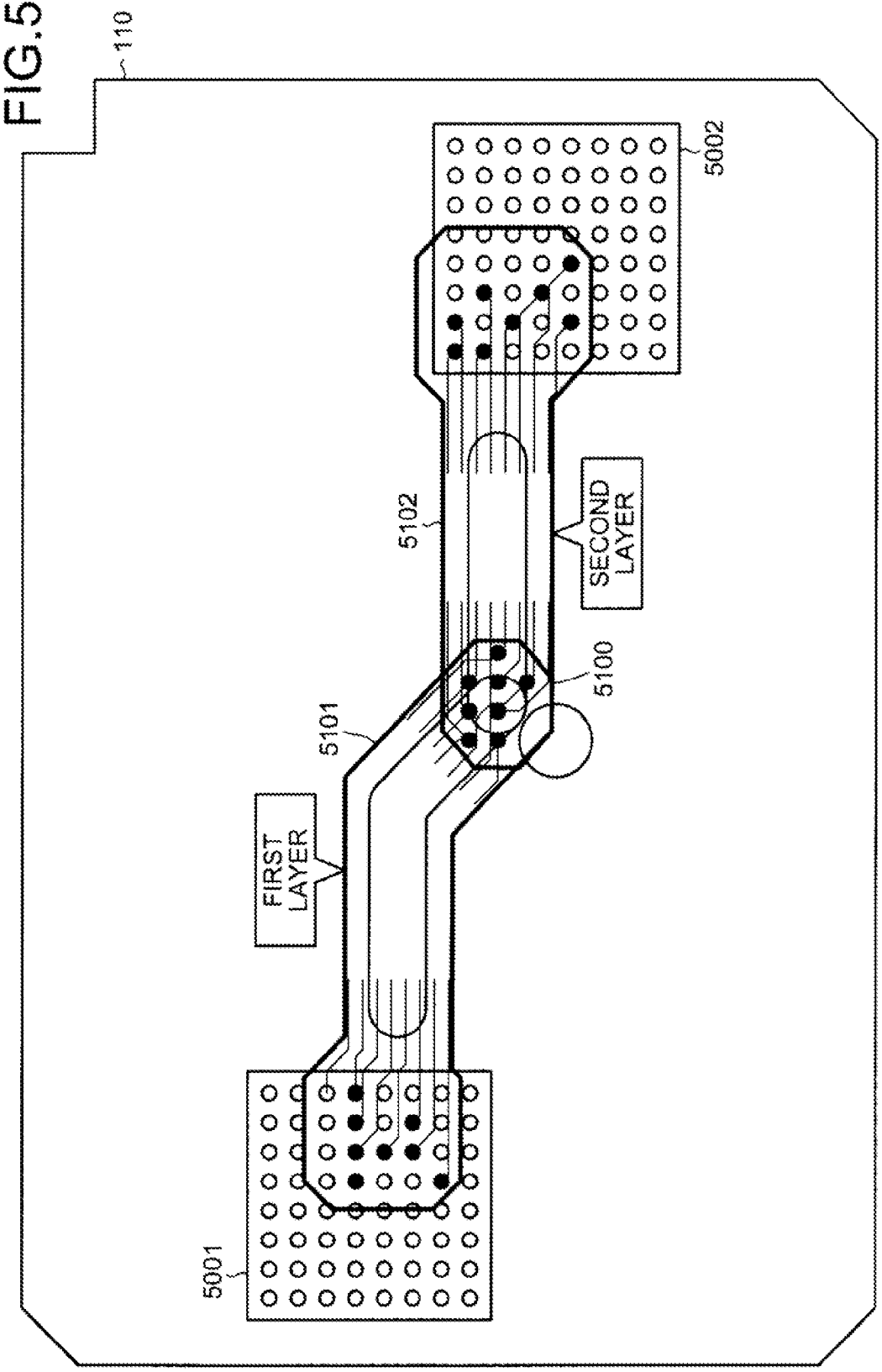

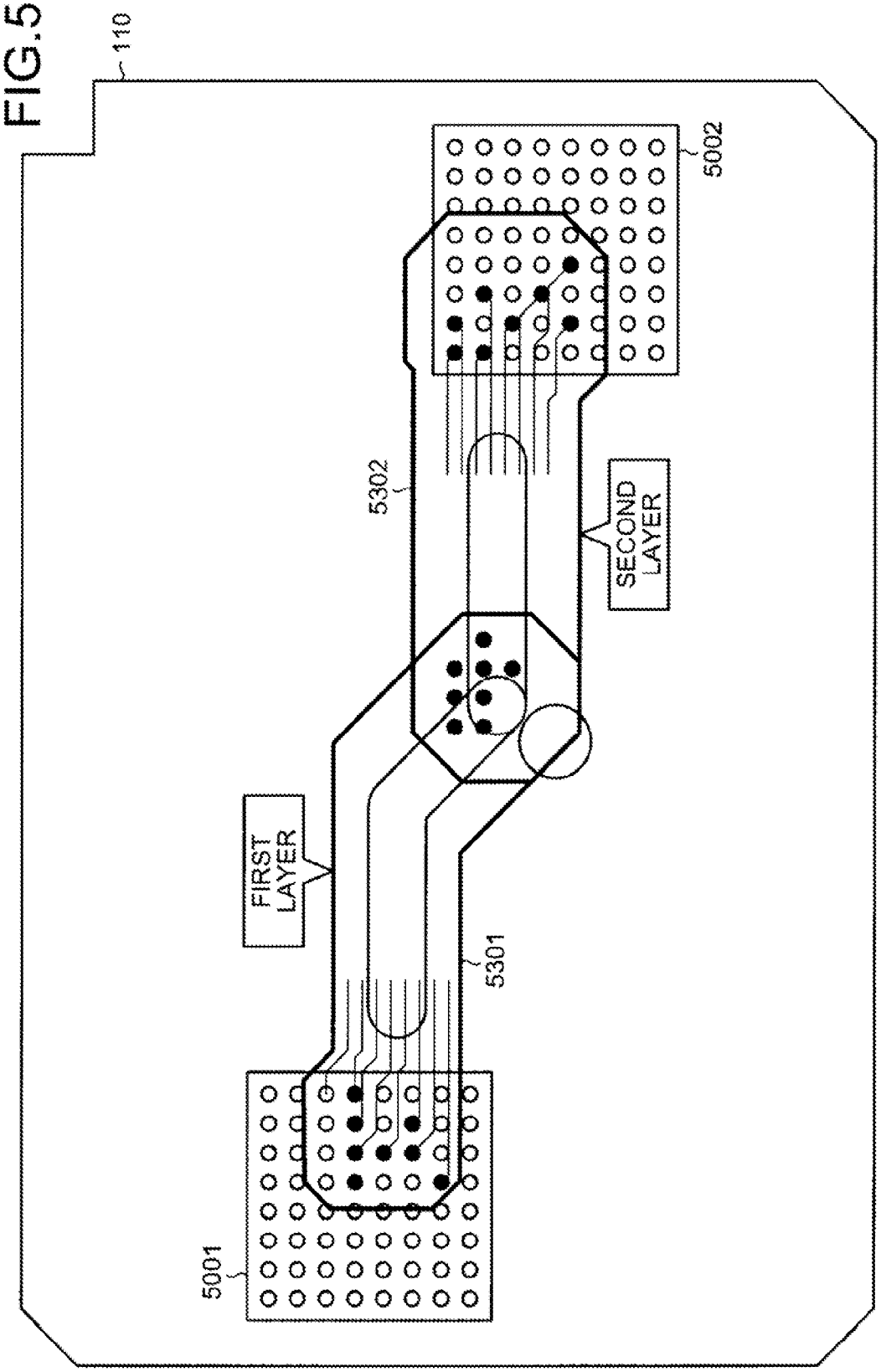

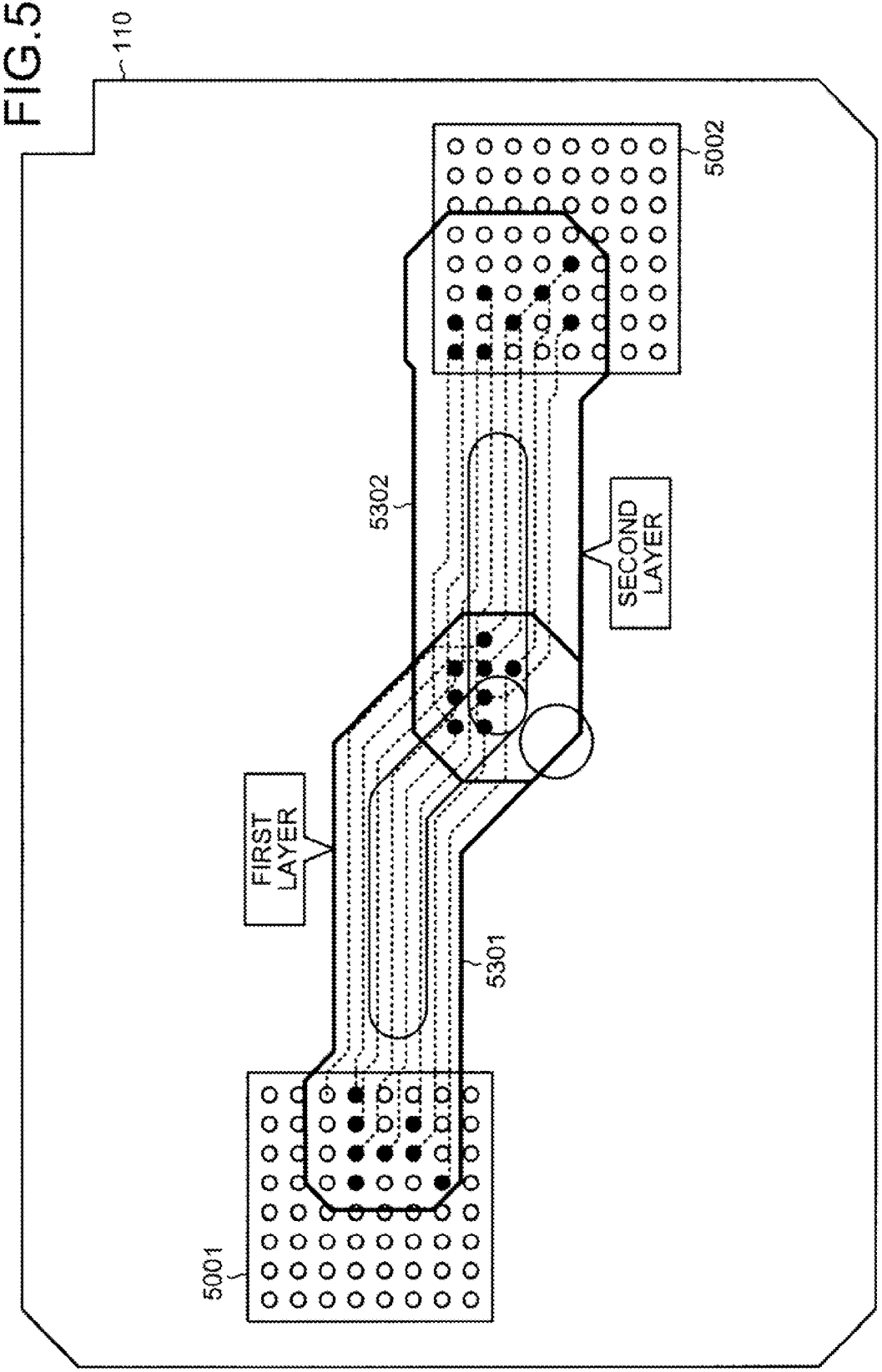

SUPPORT COMPUTER PRODUCT, APPARATUS AND METHOD FOR WIRING OF INTEGRATED CIRCUIT DESIGN

CROSS REFERENCE TO RELATED APPLICATIONS

This application is based upon and claims the benefit of priority of the prior Japanese Patent Application No. 2010-065180, filed on Mar. 19, 2010, the entire contents of which are incorporated herein by reference.

FIELD

The embodiments discussed herein are related to supporting automatic wiring of a variety of boards.

BACKGROUND

Conventionally, various wiring technologies have been provided for the purpose of efficient wiring of various types of boards. In recent years, in view of an increased demand for a printed circuit board for high-speed signal use, there is demand for development of a technology to support wiring design of forming a bus consisting of plural signal lines (nets) and wiring the bus as a bundle of lines. Specifically, in computer aided design (CAD) for the printed circuit boards, a number of automatic wiring technologies have been provided that enable automatic wiring by specification of the bus.

Further, there is demand for designers to reduce costs in wiring works. As a measure for cost reduction, an approach of wiring the printed circuit board as a whole at high density to minimize the number of wiring layers is effective. Specifically, consideration is made of whether there is any obstacle or any interference with a path of another bus, etc., based on the number of the nets in each bus, a line breadth, and a gap value. It becomes important at which layer and at which location to establish an area minimally required for the wiring (wiring area), namely, processing of determining the appropriate wiring area.

For example, a technology has been provided of determining the wiring area focusing attention on the path and information of each net pre-established by a designer or a system with respect to the bus to be wired on the printed circuit board. This technology is further provided with a function of taking into consideration overlapping of the determined wiring area of an object bus and the wiring area of an adjacent bus when judging whether the determined wiring area is appropriate (see, e.g., Japanese Patent Laid-Open Publication No. 2006-11684).

In the case of the conventional technology described above, however, in such a printed circuit board that has densely-packed buses, the degree of congestion of the printed circuit board differs depending on the order of the bus in which the wiring is executed and the determined wiring area can possibly be inappropriate. Therefore, when the wiring of the object bus is actually executed using the wiring area determined by the technology described above, an unwired signal line (unwired net) can occur.

Generally, the degree of congestion on the printed circuit board differs depending on the situation of the wiring and elements arranged on the printed circuit board when the wiring is instructed. It has been difficult to determine the minimally required wiring area so as not to cause any unwired net to all nets belonging to the bus. There has been a problem in that after the wiring area has been determined, an occurrence of any unwired net at the time of actual wiring execution brings about reworking of the wiring area at the layout design, increasing design time and design load and resulting in increased costs.

SUMMARY

According to an aspect of an embodiment, a computer-readable, non-transitory medium stores therein a design support program that causes a computer executing tentative wiring processing between a first terminal group and a second terminal group in a tentative wiring area to execute a process. The process includes detecting unwired nets occurring in the tentative wiring area consequent to the tentative wiring processing; updating the tentative wiring area by expanding the tentative wiring area according to the number of unwired nets, if any unwired nets are detected at the detecting; controlling to execute the tentative wiring processing and the subsequent detecting with respect to the tentative wiring area updated at the updating; and determining the tentative wiring area to be a wiring area if no unwired nets are detected at the detecting.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 50 is an explanatory diagram of an example of establishing the tentative wiring area and a switching point in the fifth example.

FIG. 51 is an explanatory diagram of an example of establishing the tentative wiring area of each layer in the fifth example.

FIG. 52 is an explanatory diagram of an example of verifying the wiring capacity of each layer in the fifth example.

FIG. 53 is an explanatory diagram of an example of expanding the tentative wiring area of each layer in the fifth example.

FIG. 54 is an explanatory diagram of an example of determining the wiring area of each layer in the fifth example.

DESCRIPTION OF EMBODIMENTS

Preferred embodiments of the present invention will be explained with reference to the accompanying drawings.

Figure 1:
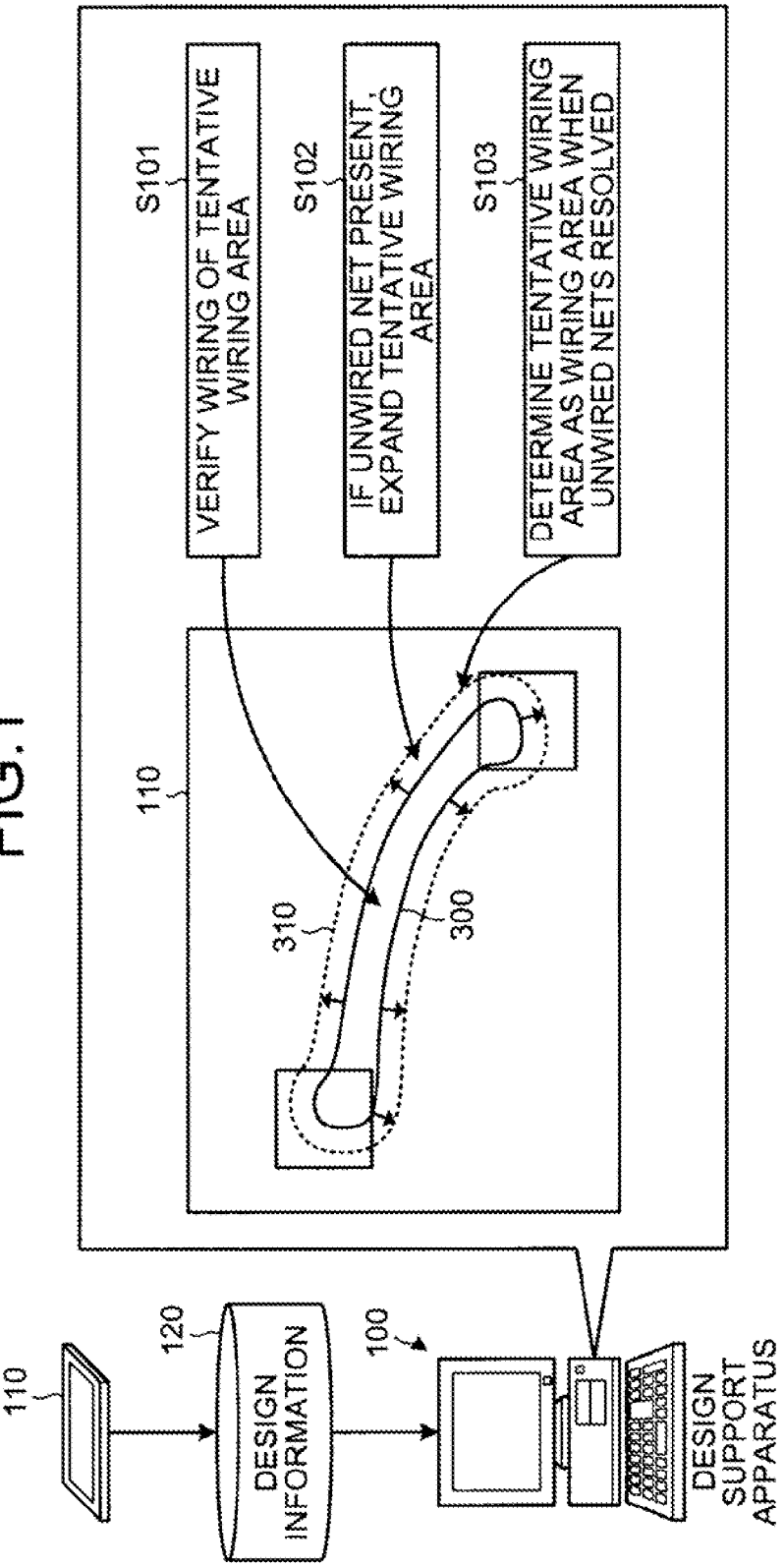
FIG. 1 is an explanatory diagram of one example of design support processing according to an embodiment.

FIG. 1 is an explanatory diagram of one example of design support processing according to the present embodiment. As depicted in FIG. 1, in the design support processing according to the present embodiment, a design support apparatus 100 determines a wiring area of an object bus from design information 120 of a printed circuit board 110. The wiring area determined by the design support apparatus 100, which is verified not to cause an unwired net, is capable of supporting an efficient wiring design with no return to a layout design.

In the design support apparatus 100, an appropriate wiring area is determined using an outline path established by the design information 120 and a tentative wiring area generated based on an outline path. Therefore, the outline path and the tentative wiring area will firstly be described with reference to FIGS. 2 and 3.

Figure 2:
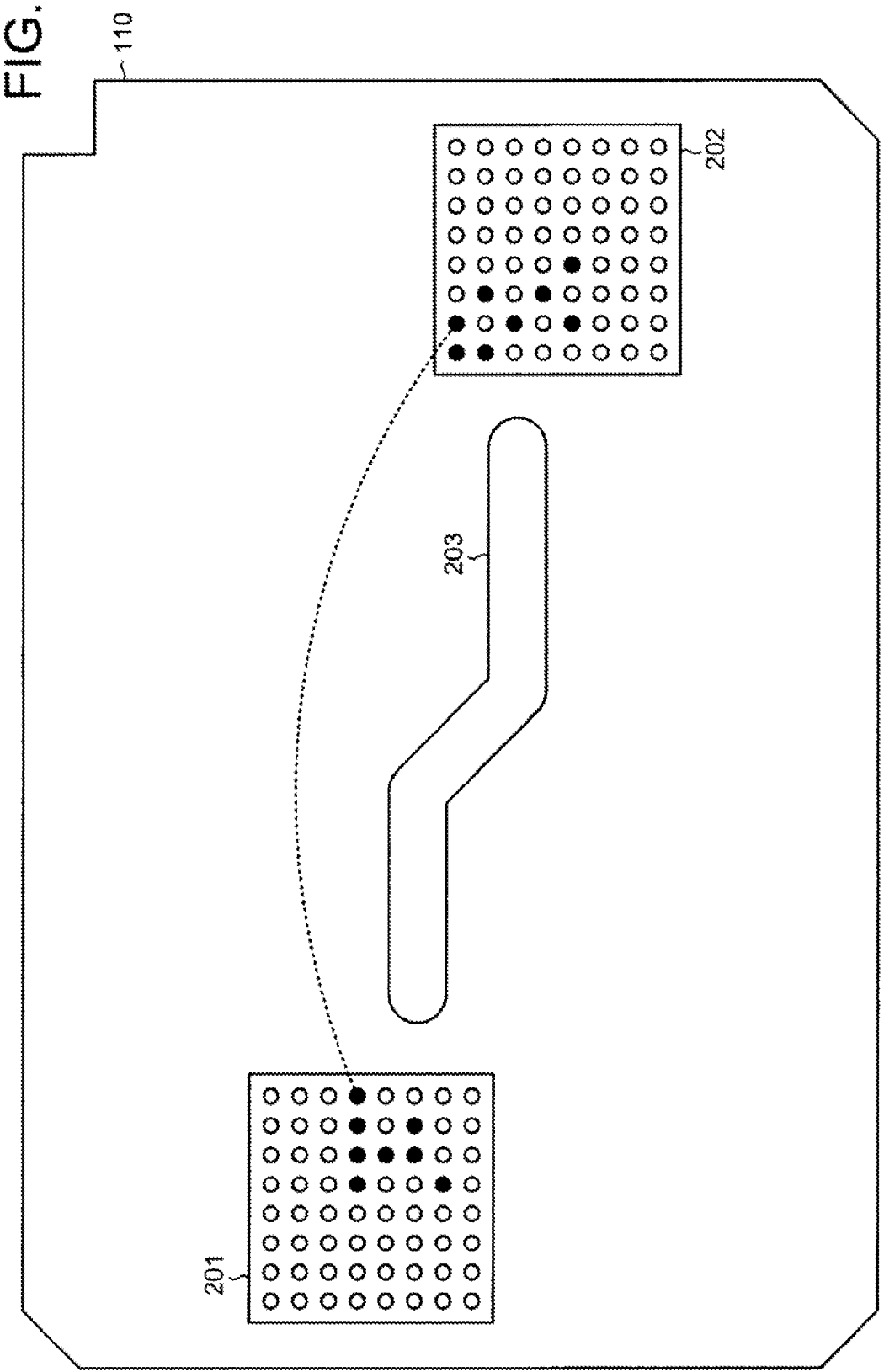
FIG. 2 is an explanatory diagram of one example of an outline path.

FIG. 2 is an explanatory diagram of one example of an outline path. In the design information 120, an outline path 203 is established for a bus desired to be wired to terminal groups 201 and 202 on the printed circuit board 110, as depicted in FIG. 2. The outline path is a path pre-specified by a designer or a high-order system for wiring plural signal lines (nets) belonging to the bus as a bundle of lines. The design support apparatus 100 determines the wiring area in the vicinity of the outline path 203.

Figure 3:
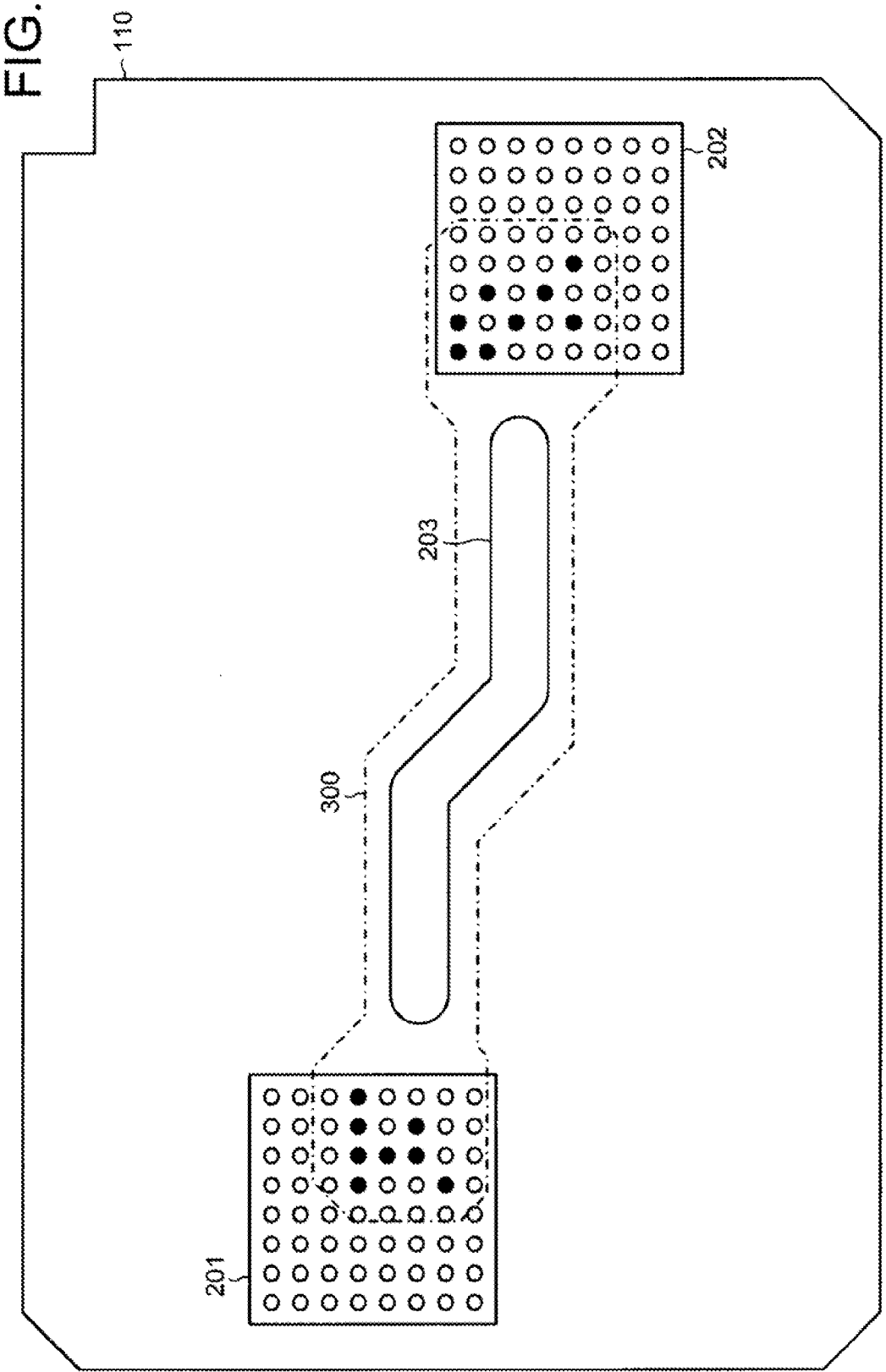
FIG. 3 is an explanatory diagram of an example of establishing a tentative wiring area.

FIG. 3 is an explanatory diagram of an example of establishing a tentative wiring area. To determine the wiring area, a tentatively established wiring area (hereinafter, "tentative wiring area") 300 is required beforehand, based on the outline path 203. The tentative wiring area 300 is established referring to such information as the number of the nets belonging to the bus as an object, the line breadth of each net, the line-to-line space, and terminal location from the design information 120 (detailed description is omitted of a technique of establishing the tentative wiring area, which is a known technology). At the time of establishing the tentative wiring area, obstacles on the printed circuit board 110 are not taken into consideration.

Returning to the description of FIG. 1, the design support apparatus 100 performs wiring verification of the tentative wiring area 300 established as described above (step S101). The wiring verification is processing of verifying how the wiring will be made when each net of the bus as an object is wired to the tentative wiring area 300. In the present embodiment, to identify, in particular, the presence or absence of an unwired net, verification of wiring capacity is executed as the wiring verification (to be described later).

If the results of the wiring verification executed at step S101 indicates an unwired net, then the design support apparatus 100 expands the tentative wiring area 300, establishing a new tentative wiring area 310 (step S102). Thereafter, the design support apparatus 100 determines the tentative wiring area at the time that the unwired net is resolved, (e.g. tentative wiring area 300, 310) to be the wiring area (step S103), ending a sequence of processing. That is to say, the design support apparatus 100 refers to the design information 120 and, if it is judged that there is no unwired net in the tentative wiring area 300 initially established, determines the tentative wiring area 300 as the wiring area and, if it is judged that there is no unwired net after the processing of expansion to the tentative wiring area 310, determines the tentative wiring area 310 as the wiring area.

As described above, the design support apparatus 100 according to the present embodiment is capable of verifying the tentative wiring area established from the design information 120 and according to results of the verification, automatically determining the wiring area in which no unwired net occurs. As described above, the design support apparatus 100 according to the present embodiment supports the layout design of the printed circuit board 110 by its function of determining an appropriate wiring area with respect to the bus. Therefore, the design support apparatus 100 may be configured independently as an apparatus that determines the wiring area as exemplified in FIG. 1 or may be incorporated as a part of the function of a design device that performs layout design. In the case of independent configuration, after the determination of the wiring design, the layout design of the printed circuit board 110 is executed by another layout design device.

Figure 4:
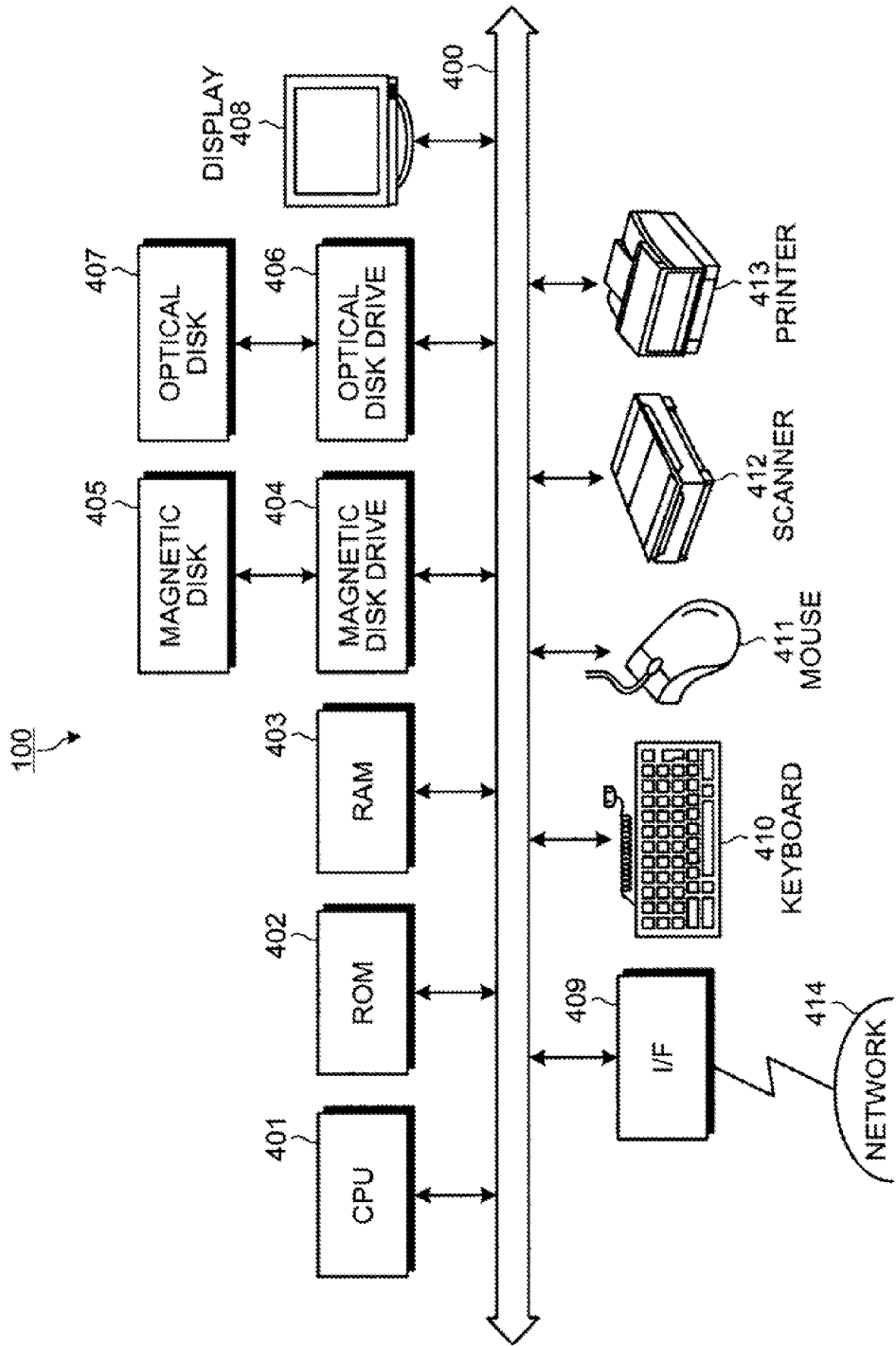
FIG. 4 is a block diagram of a hardware configuration of a design support apparatus.

A hardware configuration of the design support apparatus 100 according to the present embodiment will be described. FIG. 4 is a block diagram of a hardware configuration of a design support apparatus 100 according to the embodiment. As depicted in FIG. 4, the design support apparatus 100 includes a central processing unit (CPU) 401, a read-only memory (ROM) 402, a random access memory (RAM) 403, a magnetic disk drive 404, a magnetic disk 405, an optical disk drive 406, an optical disk 407, a display 408, an interface (I/F) 409, a keyboard 410, a mouse 411, a scanner 412, and a printer 413, respectively connected by a bus 400.

The CPU 401 governs overall control of the design support apparatus 100. The ROM 402 stores therein programs such as a boot program and a design support program. The RAM 403 is used as a work area of the CPU 401. The magnetic disk drive 404, under the control of the CPU 401, controls the reading and writing of data with respect to the magnetic disk 405. The magnetic disk 405 stores therein data written under control of the magnetic disk drive 404.

The optical disk drive 406, under the control of the CPU 401, controls the reading and writing of data with respect to the optical disk 407. The optical disk 407 stores therein data written under control of the optical disk drive 406, the data being read by a computer.

The display 408 displays, for example, data such as text, images, functional information, etc., in addition to a cursor, icons, and/or tool boxes. A cathode ray tube (CRT), a thin-film-transistor (TFT) liquid crystal display, a plasma display, etc., may be employed as the display 408.

The I/F 409 is connected to a network 414 such as a local area network (LAN), a wide area network (WAN), and the Internet through a communication line and is connected to other apparatuses through the network 414. The I/F 409 administers an internal interface with the network 414 and controls the input/output of data from/to external apparatuses. For example, a modem or a LAN adaptor may be employed as the I/F 409.

The keyboard 410 includes, for example, keys for inputting letters, numerals, and various instructions and performs the input of data. Alternatively, a touch-panel-type input pad or numeric keypad, etc. may be adopted. The mouse 411 is used to move the cursor, select a region, or move and change the size of windows. A track ball or a joy stick may be adopted provided each respectively has a function similar to a pointing device.

The scanner 412 optically reads an image and takes in the image data into the design support apparatus 100. The scanner 412 may have an optical character reader (OCR) function as well. The printer 413 prints image data and text data. The printer 413 may be, for example, a laser printer or an ink jet printer.

Figure 5:
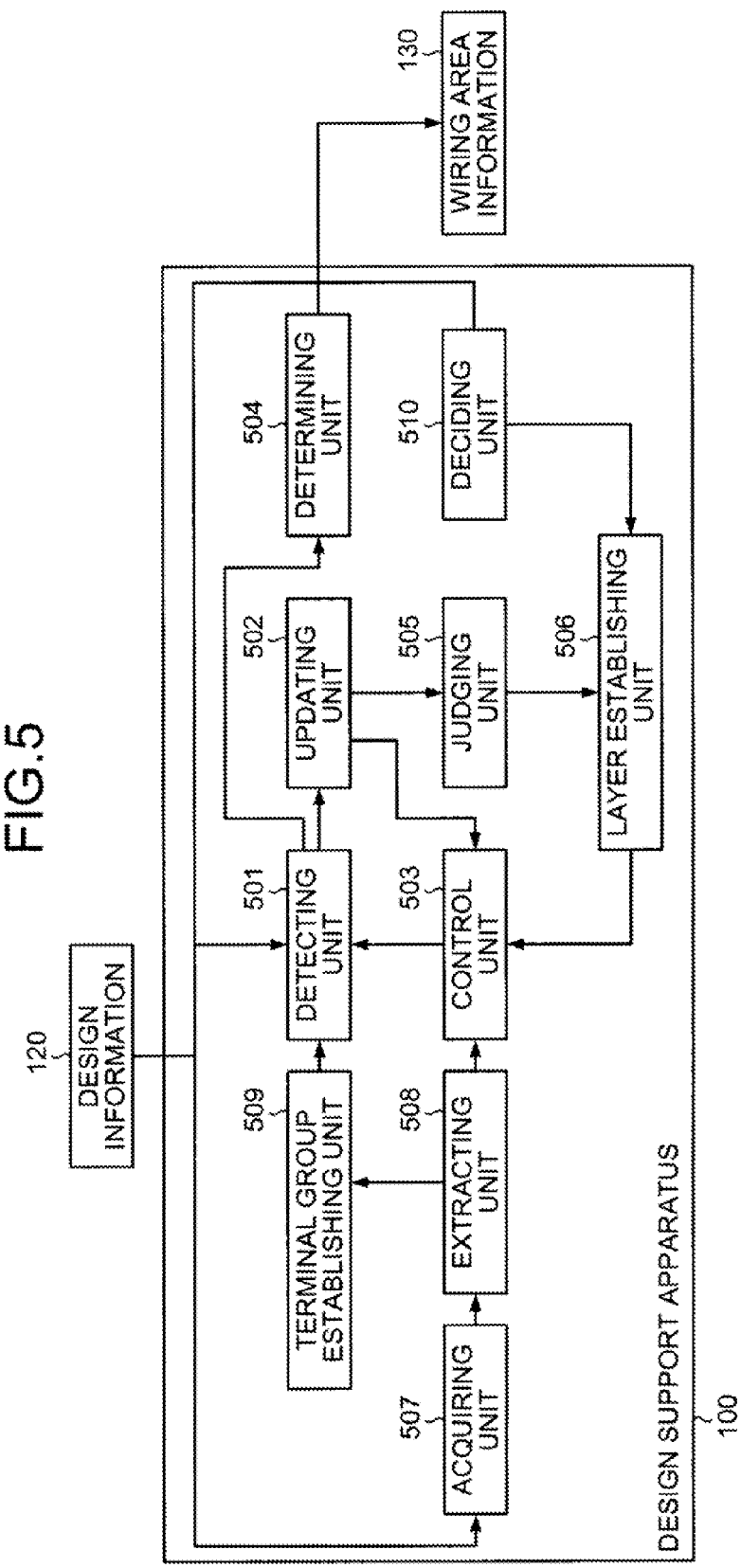
FIG. 5 is a block diagram of a functional configuration of the design support apparatus.

FIG. 5 is a block diagram of a functional configuration of the design support apparatus. The design support apparatus 100 includes a detecting unit 501, an updating unit 502, a control unit 503, a determining unit 504, a judging unit 505, a layer establishing unit 506, an acquiring unit 507, an extracting unit 508, a terminal group establishing unit 509, and a deciding unit 510, forming a control unit, having a function that specifically, for example, is implemented by the CPU 401 executing the design support program stored to a storage device such as the ROM 402, the RAM 403, the magnetic disk 405, and the optical disk 407 depicted in FIG. 4.

The design support apparatus 100 is equipped with a function of executing tentative wiring processing (equipped with various wiring engines) with respect to the space between specified terminal groups (here, as one example, between a first terminal group and a second terminal group) within the tentative wiring area established from the design information 120.

The detecting unit 501 has a function of executing processing of detecting an unwired net caused by the tentative wiring processing within the tentative wiring area. Specifically, the detecting unit 501 detects the number of the signal lines whose connection from the first terminal group to the second terminal group is not complete, from among the signal lines (nets) belonging to the bus under design. Results of detection of the unwired net are stored in a memory area of the RAM 403, the magnetic disk 405, the optical disk 407, etc.

The updating unit 502 has a function of executing the updating processing to expand the tentative wiring area according to the number of the detected unwired nets. Specifically, if an unwired net is detected by the detecting unit 501, the updating unit 502 expands the tentative wiring area according to the number of unwired nets. Therefore, when no unwired net is detected, the updating unit 502 does not execute such updating processing as described. The tentative wiring area expanded by the updating processing is stored to a memory area of the RAM 403, the magnetic disk 405, the optical disk 407, etc.

The control unit 503 has a function of controlling execution of the detecting processing by the detecting unit 501 according to execution situation of the updating processing. Specifically, if the updating processing is executed by the updating unit 502, the control unit 503 controls the detecting unit 501 to perform the tentative wiring processing within the tentative wiring area after the expansion as well as to execute the processing of detecting an unwired net caused by the tentative wiring processing. Results of detection of the unwired net by the re-executed detecting processing are also stored to a memory area of the RAM 403, the magnetic disk 405, the optical disk 407, etc.

The determining unit 504 has a function of determining the tentative wiring area as the wiring area, according to the results of detection of the unwired net. Specifically, the determining unit 504 determines a tentative wiring area in which no unwired net has been detected by the detecting unit 501, to be the wiring area. Therefore, when no unwired net has been detected as a result of the tentative wiring processing to the tentative wiring area expanded by the updating processing, the tentative wiring area after the updating is determined as the wiring area. Wiring area information 130 as the design information of the determined wiring area is stored to a memory area of the RAM 403, the magnetic disk 405, the optical disk 407, etc., in addition to being output as data of a predetermined format to an arbitrary recording medium.

The design support apparatus 100 is occasionally requested to perform processing of determining the wiring area of plural buses. In the case of handling plural buses, the control unit 503 is capable of determining appropriate wiring area with respect to plural buses, by causing the tentative wiring processing to be executed so as to avoid any wiring area that has already been determined by the determining unit 504 with respect to other buses.

As described above, in the case of determining the wiring area with respect to plural buses, it is possible that occurrence of an unwired net is not resolved by a single layer, depending on the layout of the printed circuit board. That is to say, when wiring is requested with respect to plural buses and further, various elements are arranged as obstacles to interfere with the wiring, it is possible that available space on the printed circuit board is insufficient and consequently not all signal lines can be wired.

If the printed circuit board 110 is composed of plural layers, determination is made on the wiring area using another layer so that an unwired net will be resolved. Units of the judging unit 505 to the deciding unit 510 of the design support apparatus 100 are functions at the time of determining a wiring area using other layers when the printed circuit board 110 is configured to have plural layers (multi-layered printed circuit board) and when the wiring can be made to another layer.

The judging unit 505 has a function of judging whether the number of unwired nets will decrease if the updating processing is executed at the layer (e.g., first layer) at which the tentative wiring processing is being executed. The judging unit 505 is capable of judging whether to expand the wiring area to another layer (e.g., second layer). Results of the judgment are stored to a memory area of the RAM 403, the magnetic disk 405, the optical disk 407, etc.

The layer establishing unit 506 has a function of establishing the layer at which to determine the wiring area according to the results of the judgment by the judging unit 505. Specifically, if it is judged by the judging unit 505 that the number of unwired nets will not decrease at the current layer (e.g., first layer), the layer establishing unit 506 establishes the tentative wiring area, the first and the second terminal groups, and the already wired nets at another layer (e.g., second layer) different from the first layer at which the tentative wiring area is present. When the tentative wiring area is established by the layer establishing unit 506 at the second layer, the control unit 503 controls the detecting unit 501 to execute the tentative wiring processing and the unwired net detecting processing within the tentative wiring area at the second layer. Results of layer establishing are stored to a memory area of the RAM 403, the magnetic disk 405, the optical disk 407, etc.

The acquiring unit 507 has a function of acquiring connection information of the elements within a circuit under design. The extracting unit 508 has a function of extracting combinations of the elements to be wired from among the connection information acquired by the acquiring unit 507. For example, a circuit configured on the printed circuit board 110 is sometimes composed of passive parts.

Since the passive parts specified by the design information 120 have accompanying resistors at the time of mounting, it is necessary to divide a connection section by the passive parts and determine the wiring area for each section. Therefore, after the acquiring unit 507 acquires the connection information of the elements within the circuit under design from the design information 120, the extracting unit 508 can extract passive elements constituting the passive parts of the elements.

The terminal group establishing unit 509 has a function of setting the elements extracted by the extracting unit 508 to the terminal groups constituting the connection section. Specifically, the terminal group establishing unit 509 sets the terminal group of one element to the first terminal group and the terminal group of another element to the second terminal group, for each of the combinations of the elements extracted by the extracting unit 508, to establish terminal groups of the connection section. Results of the establishing are stored to a memory area of the RAM 403, the magnetic disk 405, the optical disk 407, etc.

With the first terminal group and the second terminal group newly established by the terminal group establishing unit 509, the detecting unit 501 establishes the tentative wiring area between the established terminals as well as executes the tentative wiring processing to detect any unwired nets.

The deciding unit 510 has a function of deciding whether wiring areas having the same terminals have been determined at the same layer. Specifically, the deciding unit 510 decides, with respect to the combination currently under processing, whether any one of the elements having the first and the second terminal groups is included in a wiring area already determined by the determining unit 504. If the deciding unit 510 decides that any one of the terminal groups is included in an already determined wiring area, the layer establishing unit 506 establishes the tentative wiring area of the first and the second terminal groups at another layer.

For example, if the deciding unit 510 decides that the wiring area using either one of the first terminal group and the second terminal group is established at the first layer, the layer establishing unit 506 establishes the tentative wiring area with the first terminal group and the second terminal group at the second layer. The detecting unit 501 executes the unwired net detecting processing with respect to the tentative wiring area having the first terminal group and the second terminal group arranged at the second layer.

Figure 6:
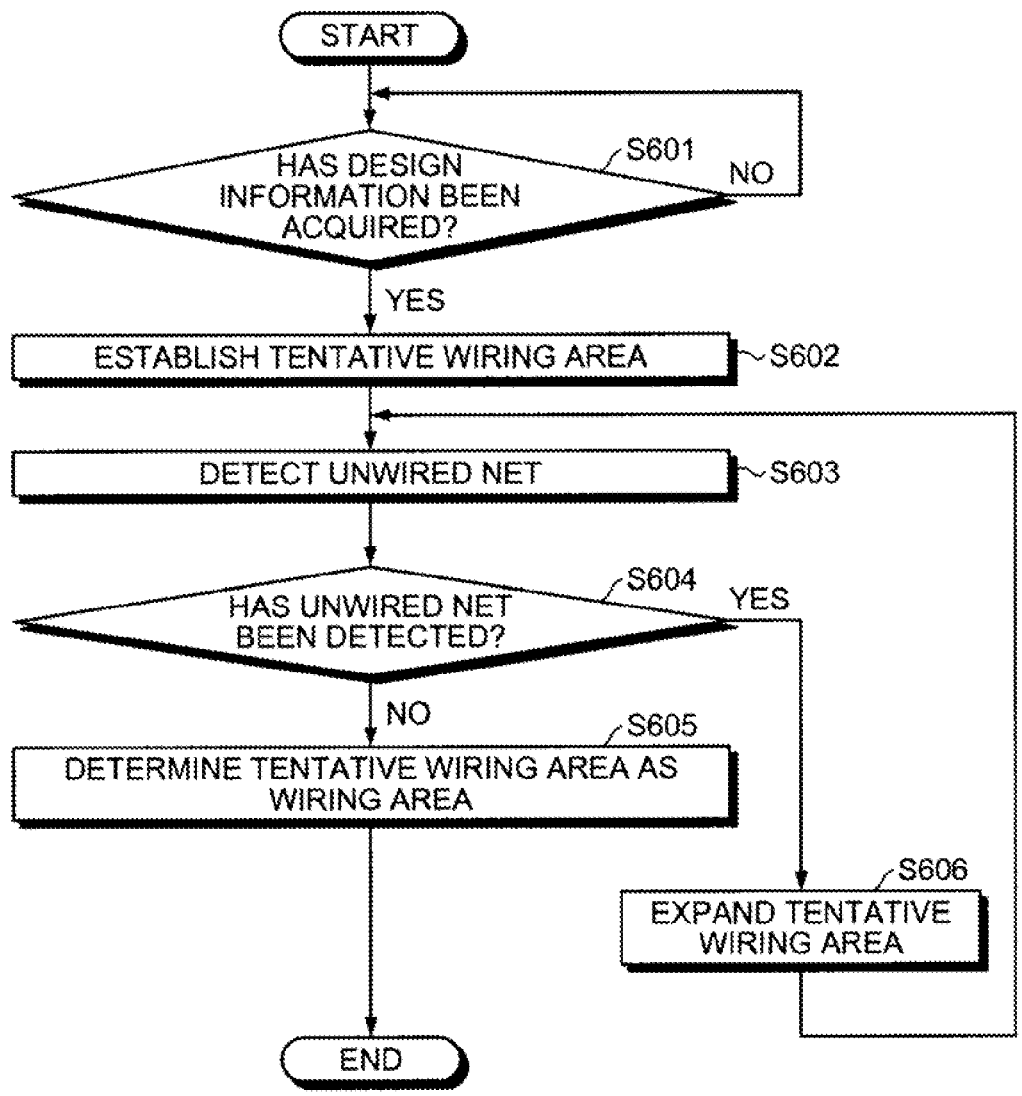
FIG. 6 is a flowchart of design support processing by the design support apparatus.

FIG. 6 is a flowchart of design support processing by the design support apparatus. The flowchart of FIG. 6 denotes the procedure up to the determination of a wiring area for wiring a specified bus between specified terminal groups. Execution of each process depicted in FIG. 6 makes it possible to automatically determine the wiring area free of an occurrence of an unwired net.

In FIG. 6, the detecting unit 501 of the design support apparatus 100 firstly judges whether the design information 120 has been acquired (step S601). At step S601, the detecting unit 501 waits until the design information 120 has been acquired (step S601: NO) and when the design information 120 has been acquired (step S601: YES), the detecting unit 501, using a verifying tool, establishes a tentative wiring area (step S602). The detecting unit 501 then detects an unwired net of the tentative wiring area (step S603).

The updating unit 502 judges whether an unwired net has been detected at step S603 (step S604) and if no unwired net has been detected (step S604: NO), the determining unit 504 determines the tentative wiring area currently established, to be the wiring area (step S605), ending a sequence of processing.

On the other hand, if an unwired net is detected (step S604: YES) and if the wiring is executed employing the current tentative wiring area, the unwired net is caused. Therefore, the updating unit 502 expands the tentative wiring area according to the number of unwired nets (step S606). Triggered by the expansion of the tentative wiring area by the updating unit 502, the control unit 503 causes the detecting unit 501 to execute the detection of unwired nets (step S603).

With the unwired net detection executed at step S603, processing is executed according to presence or absence of the unwired net. That is to say, if an unwired net is detected, then the updating unit 502 repeats the processing of expanding the tentative wiring area. Thereafter, if it is judged that no unwired net has been detected, the determining unit 504 determines the current tentative wiring area as the wiring area (step S605), ending a sequence of processing.

As described above, the design support apparatus 100 detects the presence or absence of an unwired net in the tentative wiring area and if no unwired net is detected (when all wire connections are wired), determines the tentative wiring area as the wiring area. Therefore, at step S603 of FIG. 6, it is necessary to execute the tentative wiring processing and verify how each signal line belonging to the bus is wired in the tentative wiring area.

To verify the presence or absence of an unwired net within the tentative wiring area as the wiring capacity, the present embodiment employs, as one example, a simulator (wiring path preparation support device) that prepares a wiring path between the terminal groups specified by the maximum flow algorithm. From among the paths prepared by the wiring path preparation support device, a path of incomplete wiring is detected as an unwired net. Therefore, one example will now be described of the wiring path preparation support device.

Figure 7:
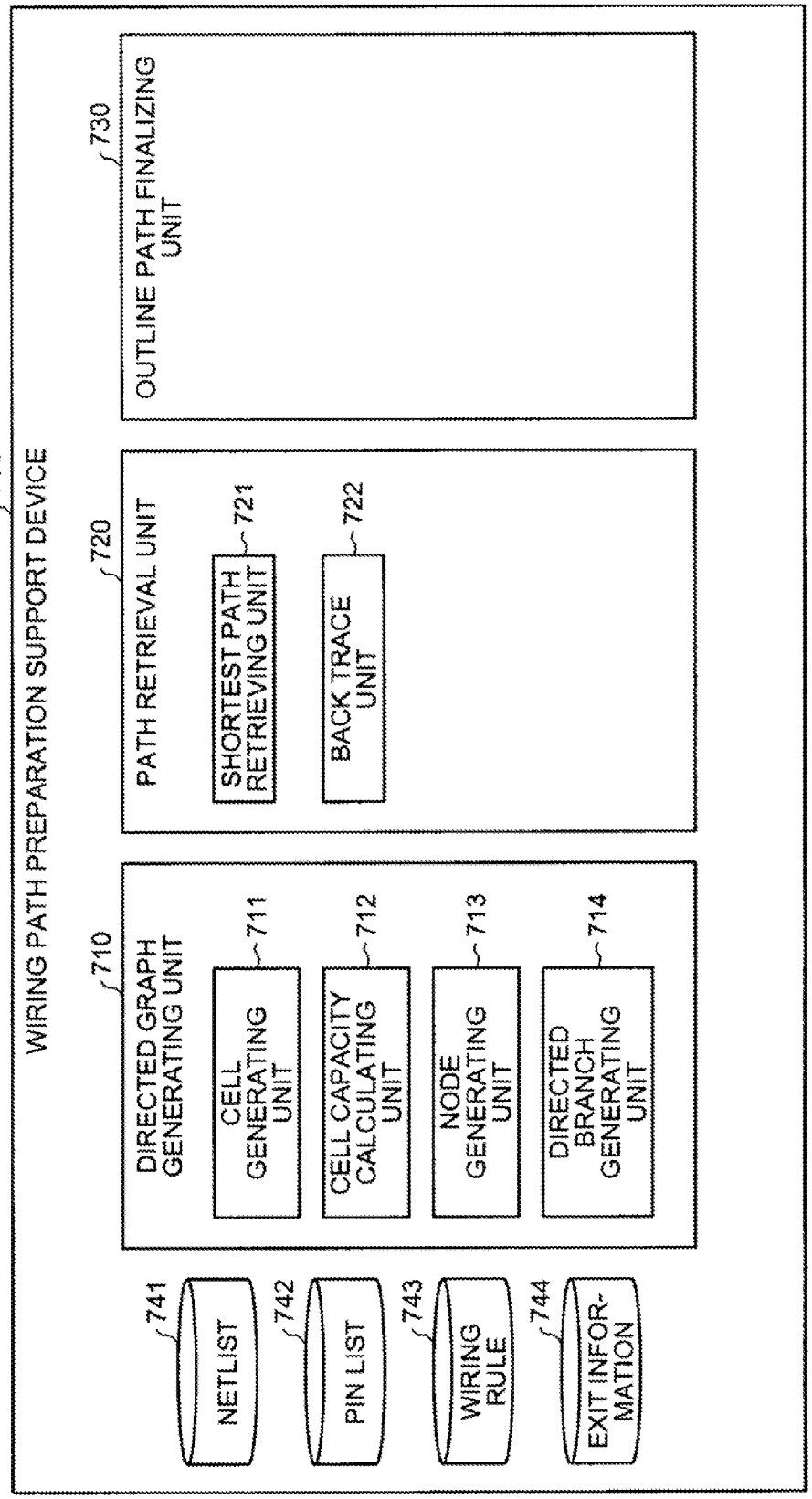
FIG. 7 is a block diagram of a functional configuration of a wiring path preparation support device.

FIG. 7 is a block diagram of a functional configuration of the wiring path preparation support device. As depicted in FIG. 7, a wiring path preparation support device 700 includes a directed graph generating unit 710, a path retrieval unit 720, an outline path finalizing unit 730, a net list 741, a pin list 742, a wiring rule 743, and exit information 744. Hardware resources of the design support apparatus 100 depicted in FIG. 4 or an independent general-use computer may be used for these functions as a control unit (directed graph generating unit 710 to outline path finalizing unit 730) and a database (net list 741 to exit information 744).

The directed graph generating unit 710, equipped with a cell generating unit 711, a cell capacity calculating unit 712, a node generating unit 713, and a directed branch generating unit 714, generates a directed graph that is network-flow-modeled to perform the preparation of the wiring path. That is to say, the wiring path preparation support device 700 realizes wiring path preparation processing by applying the network flow model to a wiring problem of the ball grid array (BGA) as a configuration example of the terminal group.

In applying the network flow model to the BGA wiring problem, the directed graph generating unit 710 provides for a bottleneck (a limit to the number of wirings) to control the number of wirings passing between horizontal pins, between vertical pins, and between diagonal pins, with respect to the BGA pins (terminals) at least subject to the wiring. "Between horizontal pins" refers to an area sandwiched by two horizontally adjacent pins including an unused pin. "Between vertical pins" refers to an area sandwiched by two vertically adjacent pins including an unused pin. "Between diagonal pins" refers to an area surrounded by four pins including an unused pin. If there is an unused pin (part at which no pin is arranged), the bottleneck is provided for the unused pin as well.

Figure 8:
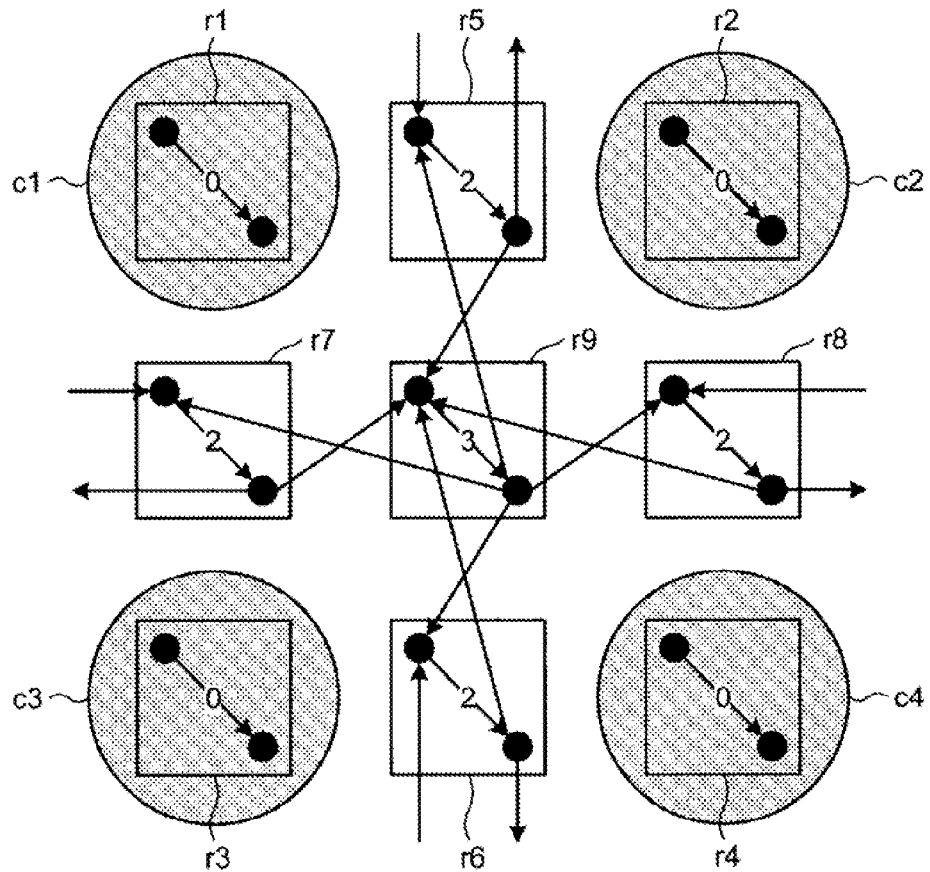
FIG. 8 is an explanatory diagram of one example of modeling of a bottleneck provided in a BGA.

FIG. 8 is an explanatory diagram of one example of modeling of the bottleneck provided in the BGA. FIG. 8 denotes a part of the BGA. Circles c1 to c4 in FIG. 8 denote pins of the BGA model. A rectangle (r1 to r4) arranged in each pin, rectangles (r5 and r6) provided between horizontal pins, rectangles (r7 and r8) provided between vertical pins, and a rectangle (r9) provided between diagonal pins express the location of the bottleneck. In the present embodiment, each rectangle is referred to as "cell". Each cell is given capacity (allowable number of wirings passing). In FIG. 8, a numerical value within each cell indicates the capacity given to the cell.

Each cell has two diagonal nodes. The node at the upper left is an entrance node and the node at the lower right is an exit node. The directed graph generating unit 710 generates a directed branch connecting the nodes according to a predetermined rule. In FIG. 8, arrows connecting the nodes indicate the directed branch. With the directed branch generated, a directed graph is generated for performing the wiring path preparation.

The path retrieval unit 720, equipped with a shortest path retrieving unit 721 and a back trace unit 722, retrieves the shortest path for each of the wirings to be drawn out.

The outline path finalizing unit 730 finalizes drawn-out paths of outline wiring (outline paths) by distributing the paths retrieved by the path retrieval unit 720 to the wirings. The net list 741, the pin list 742, the wiring rule 743, and the exit information 744 are input information to be used for the wiring path preparation. The net list 741 includes listed information of identifiers of the pins to be drawn out. The pin list 742 includes information of all pins arranged in the BGA to be wired. The wiring rule 743 includes various parameters defining a wiring-capable area and the exit information 744 includes information for identifying an exit location of the wiring in the BGA to be wired.

Figure 9:
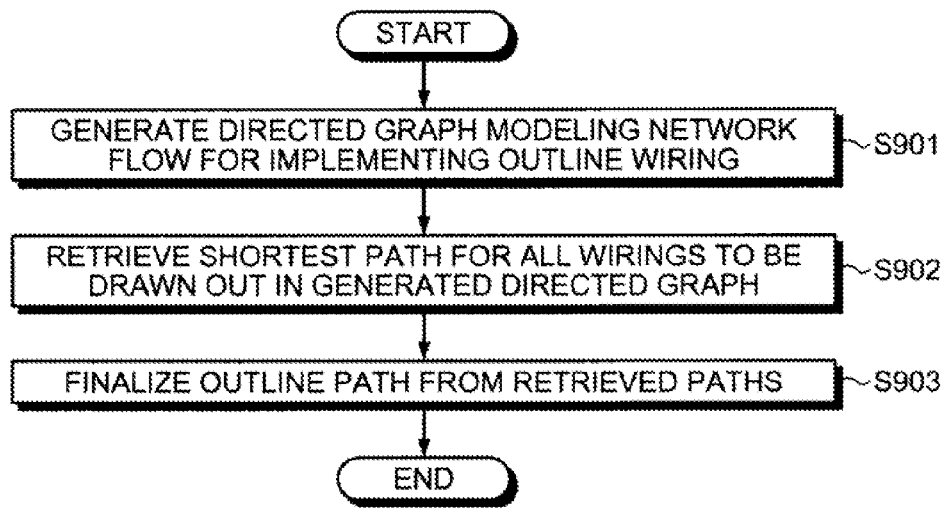
FIG. 9 is a flowchart of outline path preparation processing.

FIG. 9 is a flowchart of outline path preparation processing. In the flowchart of FIG. 9, the wiring path preparation support device 700, using the directed graph generating unit 710, firstly generates the directed graph that is network-flow-modeled to perform the outline wiring (step S901).

Figure 10:
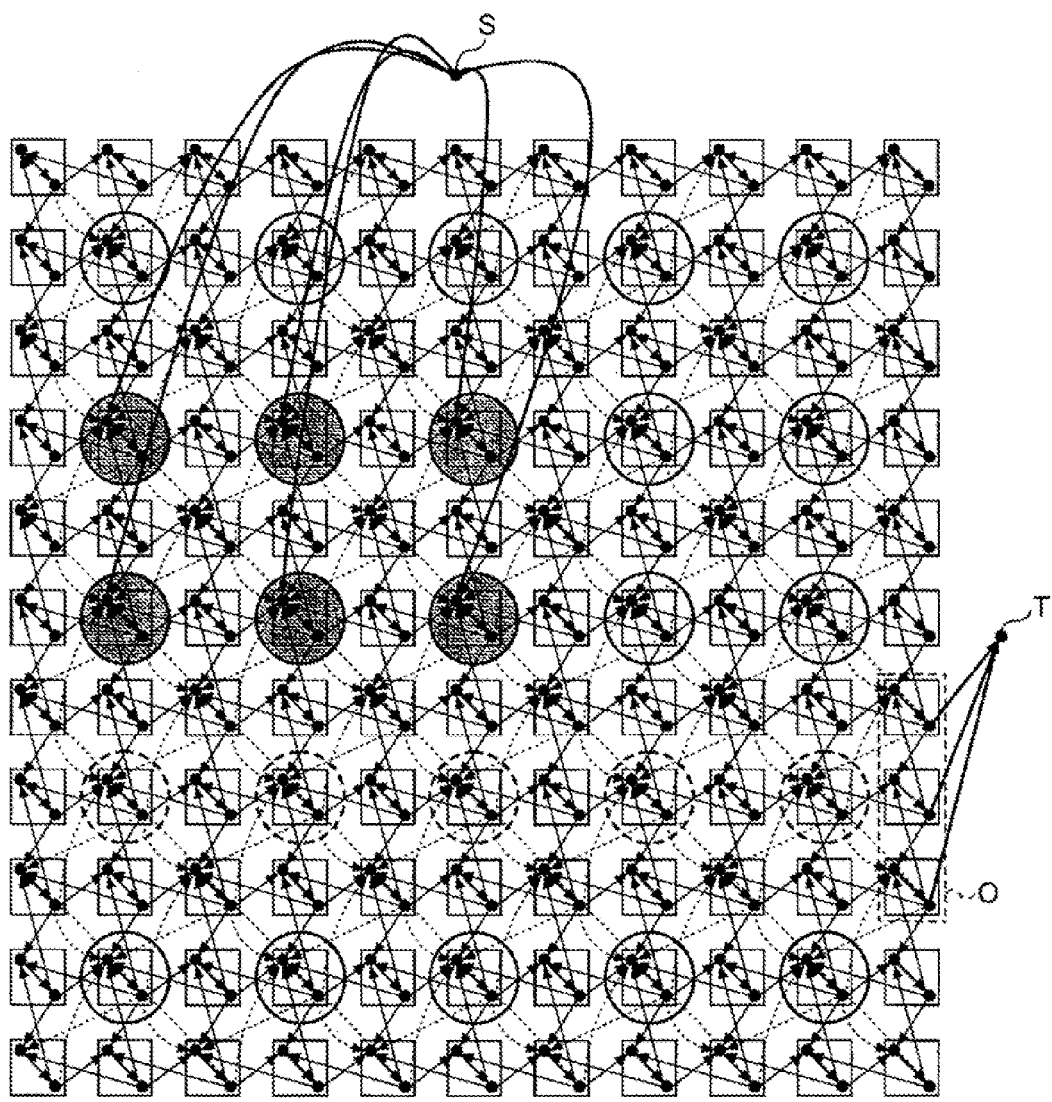
FIG. 10 is an explanatory diagram of a preparation example of a directed graph.

FIG. 10 is an explanatory diagram of a preparation example of the directed graph. That is to say, FIG. 10 denotes results of processing at step S901 in FIG. 9. In FIG. 10, a solid-line circle indicates the pin. A hatched circle indicates the pin as an object from which to draw out the wiring (source of draw-out) (hereinafter, "draw-out object pin"). A broken-line circle indicates an unused pin. Each rectangle indicates a cell.

FIG. 10 denotes the state of generation of the directed graph when the exit location of the wiring is limited to the exit location O surrounded by a broken line. The cell included in the exit location O is hereinafter referred to as "exit cell". As described above, with the generation of the directed branch having the direction from the entrance node to the exit node within the cell and the directed branch having the direction from the exit node to the entrance node of another adjacent cell, the directed graph is generated. A spring-out node S is a node provided as a starting point of the directed graph. A flow-in node T is the node provided as an ending node of the directed graph. Each directed branch has a capacity corresponding to the capacity of the cell to which the nodes connected by that directed branch belong.

Now back to the processing of FIG. 9, upon completion of the processing at step S901, the wiring path preparation support device 700, using the path retrieval unit 720, retrieves the shortest path for each of the wirings to be drawn out, in the directed graph generated by the directed graph generating unit 710 (step S902).

Figure 11:
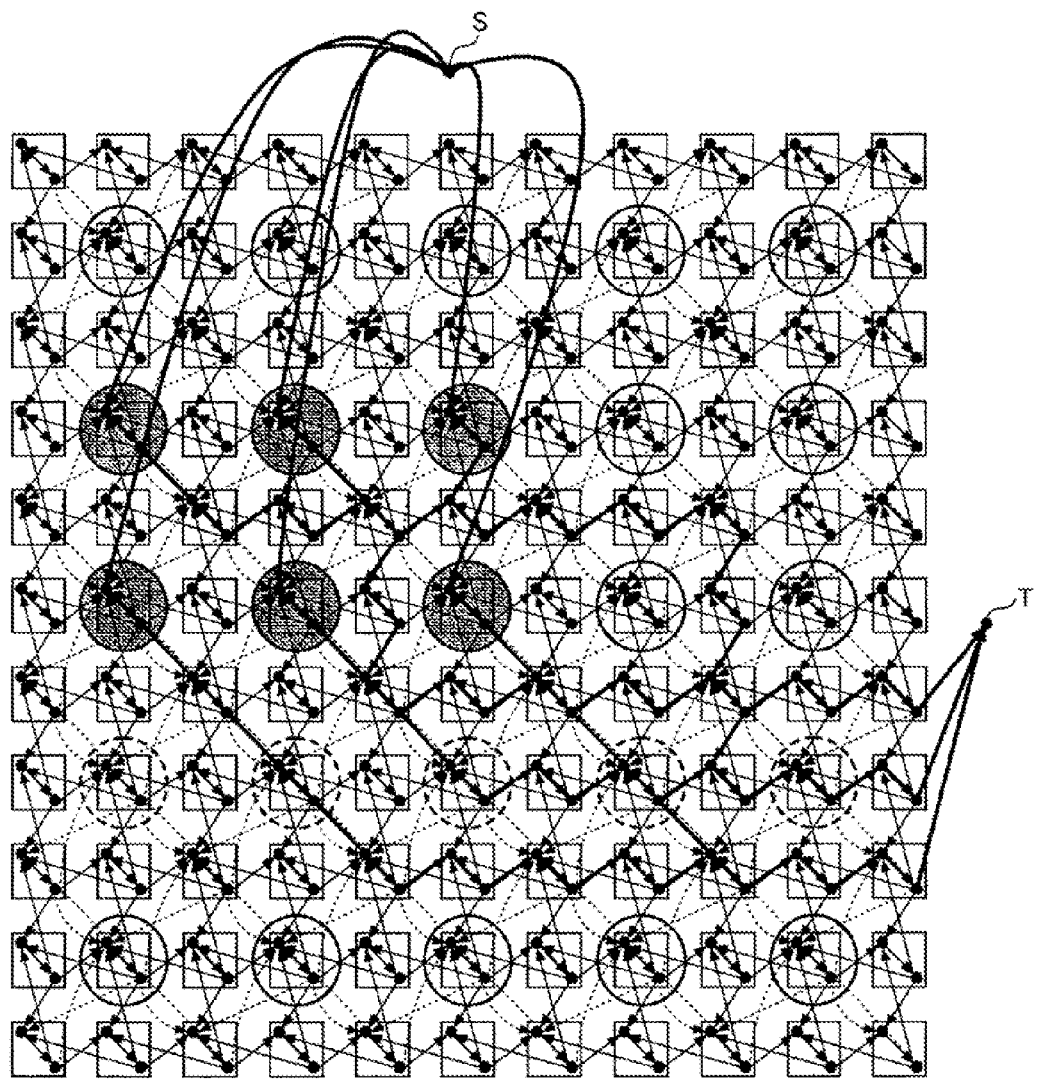
FIG. 11 is an explanatory diagram of an example of path retrieval.

FIG. 11 is an explanatory diagram of an example of path retrieval. That is to say, FIG. 11 denotes results of the processing at step S902 of FIG. 9. In FIG. 11, a thick solid line indicates the path retrieved by the path retrieval unit 720. Since the present embodiment describes the case of six wirings being requested, the paths denoted by FIG. 11 represent the paths of six wirings.

Each path depicted in FIG. 11 runs from the spring-out node S and, by way of the entrance node of the draw-out object pin and further by way of the exit node of the exit cell, leads to the flow-in node T. At the time of finishing of the processing at step S902, it is not yet determined by which wiring the directed branches belonging to each path are possessed.

Upon completion of the processing at step S902, the wiring path preparation support device 700, using the outline path finalizing unit 730, distributes the paths retrieved by the path retrieval unit 720 to the wirings to finalize the draw-out paths of the outline wiring (outline paths) (step S903). The outline paths finalized at step S903 are results of the wiring path preparation.

Figure 12:
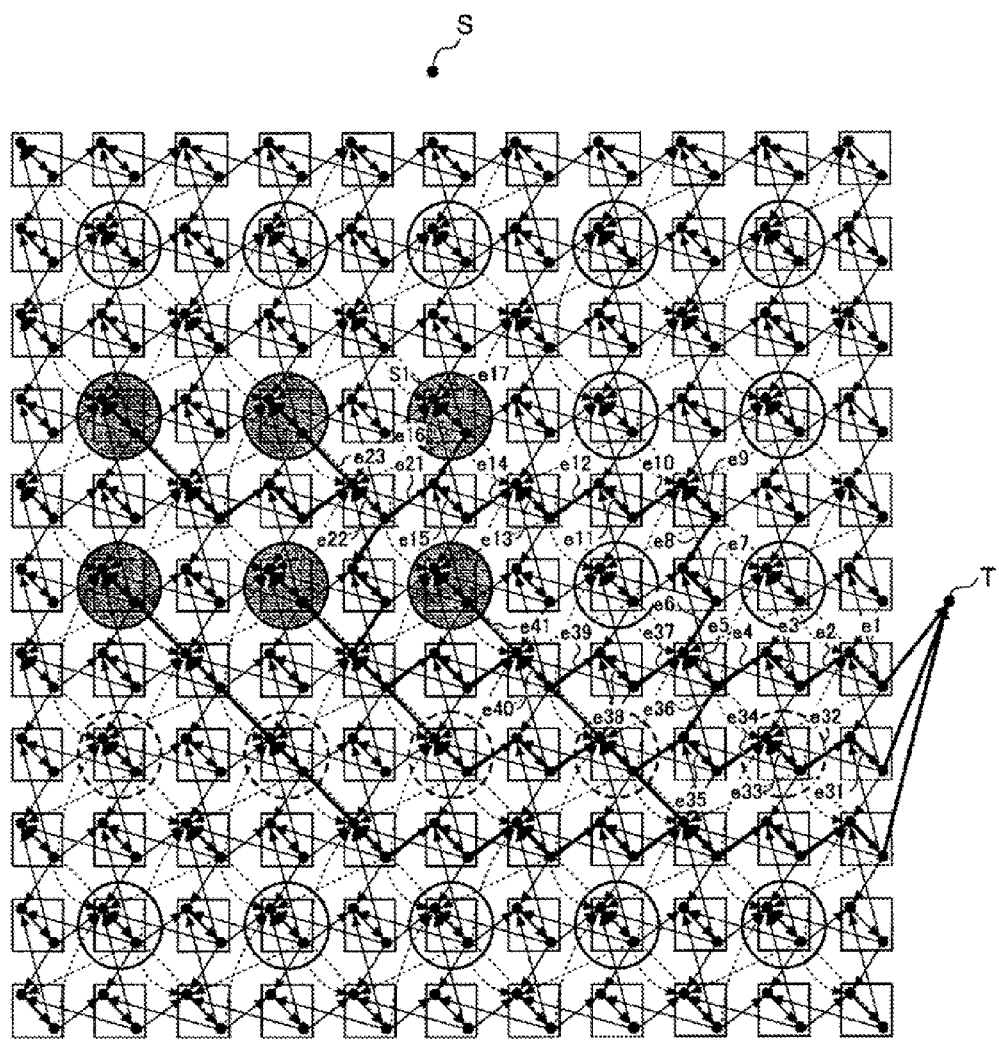
FIG. 12 is an explanatory diagram of an example of finalizing an outline path.

FIG. 12 is an explanatory diagram of an example of finalizing an outline path. That is to say, FIG. 12 denotes the results of the processing at step S903. In FIG. 12, the directed branch with reference numeral en (n being integer) attached thereto is a directed branch through which the finalized outline path passes. FIG. 12 denotes the state of three outline paths being finalized, for the sake of convenience. The procedure described above enables the wiring path preparation support device 700 to automatically execute the outline wiring of the BGA.

As described above, the use of the wiring path preparation support device 700 makes it possible to verify the wiring capacity of the two specified terminal groups. That is to say, the detecting unit 501 of the design support apparatus 100 detects, as an unwired net, a signal line not wired correctly, from among the wiring paths provided as results from the preparation by the wiring path preparation support device 700. First to fifth examples will now be described as specific examples of verification support processing according to the present embodiment. While the first to the fifth examples below employ the wiring path preparation support device 700 using the maximum flow algorithm as the wiring engine to verify the wiring capacity, other tools may be used.

Figure 13:
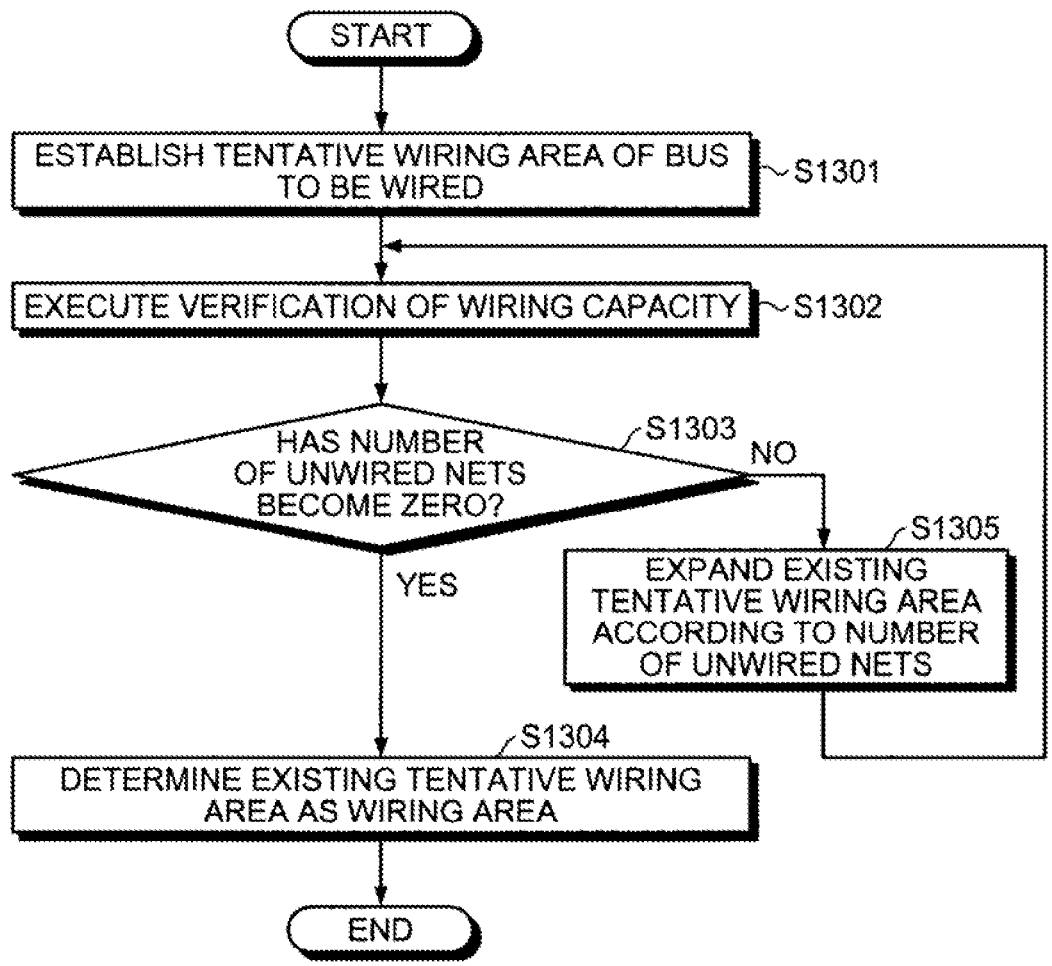
FIG. 13 is a flowchart of wiring area determination processing in a first example.

FIG. 13 is a flowchart of wiring area determination processing in the first example. The first example represented by the flowchart of FIG. 13 is the most basic wiring area decision processing using the design support apparatus 100 and determines the wiring area of a predetermined bus (e.g., bus A) on a single-layer printed circuit board 110. Execution of processing of FIG. 13 makes it possible to determine the wiring area of minimally required space free of an unwired net with respect to a predetermined bus.

In FIG. 13, the design support apparatus 100 firstly establishes the tentative wiring area of the bus to be wired (step S1301). The design support apparatus 100 then executes the verification of the wiring capacity with respect to the established tentative wiring area (step S1302). Thereafter, the design support apparatus 100 judges whether the number of unwired nets is zero based on results of the verification at step S1302 (step S1303) and, if it is judged that the number of unwired nets is zero (step S1303: YES), determines the existing tentative wiring area currently established, as the wiring area (step S1304), ending a sequence of processing.

On the other hand, if it is judged at step S1303 that the number of unwired nets is not zero (step S1303: NO), then the design support apparatus 100 expands the tentative wiring area for the number of nets judged as unwired nets in the existing tentative wiring area currently established (step S1305). The design support apparatus 100 executes the verification of the wiring capacity with respect to the tentative wiring area expanded at step S1305 (step S1302).

Upon execution of the verification of the wiring capacity of the tentative wiring area newly established, the design support apparatus 100 judges the presence or absence of unwired nets, from results of the verification (step S1303). As described above, if it is judged that the number of unwired nets is zero (step S1303: YES), the design support apparatus 100 determines the existing tentative wiring area at the current moment as the wiring area (step S1304), ending a sequence of processing. That is to say, the tentative wiring area expanded at step S1305 is determined as the wiring area. An example will be described of determining the wiring area according to the procedure described above with reference to FIGS. 14 to 23.

Figure 14:
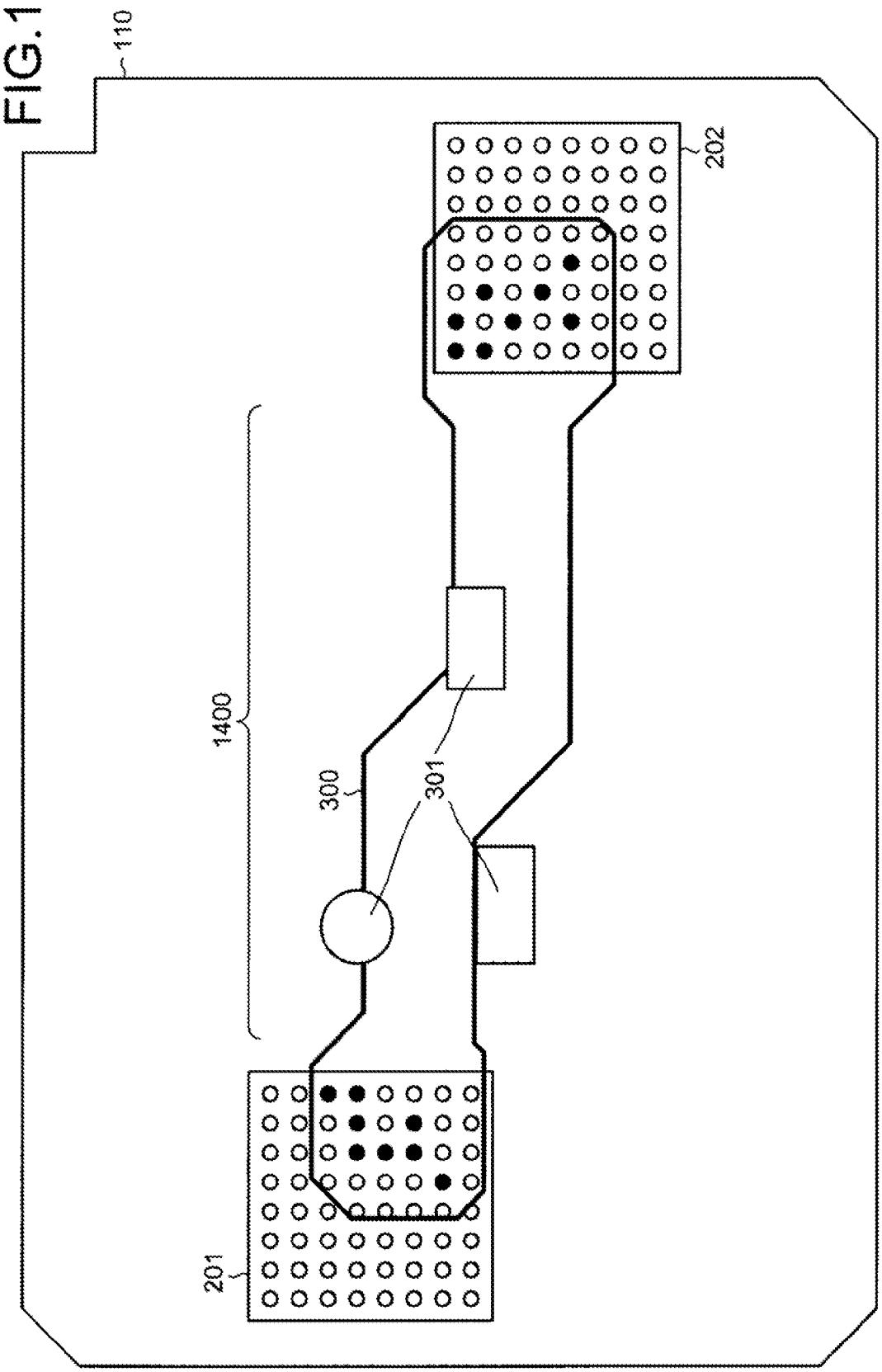
FIG. 14 is an explanatory diagram of an example of establishing a tentative wiring area in the first example.

FIG. 14 is an explanatory diagram of an example of establishing the tentative wiring area in the first example. In the first example, the procedure will be described up to the determination of the appropriate wiring area from the tentative wiring area established based on an outline path 1400 connecting the terminal groups 201 and 202 in the printed circuit board 110, as depicted in FIG. 14. On the printed circuit board 110, various elements are arranged irrespective of the presence or absence of relation with the bus. Therefore, the element can possibly become an obstacle 301 of the tentative wiring area 300 depending on the location of the element on the printed circuit board 110. The wiring path preparation support device 700, however, verifies the wiring capacity in consideration of the obstacle 301 and therefore, countermeasures against the obstacle 301 need not be taken (the case is the same with the second to the fifth examples to be described later).

Figure 15:
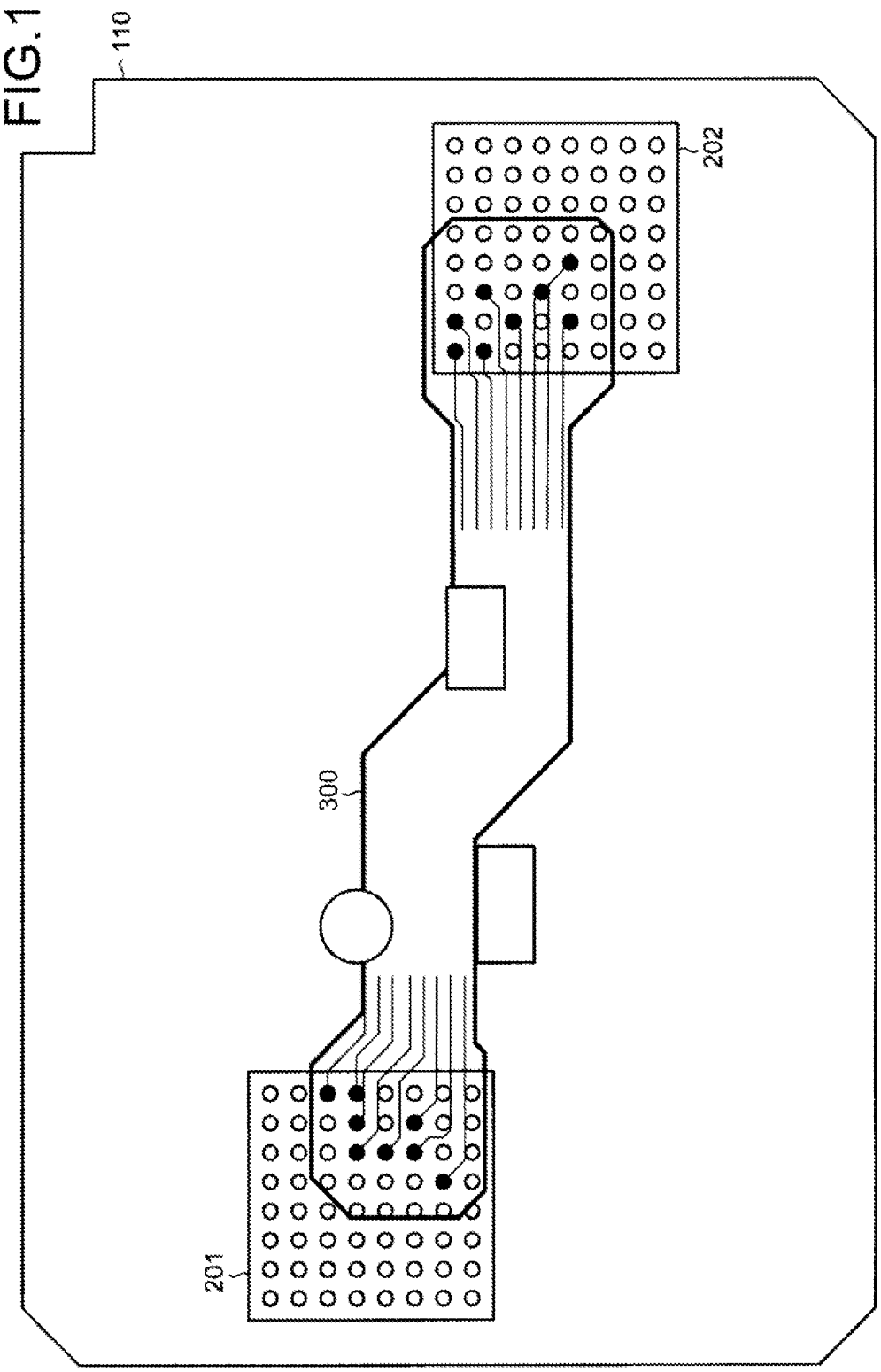
FIG. 15 is an explanatory diagram of an example of executing a wiring engine in the first example.

FIG. 15 is an explanatory diagram of an example of executing the wiring engine in the first example. The design support apparatus 100, upon establishment of the tentative wiring area, simulates by the wiring engine, the wiring path preparation with respect to each signal line belonging to the bus from the terminal groups 201 and 202, to verify the wiring capacity.

Figure 16:
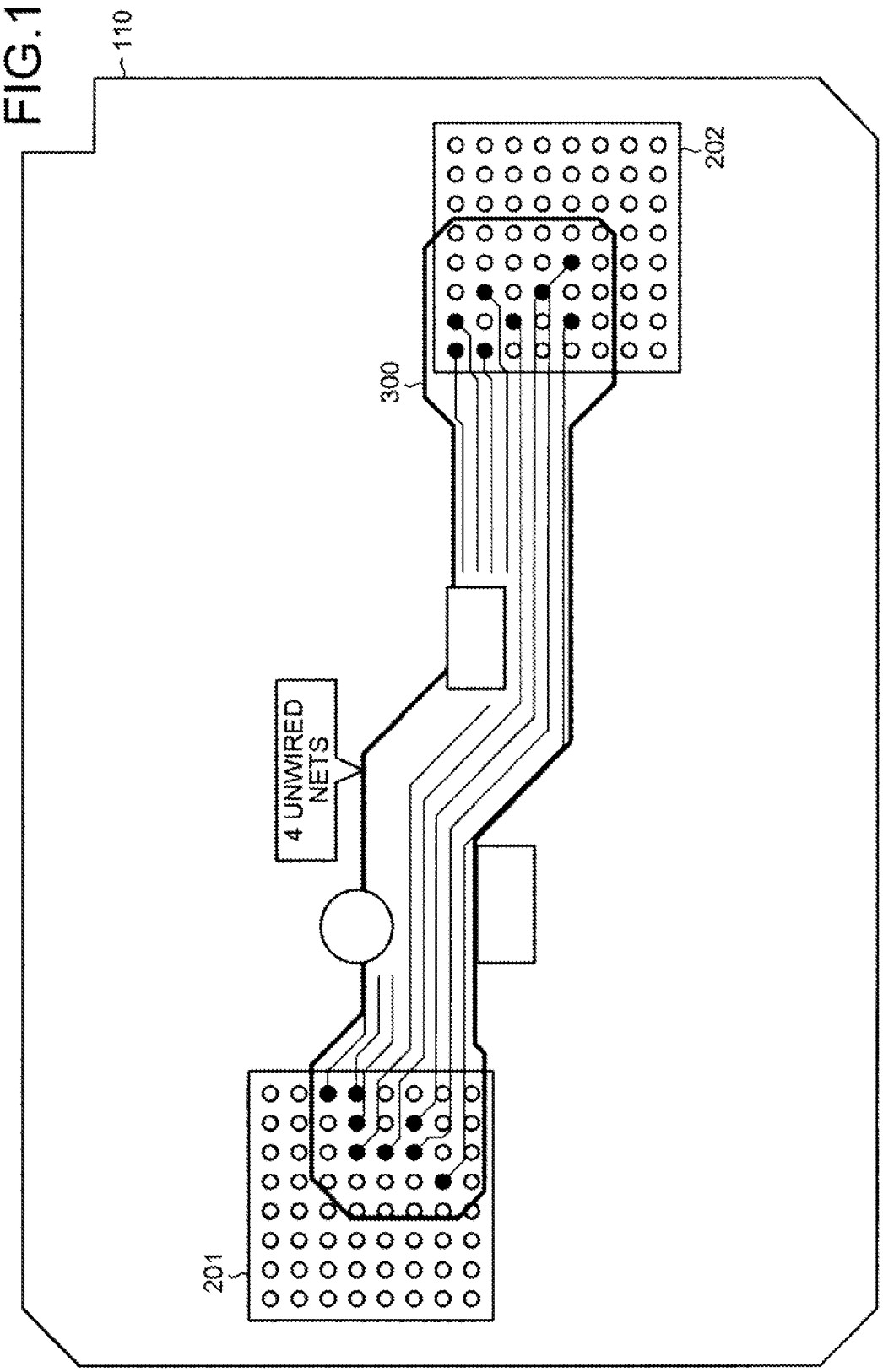
FIG. 16 is an explanatory diagram of an example of an occurrence of an unwired net in the first example.

FIG. 16 is an explanatory diagram of an example of an occurrence of an unwired net in the first example. As depicted in FIG. 16, as a result of the simulation of the wiring path with respect to the tentative wiring area 300 by the execution of the wiring engine, four unwired nets occur between the terminal groups 201 and 202. Therefore, the design support apparatus 100 moves to the processing of updating the current tentative wiring area 300.

Figure 17:
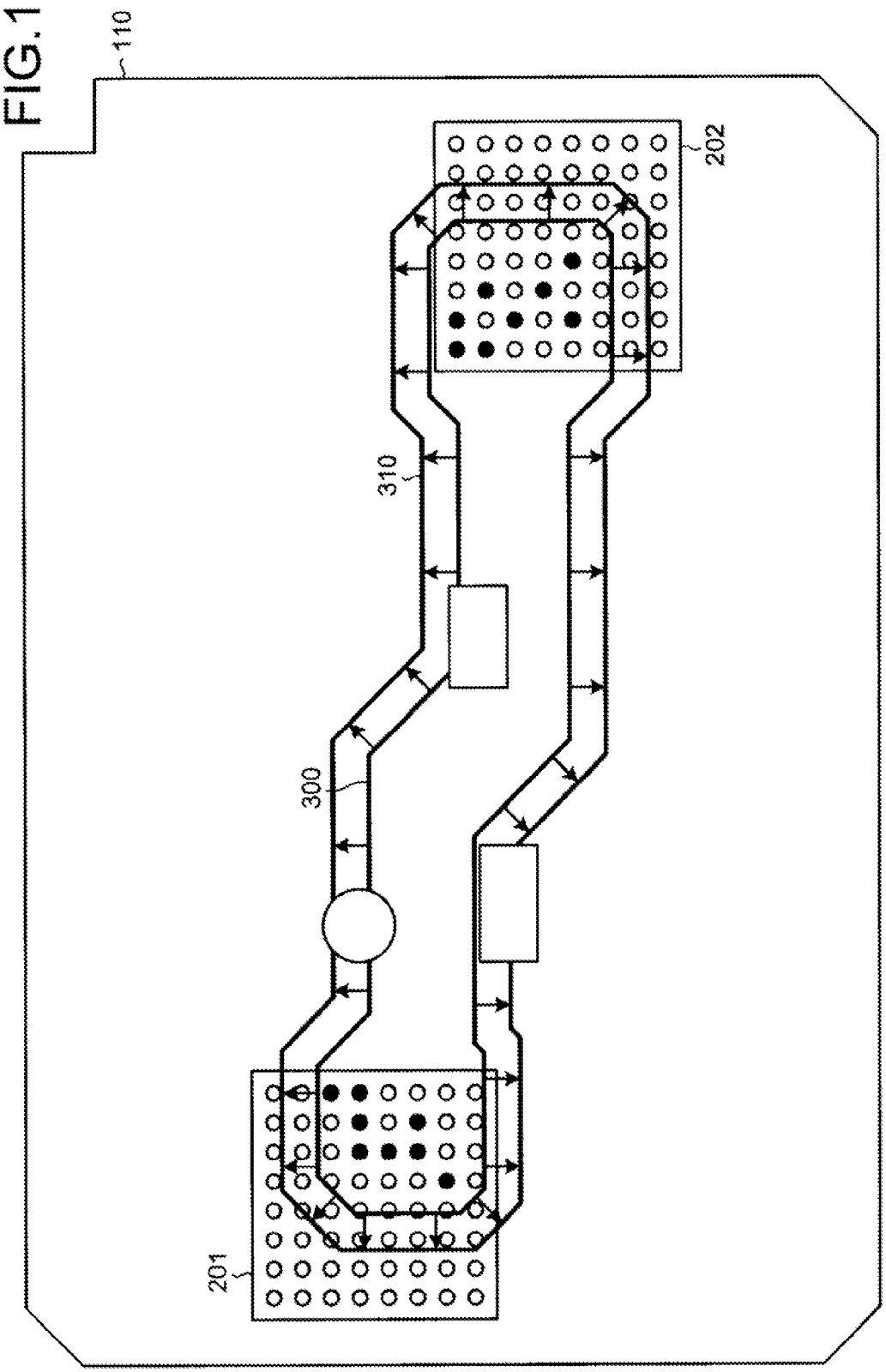
FIG. 17 is an explanatory diagram of an example of expanding the tentative wiring area in the first example.

FIG. 17 is an explanatory diagram of an example of expanding the tentative wiring area in the first example. The design support apparatus 100 expands the tentative wiring area 300 according to the number of unwired nets detected by the verification of the wiring capacity, establishing a new tentative wiring area 310. As described in FIG. 16, four unwired nets are detected from the tentative wiring area 300. Therefore, the design support apparatus 100 expands the tentative wiring area 300 by the width required for wiring four signal lines, establishing the tentative wiring area 310. Expansion width of the tentative wiring area 300 per unwired net varies according to the line breadth of the signal line and the line-to-line space. Therefore, the design support apparatus 100 identifies the expansion width of the tentative wiring area, referring to the design information 120.

Figure 18:
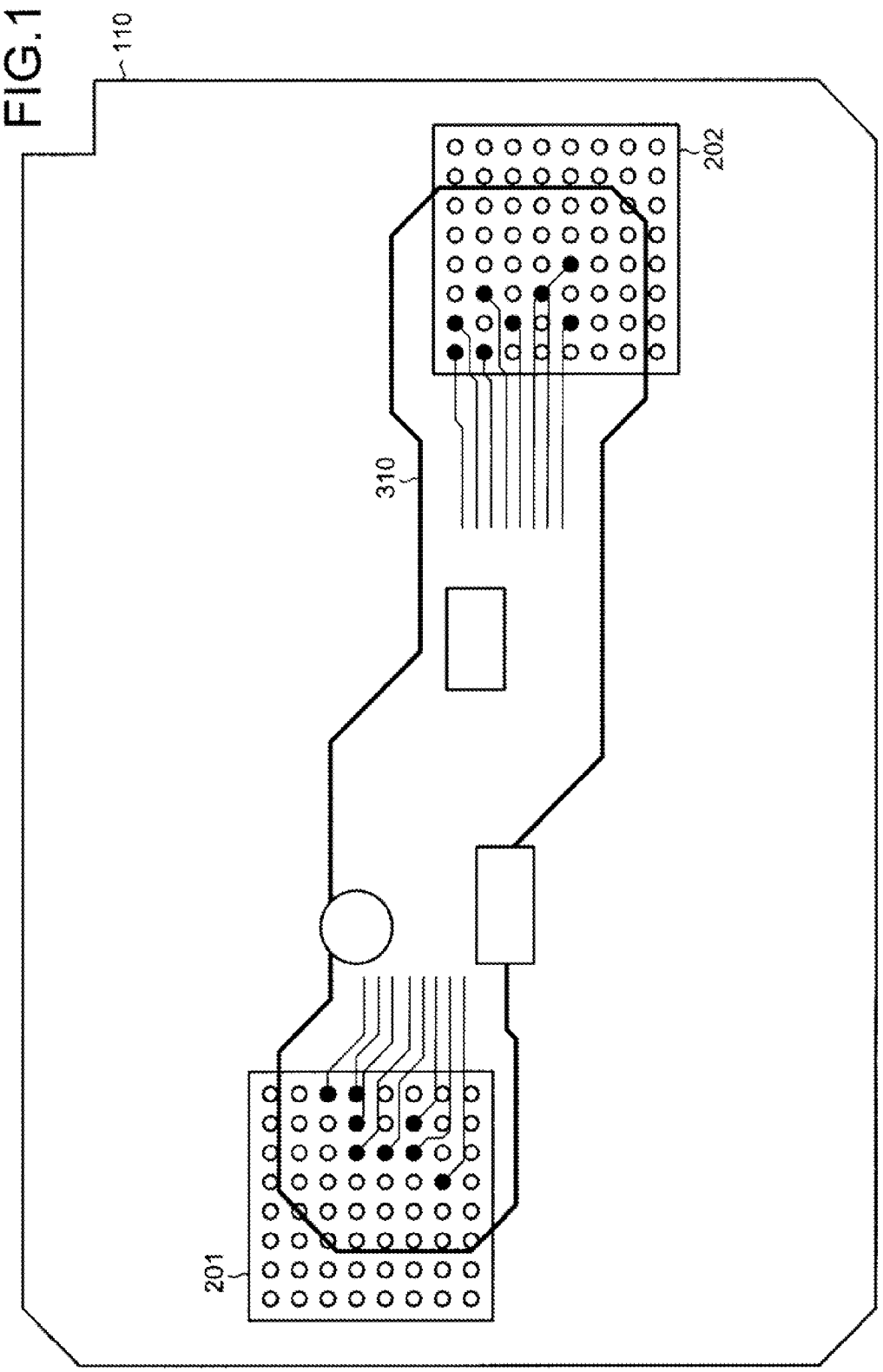
FIG. 18 is an explanatory diagram of an example of executing the wiring engine after the expansion of the tentative wiring area in the first example.

FIG. 18 is an explanatory diagram of an example of executing the wiring engine after the expansion of the tentative wiring area in the first example. With the tentative wiring area 310 newly established, the design support apparatus 100 simulates, by the wiring engine, the wiring path preparation with respect to each signal line belonging to the bus from the terminal groups 201 and 202, to verify the wiring capacity.

Figure 19:
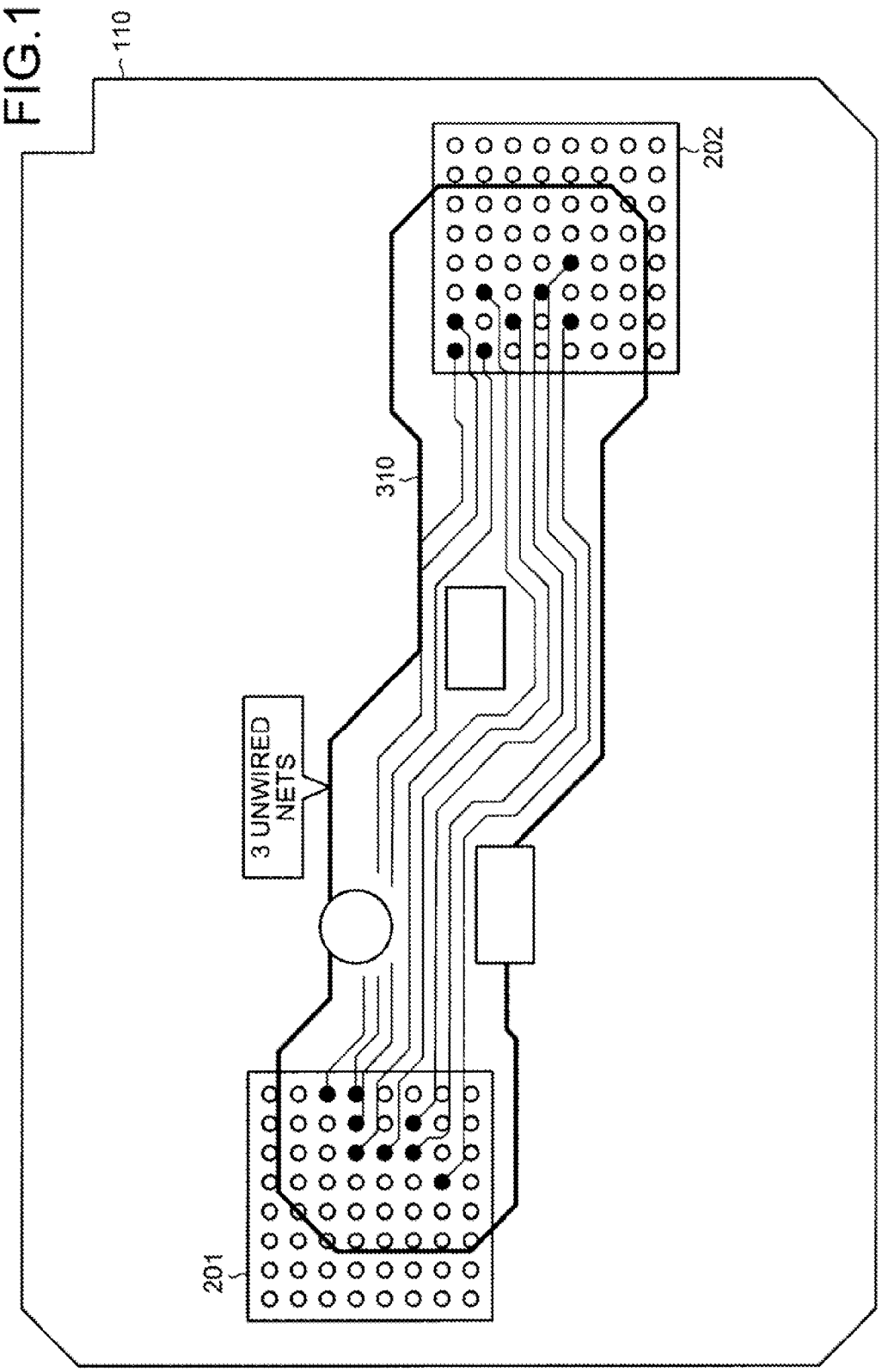
FIG. 19 is an explanatory diagram of an example of an occurrence of an unwired net after the expansion of the tentative wiring area in the first example.

FIG. 19 is an explanatory diagram of an example of an occurrence of an unwired net after the expansion of the tentative wiring area in the first example. As depicted in FIG. 19, as a result of the simulation of the wiring path with respect to the tentative wiring area 310 by the execution of the wiring engine, three unwired nets occur between the terminal groups 201 and 202. Therefore, the design support apparatus 100 again moves to the processing of updating the tentative wiring area 310.

Figure 20:
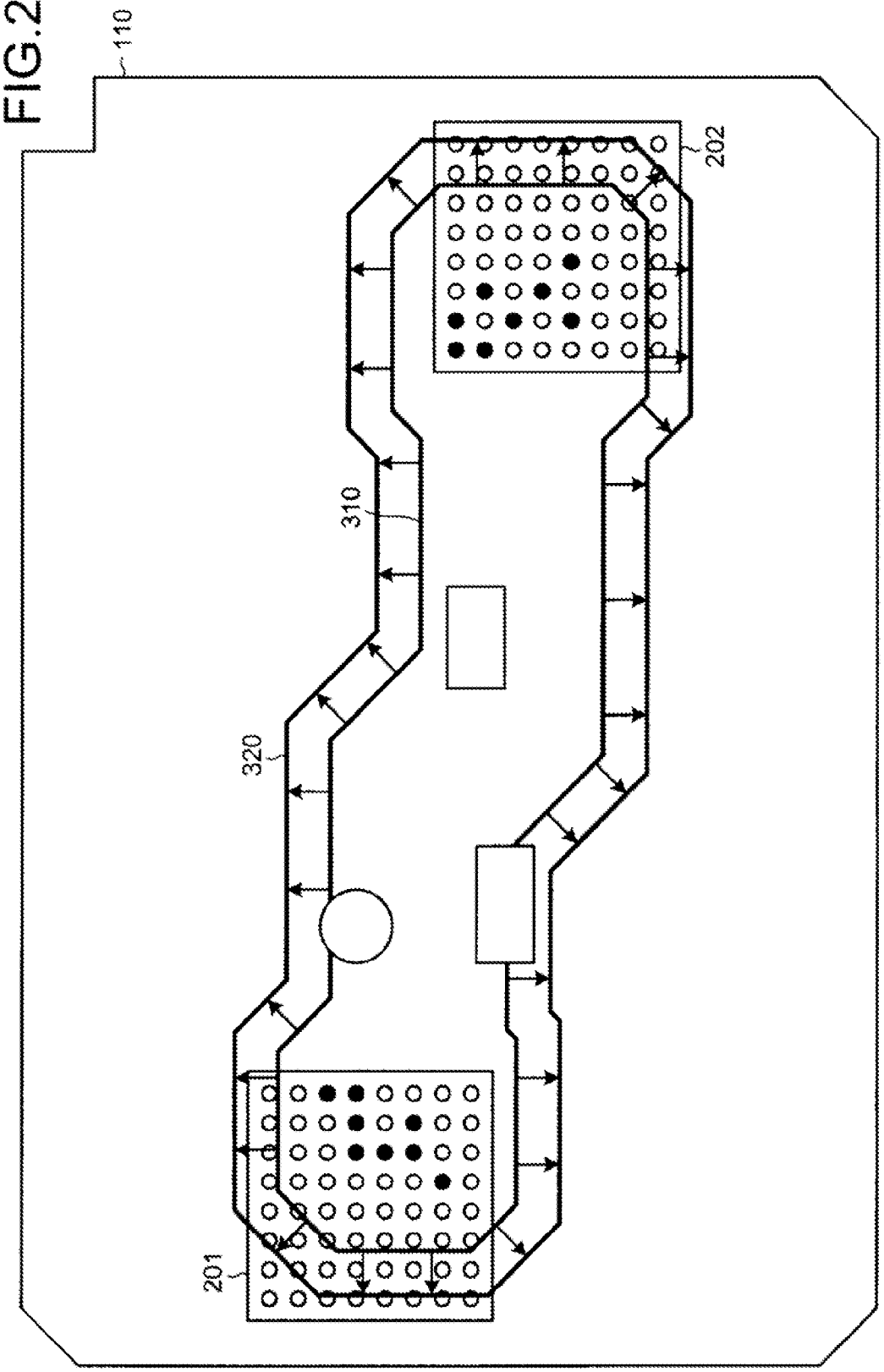
FIG. 20 is an explanatory diagram of a second example of the expanding tentative wiring area in the first example.

FIG. 20 is an explanatory diagram of a second example of the expanding tentative wiring area in the first example. The design support apparatus 100 executes the updating processing according to the number of unwired nets detected by the verification of the wiring capacity with respect to the tentative wiring area 310 in the same way as with respect to the tentative wiring area 300. As described in FIG. 19, three unwired nets are detected from the tentative wiring area 310. Therefore, the design support apparatus 100 expands the tentative wiring area 310 by the width required for wiring three signal lines, establishing a tentative wiring area 320 (second expansion).

Figure 21:
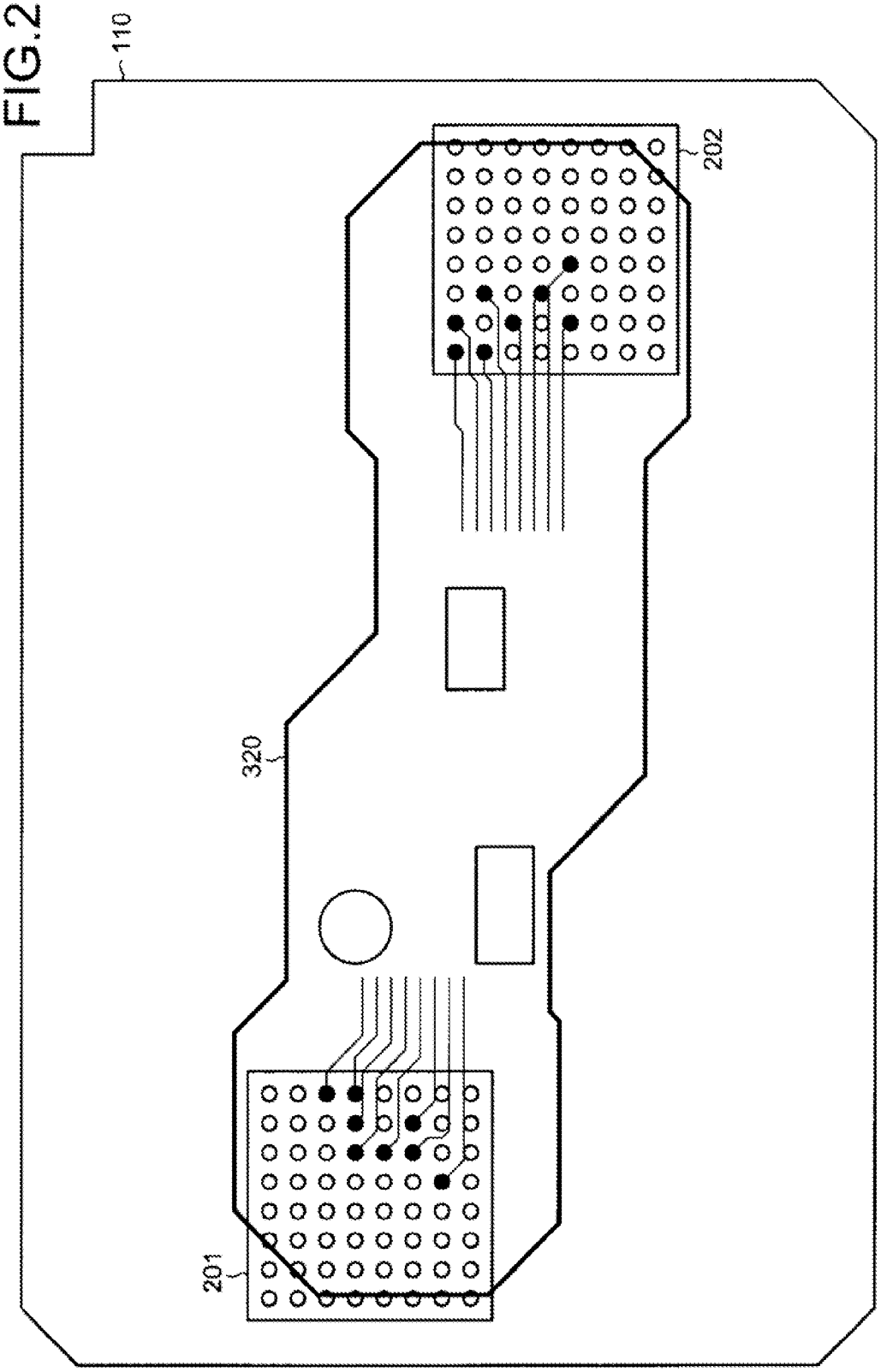
FIG. 21 is an explanatory diagram of an example of executing the wiring engine after the second expansion of the tentative wiring area in the first example.

FIG. 21 is an explanatory diagram of an example of executing the wiring engine after the second expansion of the tentative wiring area in the first example. With the tentative wiring area 320 newly established, in the same way as after the previous updating processing, the design support apparatus 100 simulates, by the wiring engine, the wiring path preparation with respect to each signal line belonging to the bus from the terminal groups 201 and 202, to verify the wiring capacity.

Figure 22:
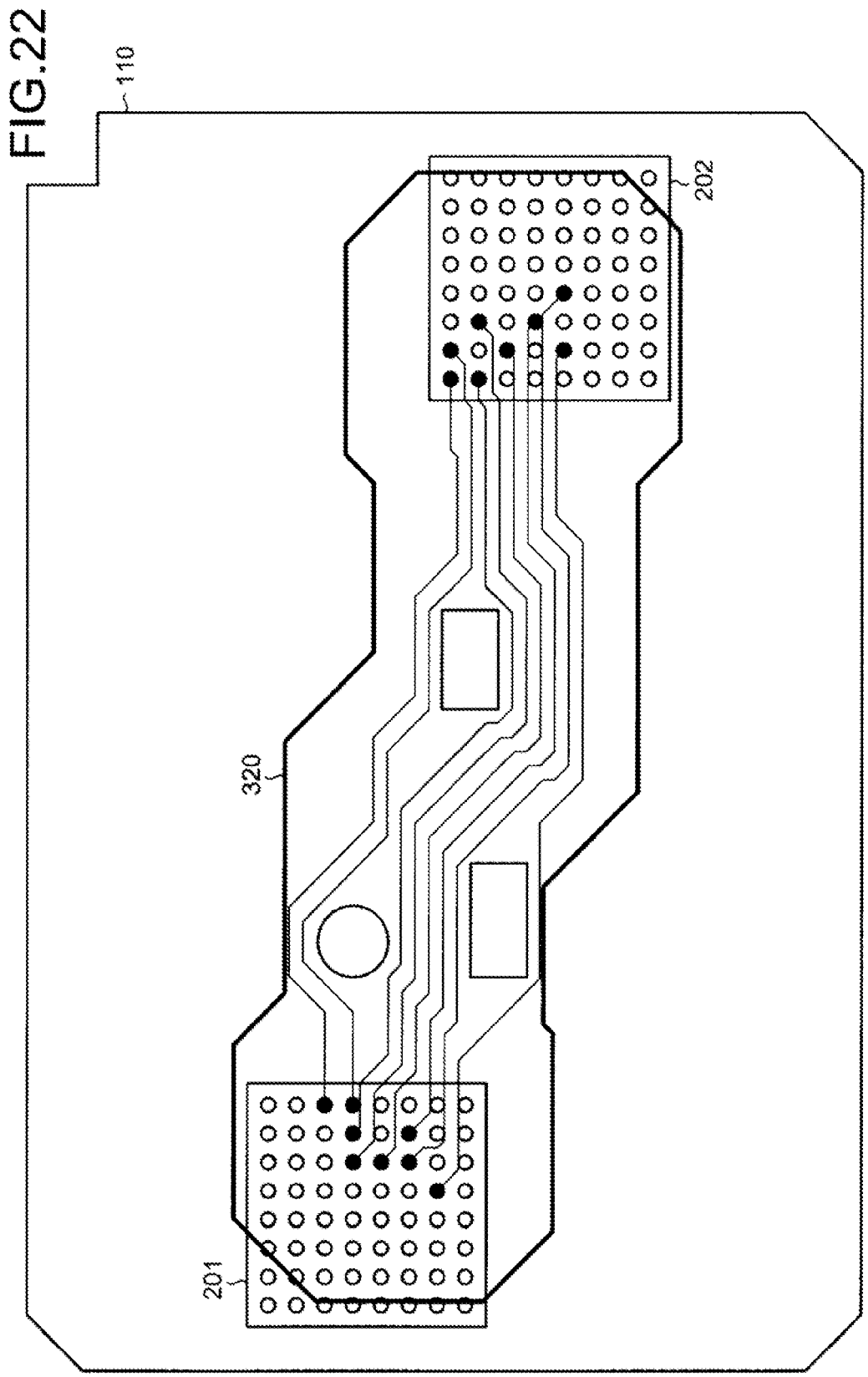
FIG. 22 is an explanatory diagram of an example of resolving unwired nets in the first example.
Figure 23:
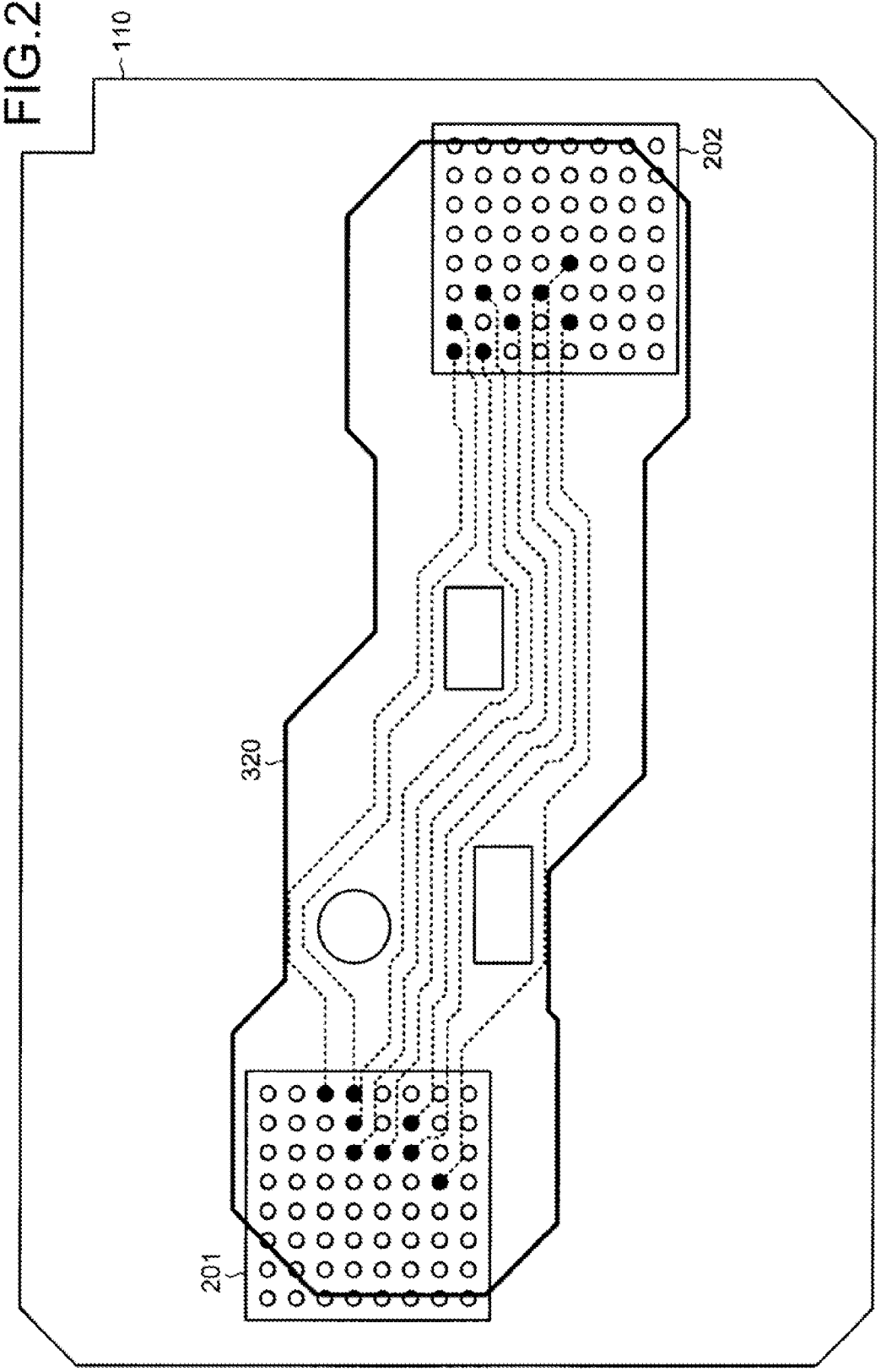
FIG. 23 is an explanatory diagram of an example of determining the wiring area in the first example.

FIG. 22 is an explanatory diagram of an example of resolving the unwired nets in the first example. FIG. 23 is an explanatory diagram of an example of determining the wiring area in the first example. As depicted in FIG. 22, as a result of the simulation of the wiring path with respect to the tentative wiring area 320 by the execution of the wiring engine, the unwired nets between the terminal groups 201 and 202 are resolved and all signal lines are connected. Therefore, as depicted in FIG. 23, the design support apparatus 100 determines the tentative wiring area 320 having the unwired nets resolved, to be the wiring area, ending a sequence of processing.

As described above, in the first example, the design support apparatus 100, upon acquisition of the design information 120, can automatically determine the wiring area capable of wiring all signal lines making up the specified bus. The design support apparatus 100 executes the expanding processing based on the number of unwired nets by identifying the state of occurrence of the unwired nets by the verification of the wiring capacity in the tentative wiring area established based on the design information 120.

The design support apparatus 100, which thereafter determines the tentative wiring area at the time of resolution of the unwired nets to be the wiring area, can limit the wiring area to the minimally required wiring area, without expanding the wiring area unnecessarily. As a result, the design support apparatus 100 is capable of supporting efficient wiring design to the printed circuit board 110.

Figure 24:
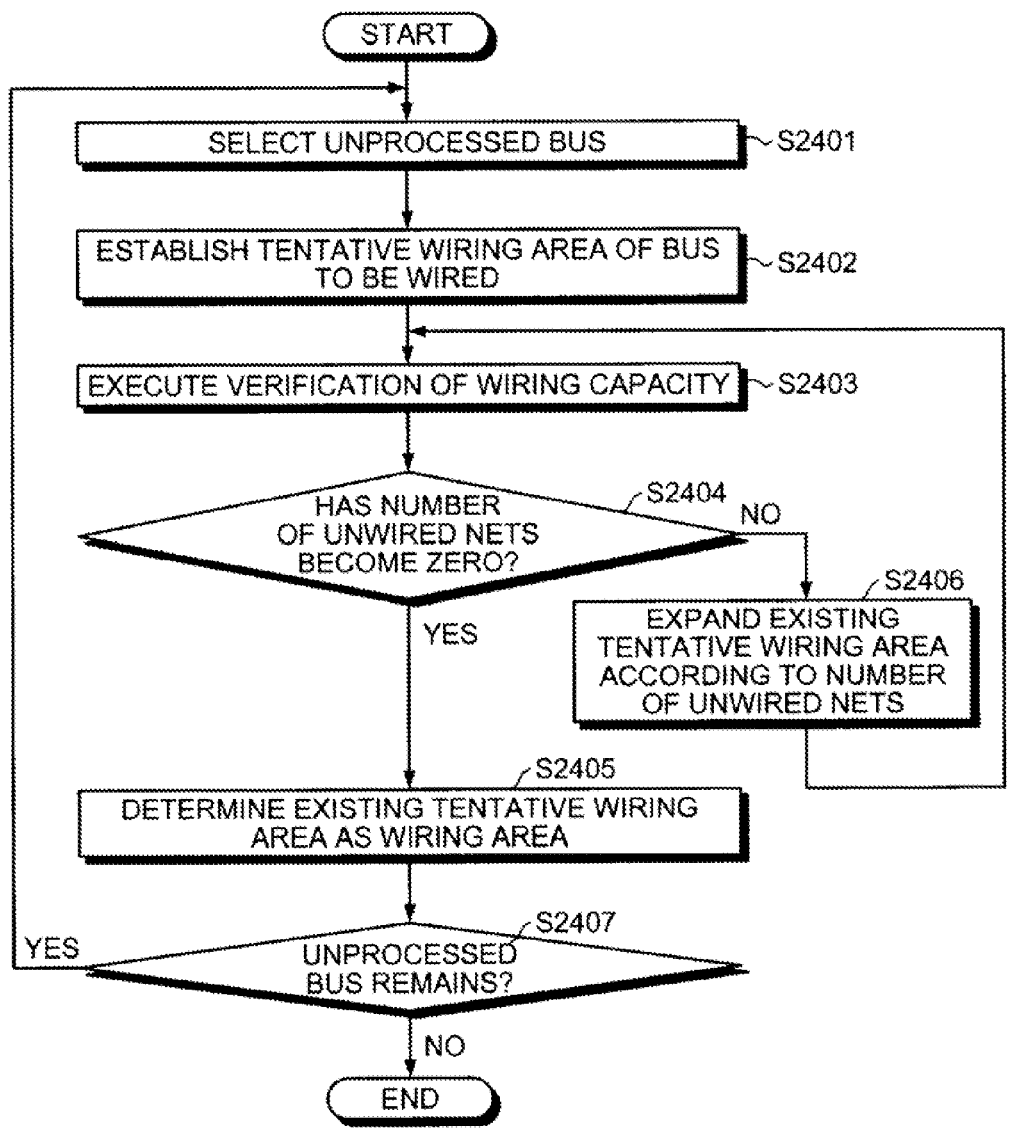
FIG. 24 is a flowchart of the wiring area determination processing in a second example.

FIG. 24 is a flowchart of the wiring area determination processing in the second example. The second example denoted by the flowchart of FIG. 24 sequentially determines the wiring area of plural specified buses. The execution of the processing of FIG. 24 makes it possible to determine the wiring area of the plural buses.

In FIG. 24, the design support apparatus 100 selects an unprocessed bus from the design information 120 (step S2401). The design support apparatus 100 then establishes a tentative wiring area of the bus selected by step S2401 (step S2402). The design support apparatus 100 executes the verification of the wiring capacity with respect to the established tentative wiring area (step S2403).

The design support apparatus 100 judges whether the number of unwired nets is zero based on the results of the verification at step S2403 (step S2404) and, if it is judged that the number of unwired nets is zero (step S2404: YES), determines the existing tentative wiring area currently established, to be the wiring area (step S2405).

On the other hand, if it is judged at step S2404 that the number of unwired nets is not zero (step S2404: NO), the design support apparatus 100 expands the tentative wiring area for the number of the nets judged as unwired nets in the existing tentative wiring area currently established (step S2406). The design support apparatus 100 executes the verification of the wiring capacity with respect to the tentative wiring area expanded at step S2406 (step S2403).

Through the verification executed of the wiring capacity of the tentative wiring area newly established, the design support apparatus 100 judges the presence or absence of the unwired net from results of the verification (step S2404). As described above, if it is judged that the number of unwired nets is zero (step S2404: YES), the design support apparatus 100 determines the current existing tentative wiring area, to be the wiring area (step S2405).

The design support apparatus 100 then judges whether there is any unprocessed bus (step S2407) and, if it is judged that there is an unprocessed bus (step S2407: YES), goes to step S2401 to process the unprocessed bus. If it is judged that there is no unprocessed bus (step S2407: NO), the design support apparatus 100 ends a sequence of processing. That is to say, the tentative wiring area expanded at step S2406 is determined as the wiring area. An example will be described of determining the wiring area according to the procedure described above with reference to FIGS. 25 to 35.

Figure 25:
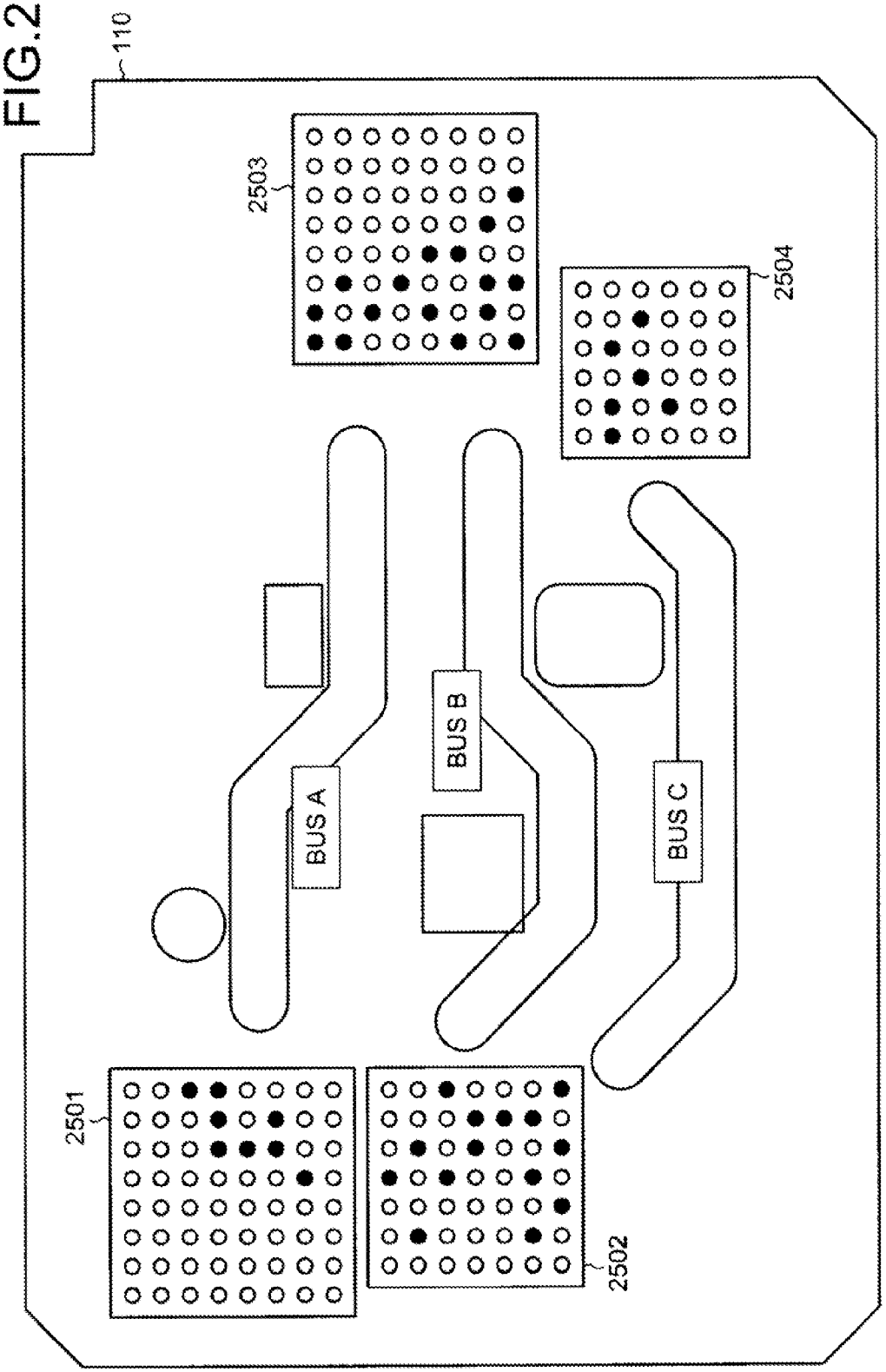
FIG. 25 is an explanatory diagram of an example of establishing the tentative wiring area of each bus in the second example.

FIG. 25 is an explanatory diagram of an example of establishing the tentative wiring area of each bus in the second example. The second example describes the procedure up to the determination of the appropriate wiring areas for buses A, B, and C among terminal groups 2501 to 2504 on the printed circuit board 110, as depicted in FIG. 25. The bus A connects the terminal groups 2501 and 2503, the bus B connecting the terminal groups 2502 and 2503, and the bus C connecting the terminal groups 2502 and 2504.

Figure 26:
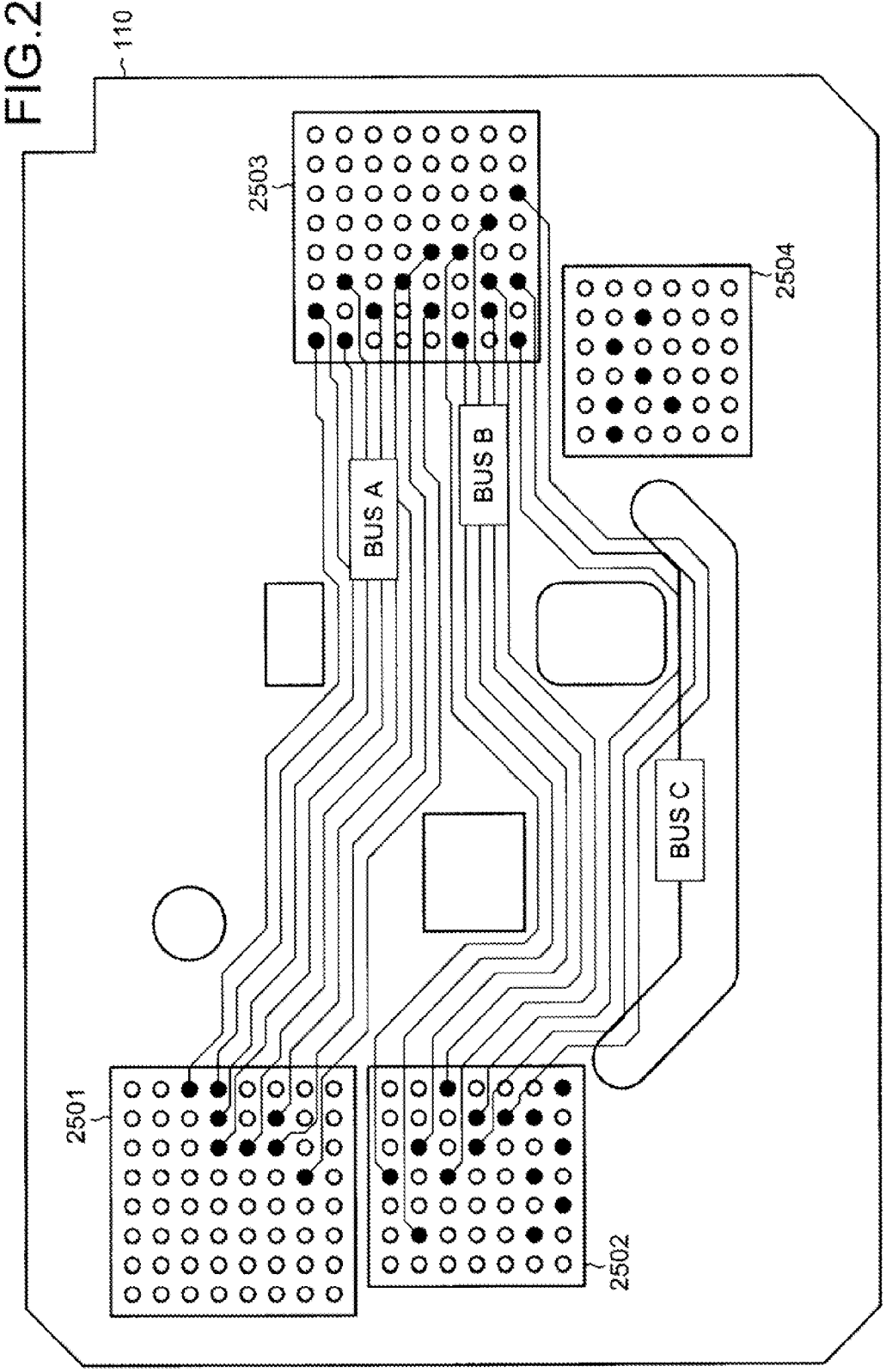
FIG. 26 is an explanatory diagram of an example of determining the wiring area of another bus in the second example.

FIG. 26 is an explanatory diagram of an example of determining the wiring area of another bus in the second example. As depicted in FIG. 26, when the wiring is made with respect to the buses A and B, respective tentative wiring areas of the buses A and B do not overlap and therefore, the wiring area can be determined using the procedure described in the first example as it is. Therefore, FIGS. 27 to 35 below describe the procedure up to the determination of the appropriate wiring area with respect to the bus C whose tentative wiring area overlaps the wiring area of the bus B.

Figure 27:
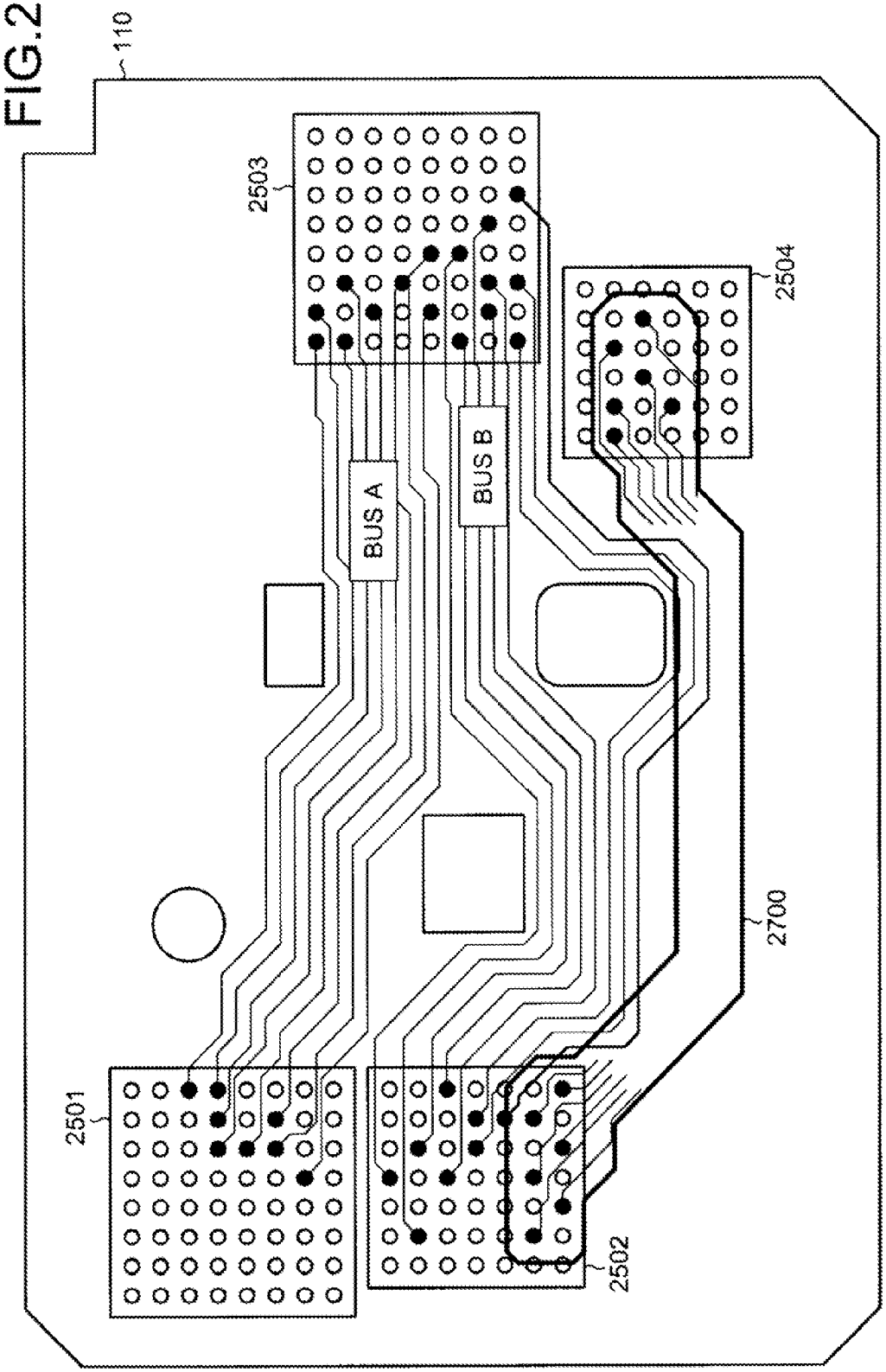
FIG. 27 is an explanatory diagram of an example of executing the wiring engine in the second example.

FIG. 27 is an explanatory diagram of an example of executing the wiring engine in the second example. With a tentative wiring area 2700 established, the design support apparatus 100, by the wiring engine, simulates the wiring path preparation with respect to each signal line belonging to the bus C from the terminal groups 2502 and 2504, to verify the wiring capacity. At the time of the verification of the wiring capacity, the wiring area of the bus B is treated as an obstacle when it overlaps the tentative wiring area 2700.

Figure 28:
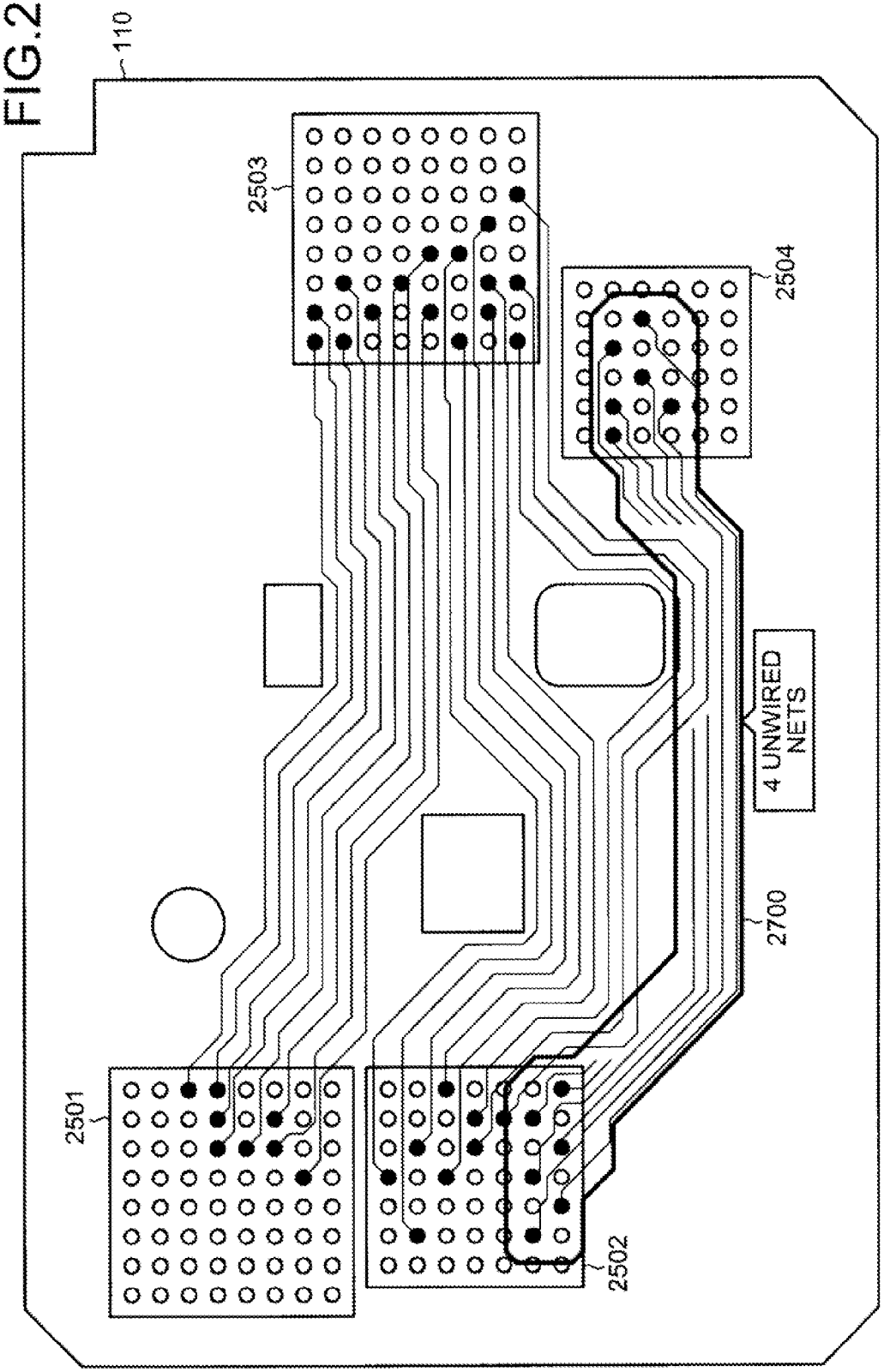
FIG. 28 is an explanatory diagram of an example of the occurrence of an unwired net in the second example.

FIG. 28 is an explanatory diagram of an example of the occurrence of an unwired net in the second example. As depicted in FIG. 28, as a result of the simulation of the wiring path with respect to the tentative wiring area 2700 by the execution of the wiring engine, four unwired nets occur between the terminal groups 2502 and 2504. Therefore, the design support apparatus 100 moves to the processing of updating the current tentative wiring area 2700.

Figure 29:
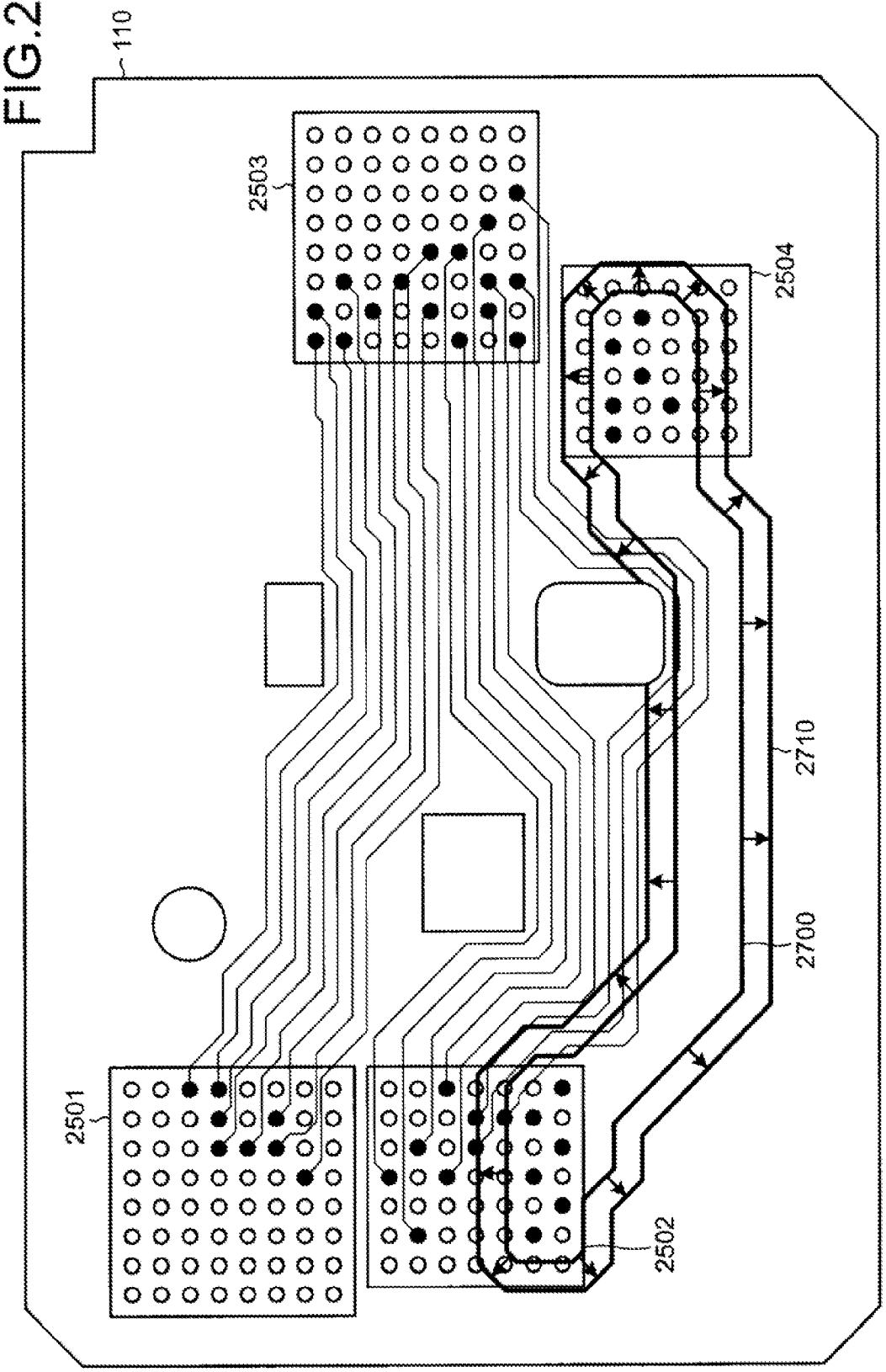
FIG. 29 is an explanatory diagram of an example of the expanding tentative wiring area in the second example.

FIG. 29 is an explanatory diagram of an example of the expanding tentative wiring area in the second example. The design support apparatus 100 expands the tentative wiring area 2700 according to the number of unwired nets detected by the verification of the wiring capacity, establishing a new tentative wiring area 2710. As described in FIG. 28, four unwired nets are detected from the tentative wiring area 2700. Therefore, the design support apparatus 100 expands the tentative wiring area 2700 by the width required for wiring four signal lines, establishing the tentative wiring area 2710. Expansion width of the tentative wiring area 2700 per unwired net varies according to the line breadth of the signal line and the line-to-line space.

Figure 30:
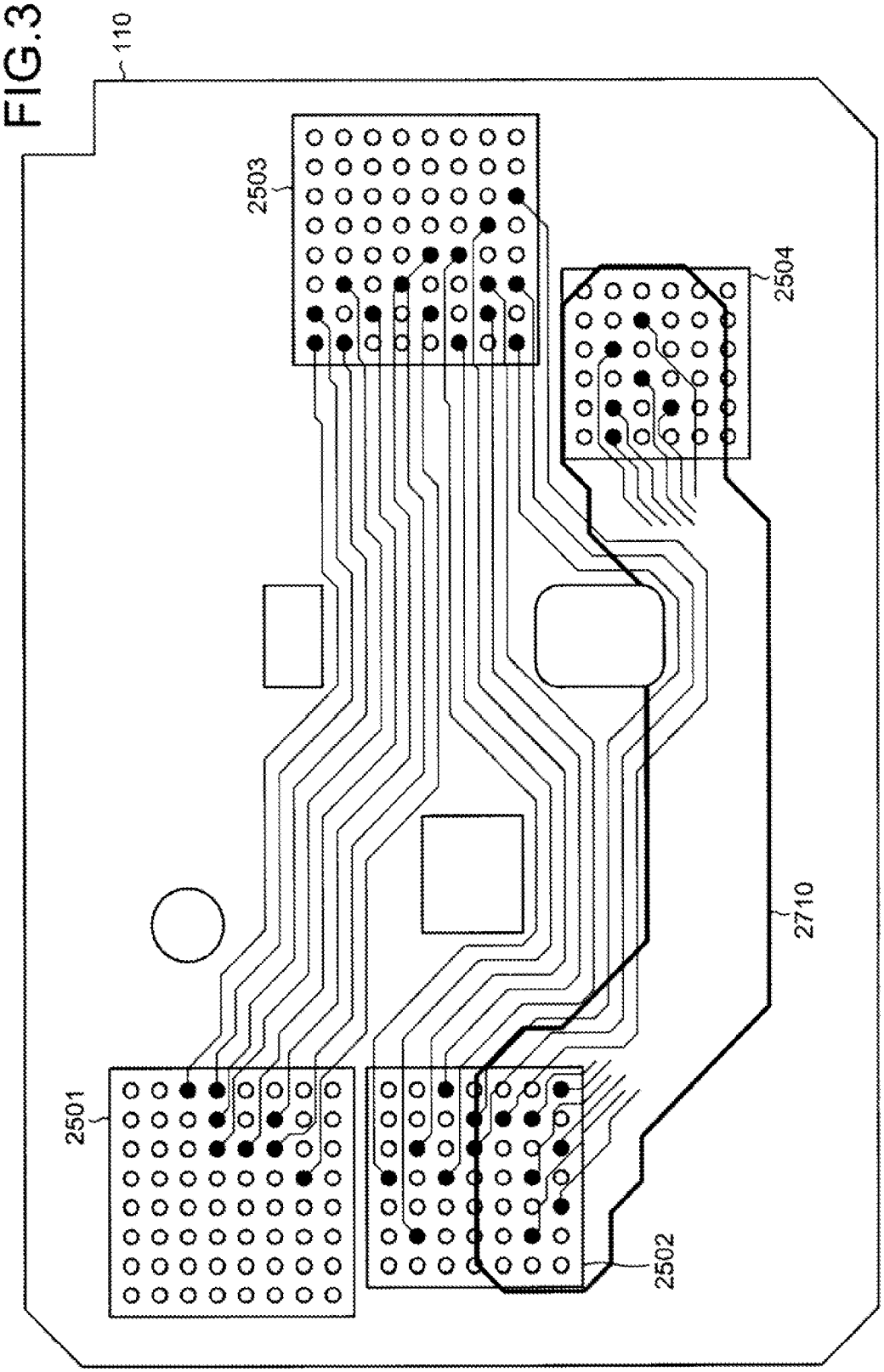
FIG. 30 is an explanatory diagram of an example of executing the wiring engine after the expansion of the tentative wiring area in the second example.

FIG. 30 is an explanatory diagram of an example of executing the wiring engine after the expansion of the tentative wiring area in the second example. With the tentative wiring area 2710 newly established, the design support apparatus 100 simulates, by the wiring engine, the wiring path preparation with respect to each signal line belonging to the bus from the terminal groups 2502 and 2504, to verify the wiring capacity.

Figure 31:
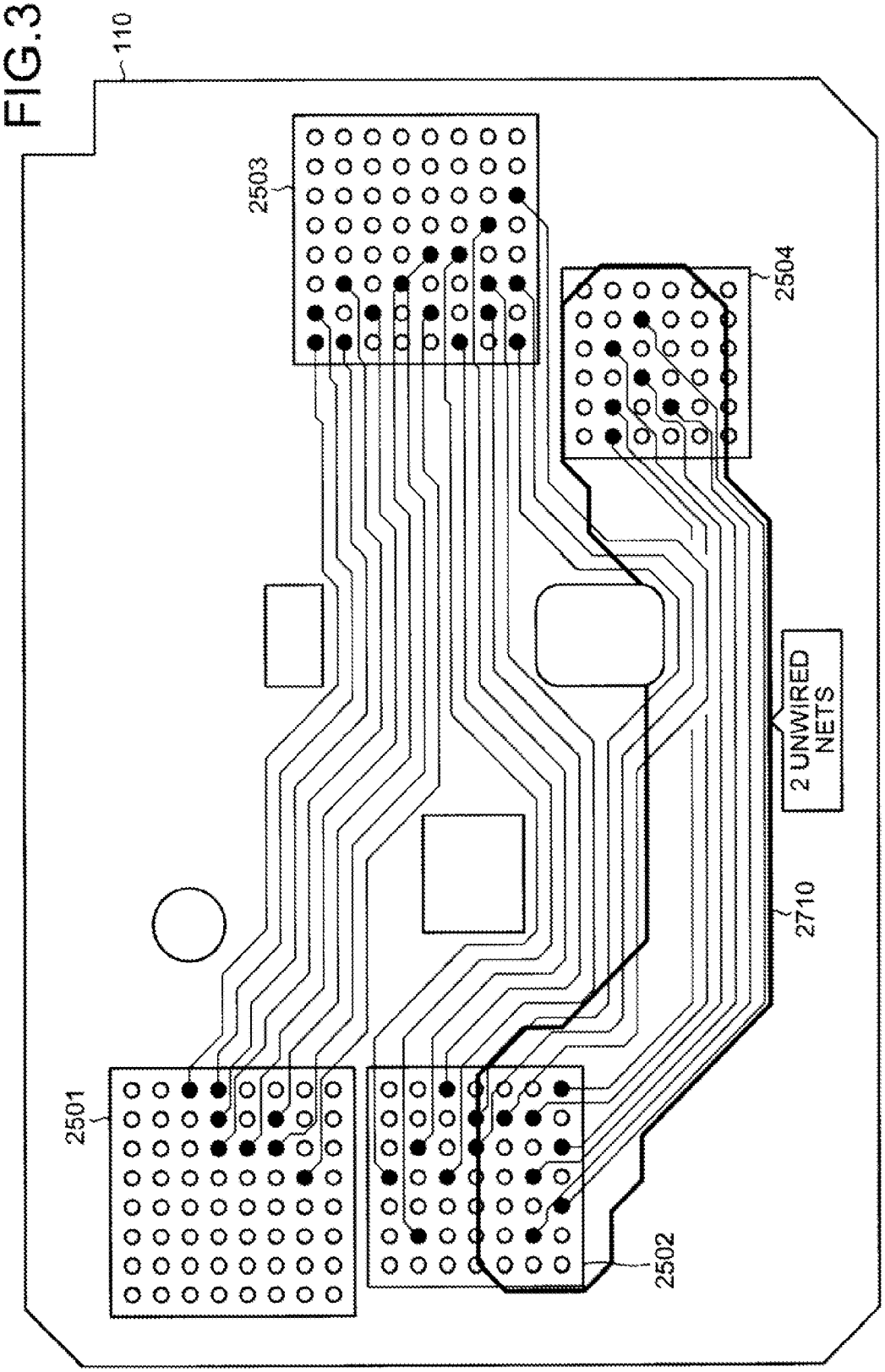
FIG. 31 is an explanatory diagram of an example of an occurrence of an unwired net after the expansion of the tentative wiring area in the second example.

FIG. 31 is an explanatory diagram of an example of an occurrence of an unwired net after the expansion of the tentative wiring area in the second example. As depicted in FIG. 31, as a result of the simulation of the wiring path with respect to the tentative wiring area 2710 by the execution of the wiring engine, two unwired nets occur between the terminal groups 2502 and 2504. Therefore, the design support apparatus 100 again moves to the processing of updating the tentative wiring area 2710.

Figure 32:
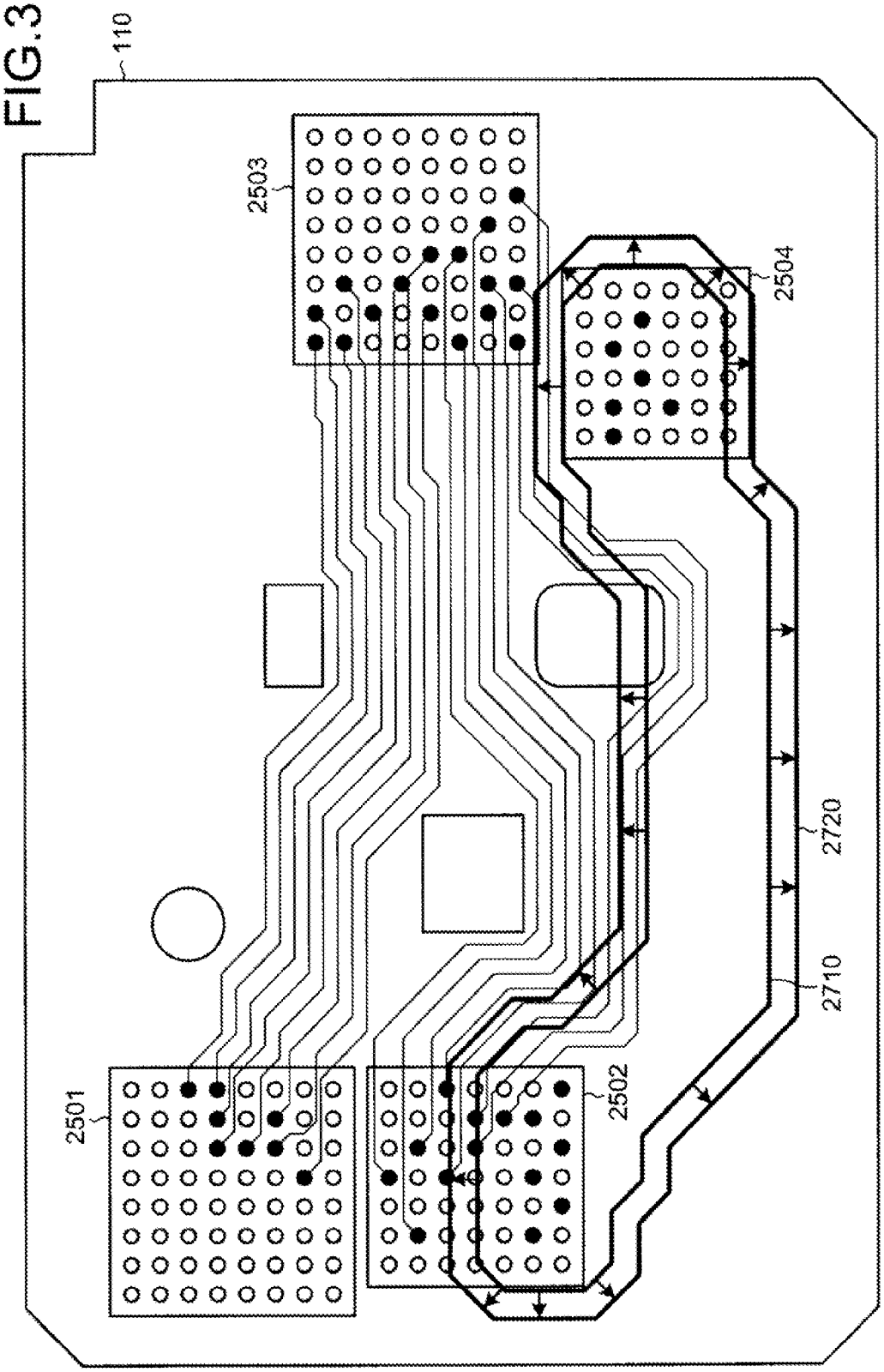
FIG. 32 is an explanatory diagram of a second example of the expanding tentative wiring area in the second example.

FIG. 32 is an explanatory diagram of a second example of the expanding tentative wiring area in the second example. The design support apparatus 100 executes the updating processing according to the number of unwired nets detected by the verification of the wiring capacity with respect to the tentative wiring area 2710 in the same way as with respect to the tentative wiring area 2700. As described in FIG. 31, two unwired nets are detected from the tentative wiring area 2710. Therefore, the design support apparatus 100 expands the tentative wiring area 2710 by the width required for wiring two signal lines, establishing a tentative wiring area 2720 (second expansion).

Figure 33:
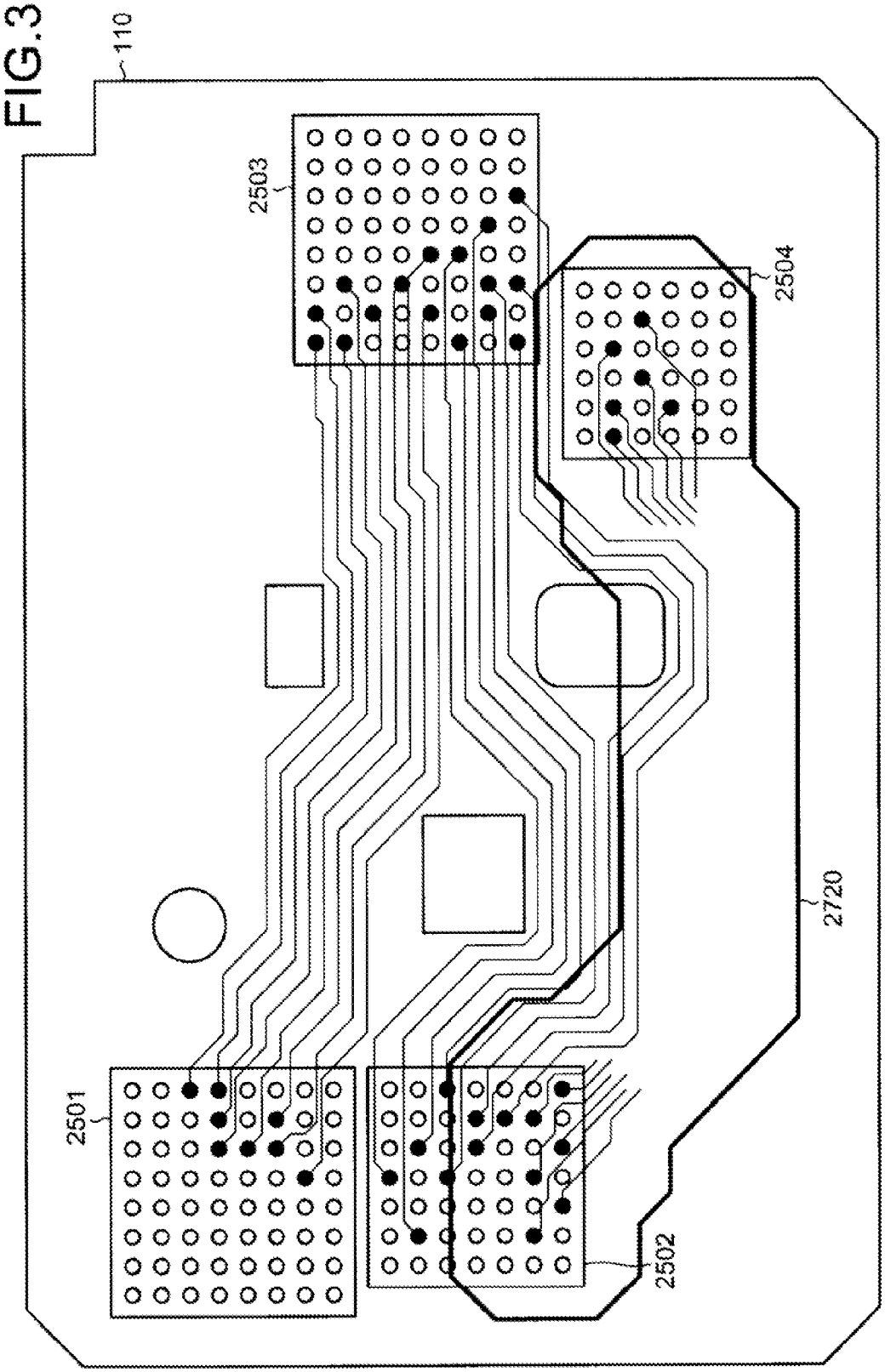
FIG. 33 is an explanatory diagram of an example of an occurrence of an unwired net after the expansion of the tentative wiring area in the second example.

FIG. 33 is an explanatory diagram of an example of an occurrence of an unwired net after the expansion of the tentative wiring area in the second example. With the tentative wiring area 2710 newly established, in the same way as with respect to after the previous processing, the design support apparatus 100 simulates, by the wiring engine, the wiring path preparation with respect to each signal line belonging to the bus from the terminal groups 2502 and 2504, to verify the wiring capacity.

Figure 34:
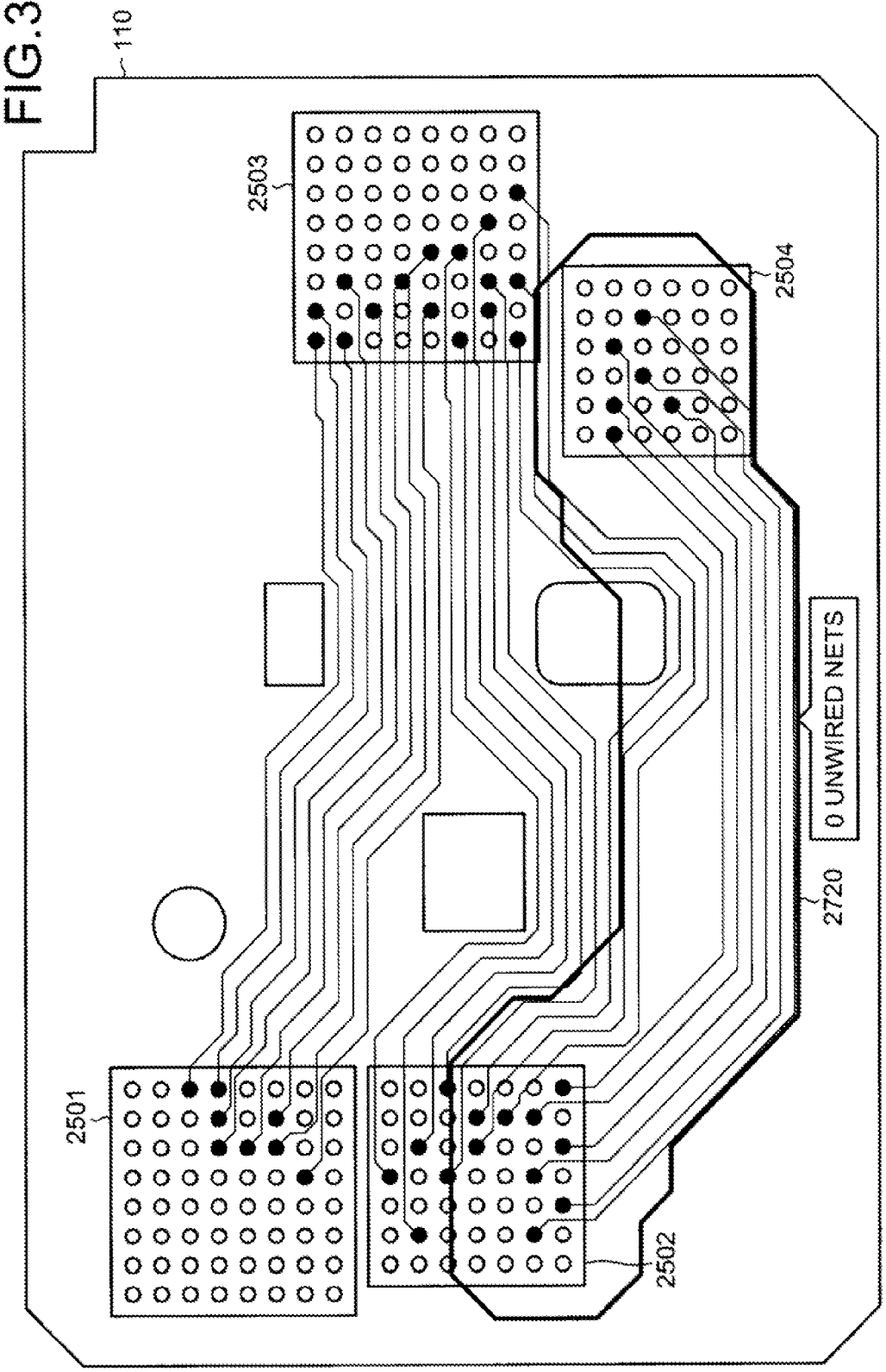
FIG. 34 is an explanatory diagram of an example of resolving unwired nets in the second example.
Figure 35:
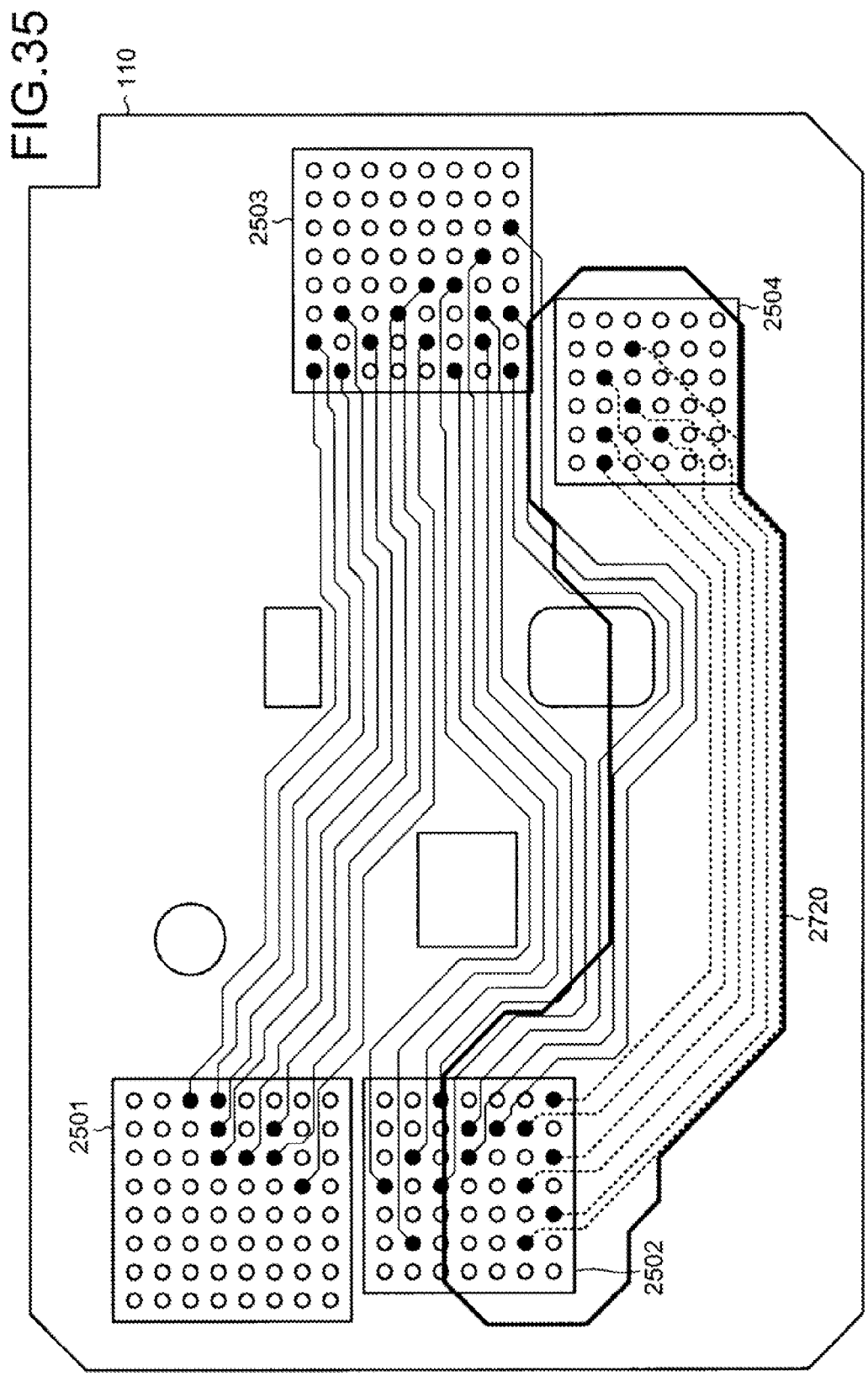
FIG. 35 is an explanatory diagram of an example of determining the wiring area in the second example.

FIG. 34 is an explanatory diagram of an example of resolving the unwired nets in the second example. FIG. 35 is an explanatory diagram of an example of determining the wiring area in the second example. As depicted in FIG. 34, as a result of the simulation of the wiring path with respect to the tentative wiring area 2720 by the execution of the wiring engine, the unwired nets between the terminal groups 2502 and 2504 are resolved and all signal lines are connected. Therefore, as depicted in FIG. 35, the design support apparatus 100 determines the tentative wiring area 2720 having the unwired nets resolved, to be the wiring area, ending a sequence of processing.

As described above, in the second example, the wiring area of the buses is sequentially determined even if there are plural adjacent buses on the printed circuit board 110. Even if the wiring area of a previously executed bus significantly intrudes into the tentative wiring area of an adjacent bus, resulting in overlapping wirings, the design support apparatus 100 verifies the wiring capacity, treating the overlapped area as the obstacle. Likewise, at the time of performing the expansion processing of the tentative wiring area, the design support apparatus 100 treats the overlapping part described above as an obstacle and excludes it from the expanded area. In the same way as in the first example, the design support apparatus 100 can efficiently determine the appropriate wiring area free of an unwired net.

Figure 36:
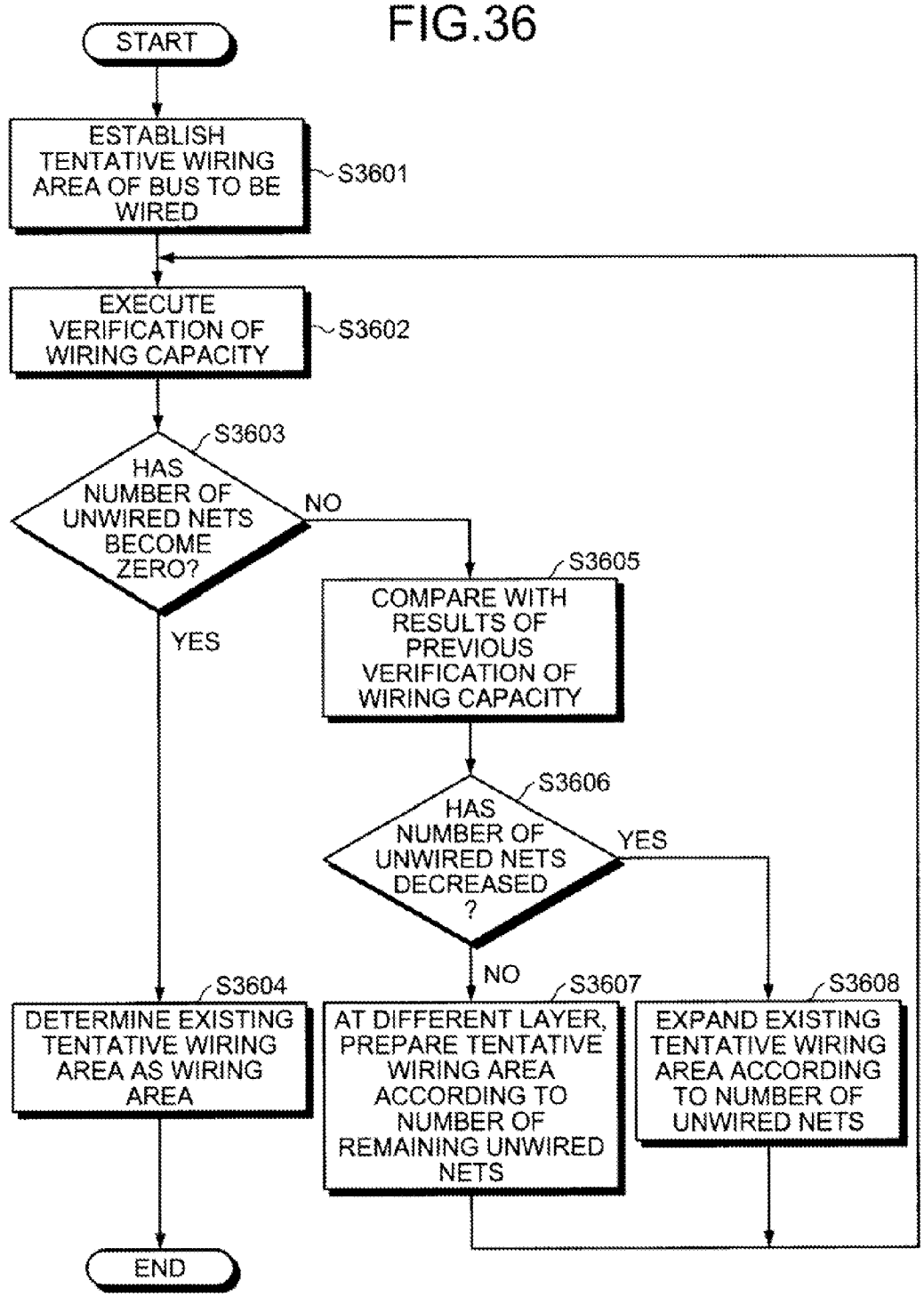
FIG. 36 is a flowchart of the wiring area determination processing in a third example.

FIG. 36 is a flowchart of the wiring area determination processing in the third example. The third example denoted by the flowchart of FIG. 36 determines the wiring area of the bus for which the layer of the wiring is specified. Therefore, the third example is used at the time of determining the wiring area in the printed circuit board 110 of multi-layer structure. The execution of the processing of FIG. 36 makes it possible to determine the appropriate wiring area at a specified layer.

In FIG. 36, the design support apparatus 100 firstly establishes the tentative wiring area of the bus to be wired (step S3601). The design support apparatus 100 then executes the verification of the wiring capacity with respect to the established tentative wiring area (step S3602). The design support apparatus 100 then judges whether the number of unwired nets is zero based on the results of the verification (step S3603) and, if it is judged that the number of unwired nets is zero (step S3603: YES), determines the existing tentative wiring area established at the current moment, to be the wiring area (step S3604), ending a sequence of processing.

On the other hand, if it is judged that the number of unwired nets is not zero (step S3603: NO), the design support apparatus 100 compares the wiring capacity of the last time and the wiring capacity verified immediately before (step S3605). The design support apparatus 100 then judges from the results of the comparison at step S3605 whether the number of unwired nets has decreased as compared with that of the last time (step S3606). If the verification of the wiring capacity has been performed only once, the processing proceeds on with automatic assumption that the number of unwired nets has decreased.

If it is judged at step S3606 that the number of unwired nets has decreased (step S3606: YES), then the design support apparatus 100 expands the existing tentative wiring area according to the number of unwired nets (step S3608) and goes to step S3602 to execute the verification of the wiring capacity with respect to the tentative wiring area after the expansion.

On the other hand, if it is judged at step S3606 that the number of unwired nets has not decreased (step S3606: NO), then the design support apparatus 100 judges that the appropriate wiring area cannot be established at the current layer (e.g., first layer). Therefore, the design support apparatus 100 establishes the tentative wiring area of remaining unwired nets at a different layer (e.g., second layer) (step S3607).

If the tentative wiring area is established at a different layer by step S3607, then the design support apparatus 100 goes to the processing at step S3602 to verify the wiring capacity of the other layer. Thereafter, in the same way as in the first and the second examples, the design support apparatus 100 repeats the expansion processing until the unwired nets are resolved and, if the unwired nets are resolved (step S3603: YES), determines the existing tentative wiring area established at that time, to be the wiring area (step S3604), ending a sequence of processing. An example will be described of determining the wiring area according to the procedure described above with reference to FIGS. 37 to 41.

Figure 37:
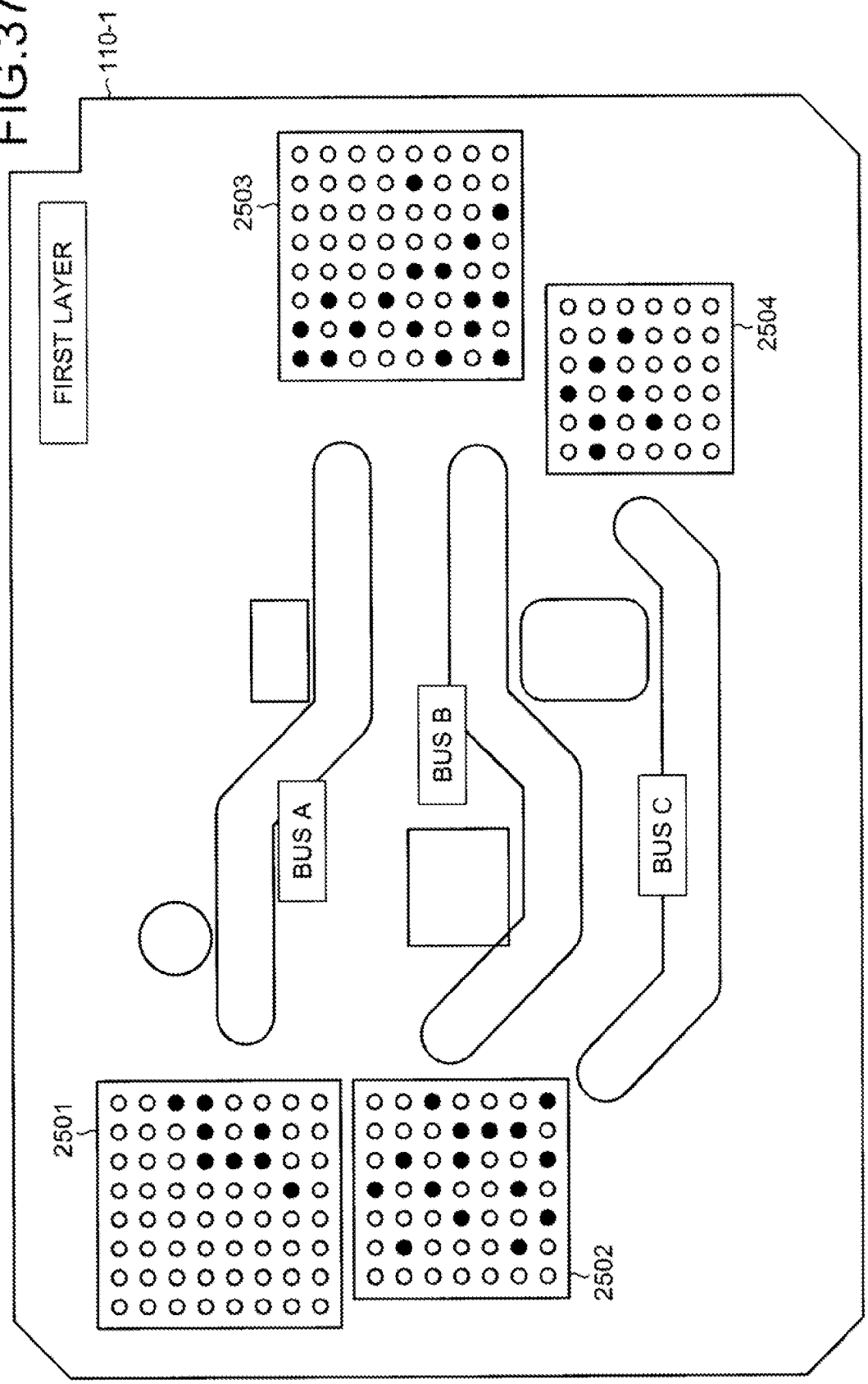
FIG. 37 is an explanatory diagram of an example of establishing the tentative wiring area of each bus in the third example.

FIG. 37 is an explanatory diagram of an example of establishing the tentative wiring area of each bus in the third example. As depicted in FIG. 37, the third example describes the procedure up to the determination of the appropriate wiring area with respect to the buses A, B, and C among the terminal groups 2501 to 2504 in the printed circuit board 110 (first layer 110-1 and second layer 110-2). The bus A connects the terminal groups 2501 and 2503, the bus B connecting the terminal groups 2502 and 2503, and the bus C connecting the terminal groups 2502 and 2504.

Figure 38:
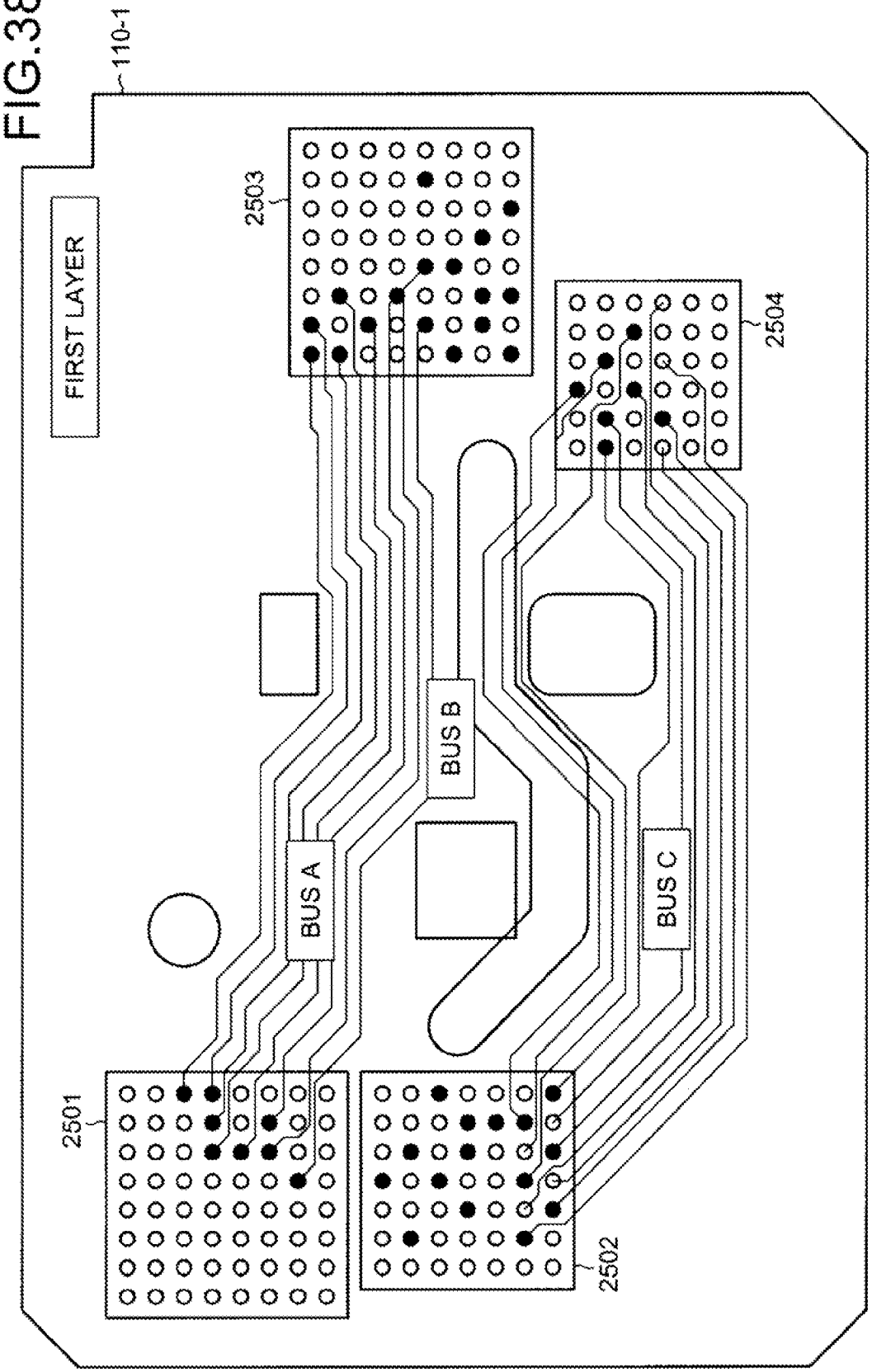
FIG. 38 is an explanatory diagram of an example of determining the wiring area of another bus in the third example.

FIG. 38 is an explanatory diagram of an example of determining the wiring area of another bus in the third example. As depicted in FIG. 38, in the case of wiring with respect to the buses A and C, since the respective tentative wiring areas of the buses A and C do not overlap, the wiring area can be determined on the first layer 110-1, using the procedure described in the first example as it is. Therefore, FIGS. 39 to 41 below will describe the procedure up to the determination of the appropriate wiring area with respect to the bus B whose tentative wiring area overlaps the wiring area of the bus C.

Figure 39:
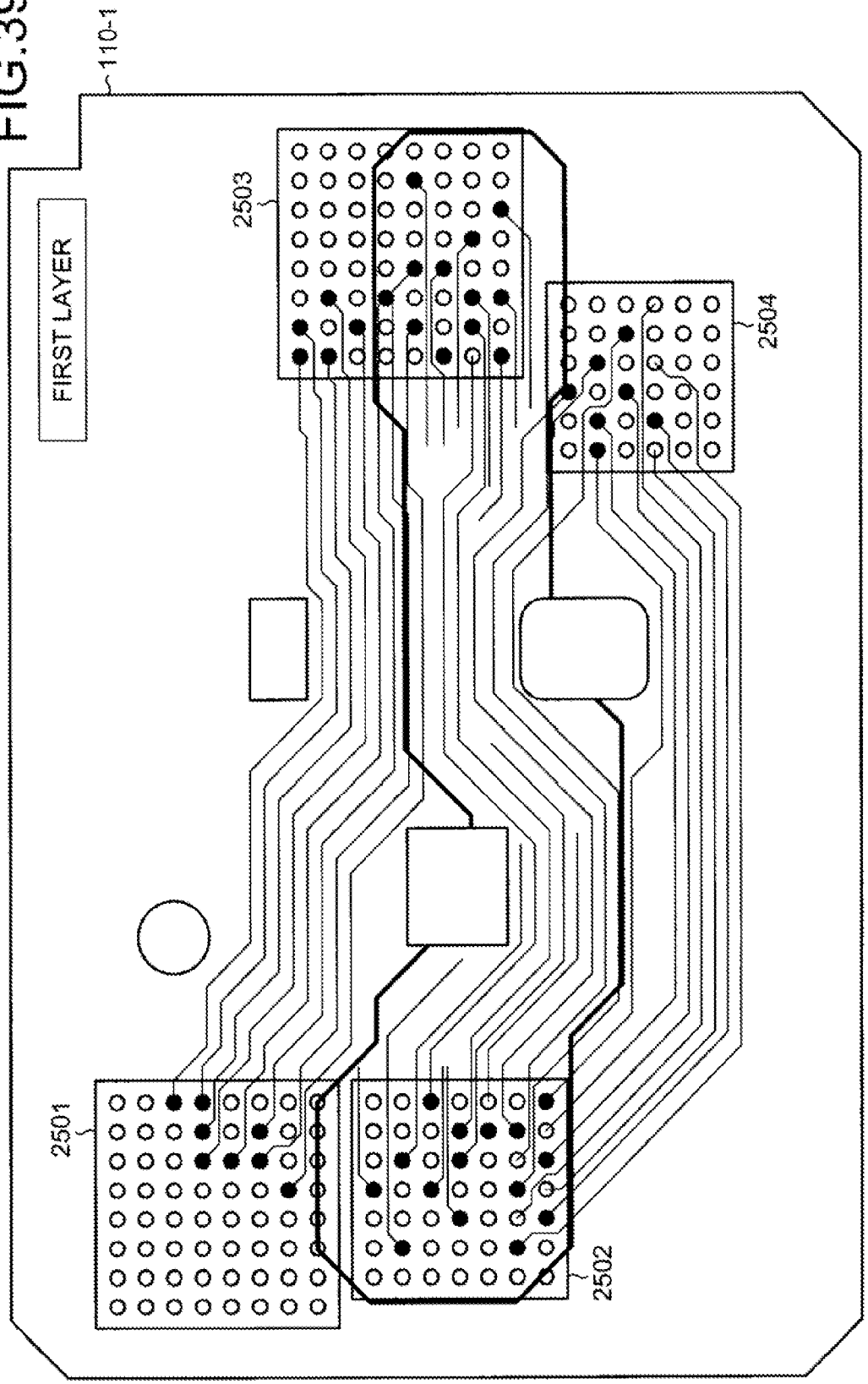
FIG. 39 is an explanatory diagram of an example of verifying the wiring capacity of a first layer in the third example.
Figure 40:
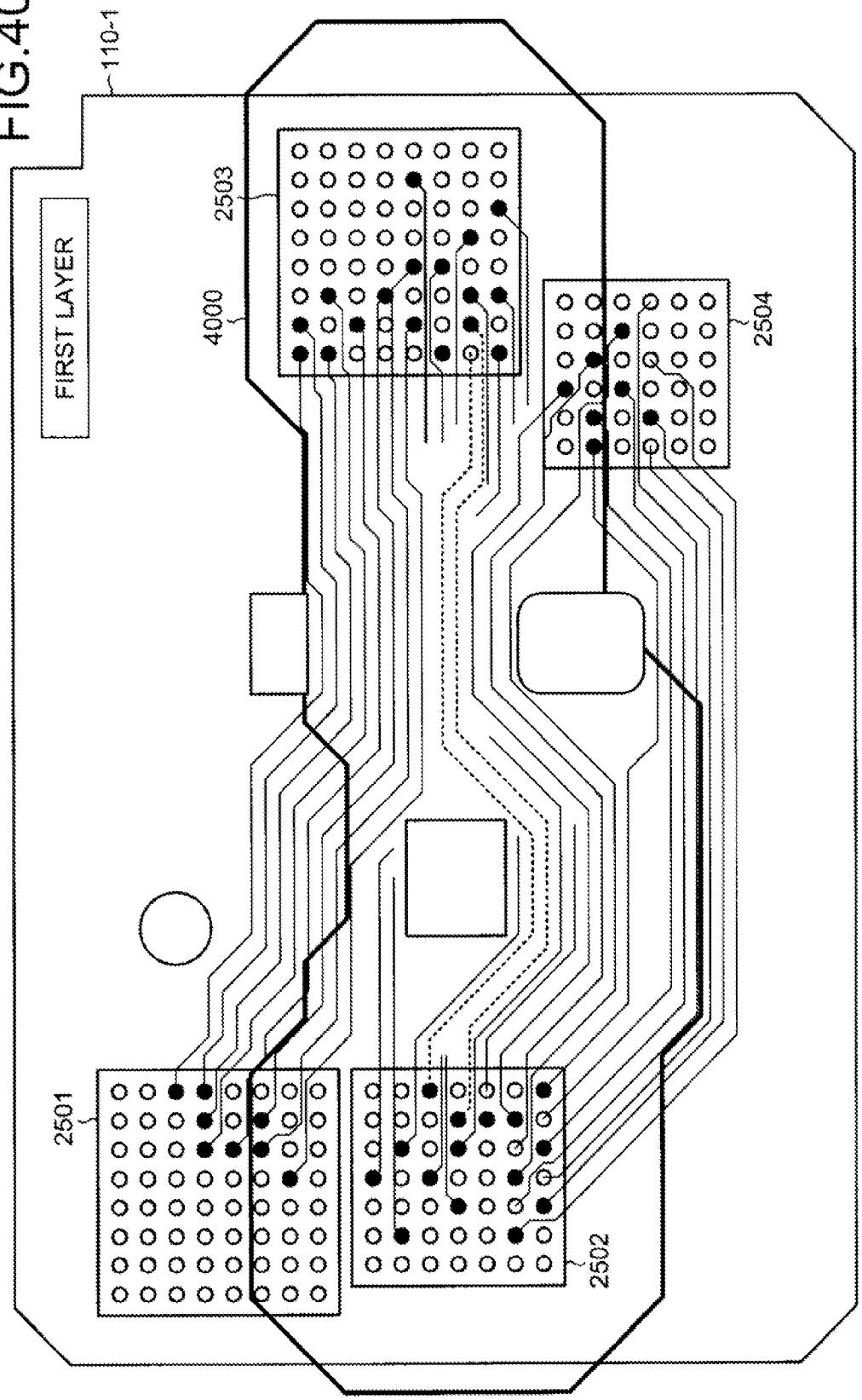
FIG. 40 is an explanatory diagram of an example of establishing the wiring area of the first layer in the third example.

FIG. 39 is an explanatory diagram of an example of verifying the wiring capacity of the first layer in the third example. FIG. 40 is an explanatory diagram of an example of establishing the wiring area of the first layer in the third example. Firstly with respect to the bus B, the design support apparatus 100 executes the verification of the wiring capacity of the first layer 110-1. As depicted in FIG. 40, however, the first layer 110-1 already has a high density of the wiring areas for the buses A and C and even if the expansion processing is executed, all that can be done is to establish a tentative wiring area 4000 capable of wiring two signal lines. Therefore, the design support apparatus 100 determines the current tentative wiring area as the wiring area with respect to the first layer 110-1 and moves to the processing of verifying the wiring area of the unwired nets on the second layer 110-2.

Figure 41:
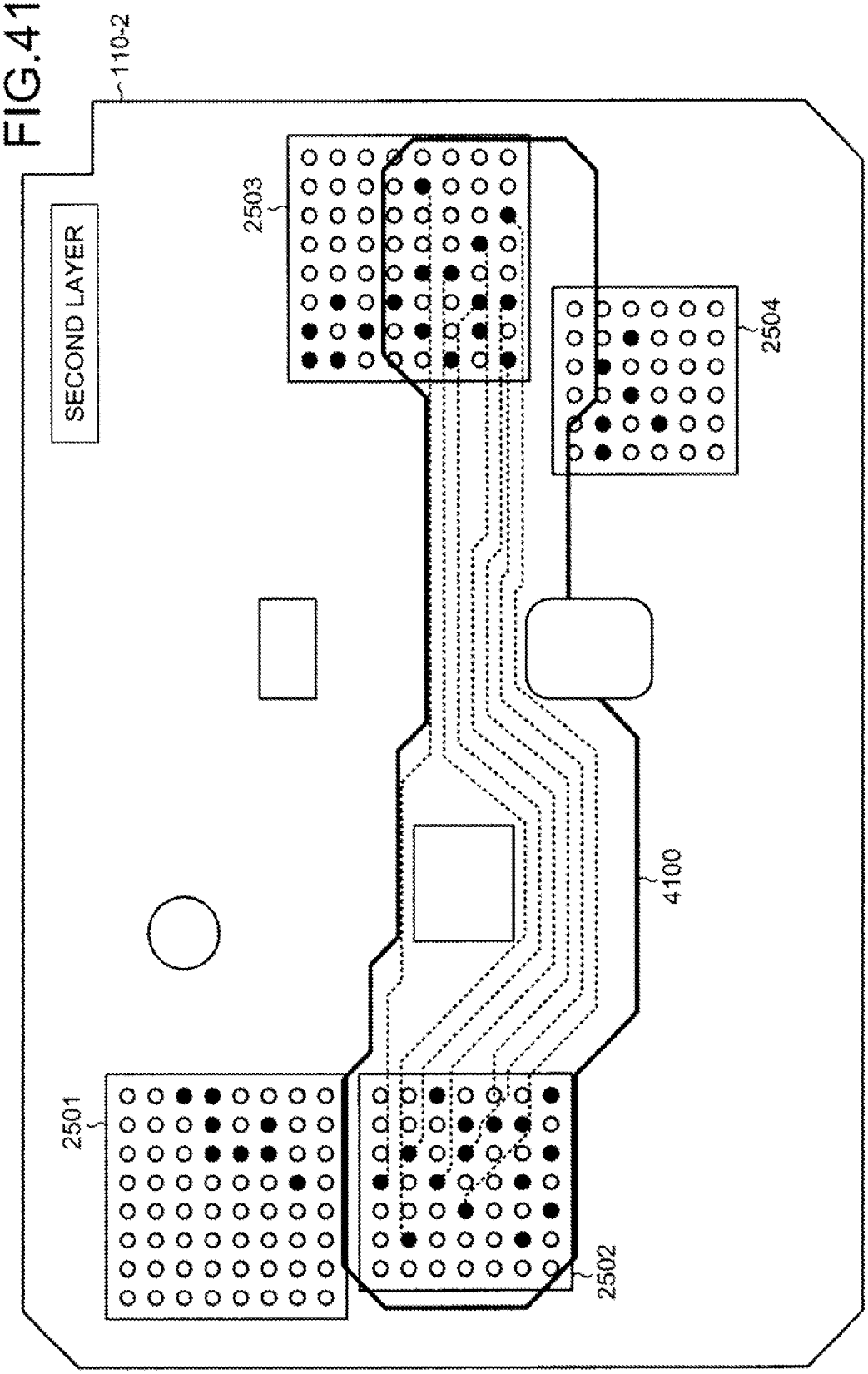
FIG. 41 is an explanatory diagram of an example of establishing the wiring area of a second layer in the third example.

FIG. 41 is an explanatory diagram of an example of establishing the wiring area of the second layer in the third example. As depicted in FIG. 41, the wiring area of the buses A and C is not involved in the second layer 110-2. Therefore, the design support apparatus 100 newly establishes a tentative wiring area 4100 to verify the wiring capacity with respect to seven unwired nets connecting the terminal groups 2502 and 2503. If it is judged as a result of the verification that the unwired nets have been resolved, then the design support apparatus 100 determines the current tentative wiring area, to be the wiring area, ending a sequence of processing.

As described above, in the third example, with respect to the bus for which the wiring layer is specified from the designer or a higher system, the design support apparatus 100 firstly performs the wiring verification preferentially at the specified layer. If, as a result of the verification of the wiring capacity, the number of unwired nets does not come to zero after the expansion to a certain extent, the design support apparatus 100 prepares the current tentative wiring area at the specified layer. The design support apparatus 100 determines a wiring area at another layer and according to the number of nets that cannot be accommodated in the existing tentative wiring area and are unwired. As a result, even if the specified layer has a high density of wiring, the design support apparatus 100 is capable of determining a wiring area free of the unwired nets while exploiting to a maximal extent, the wiring area at the specified layer.

Figure 42:
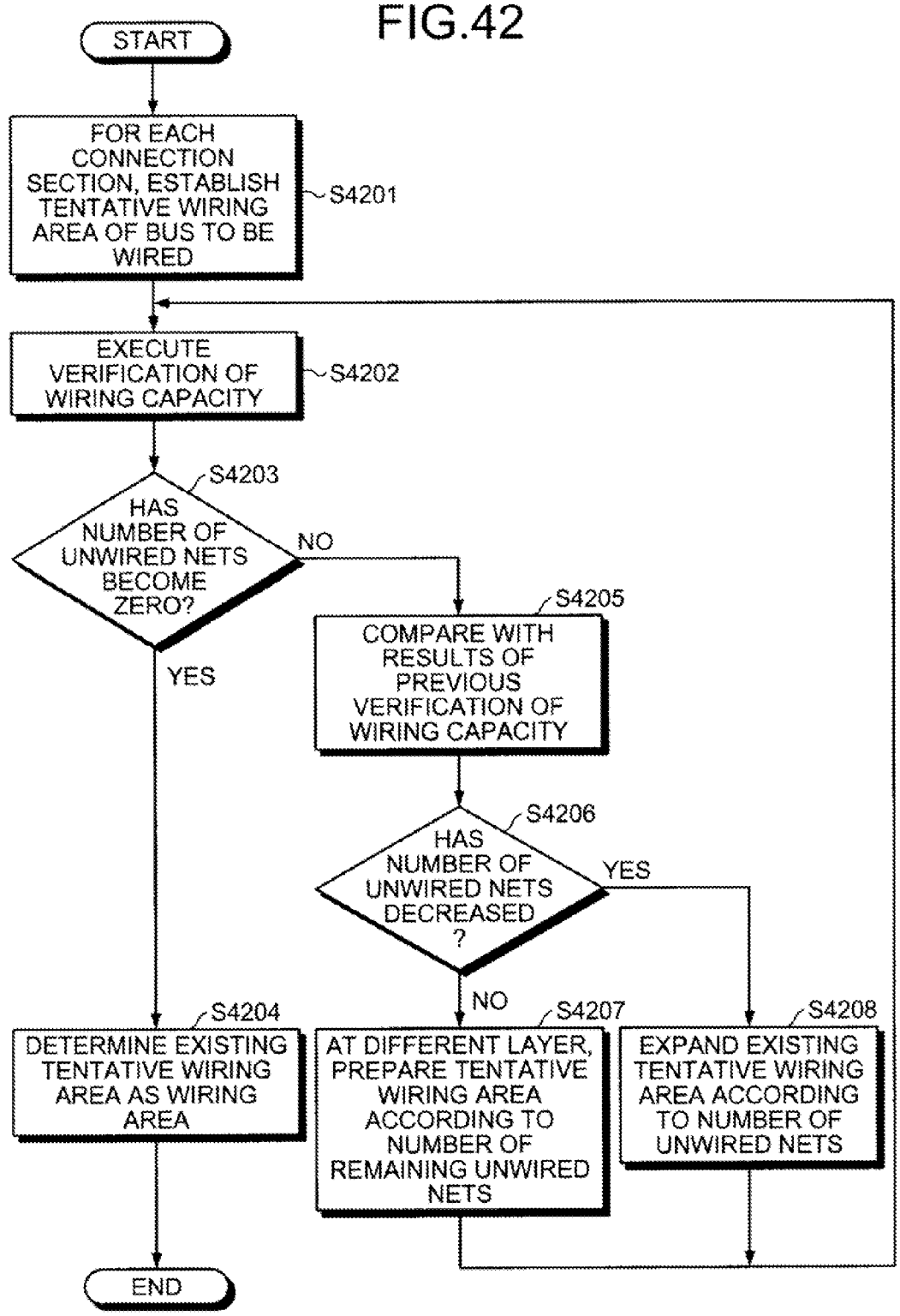
FIG. 42 is a flowchart of the wiring area determination processing in a fourth example.

FIG. 42 is a flowchart of the wiring area determination processing in the fourth example. The fourth example denoted by the flowchart of FIG. 42 determines the wiring area in consideration of each connection section when plural connection sections are established within one bus. Execution of the processing of FIG. 42 makes it possible to determine an appropriate wiring area according to the function of the elements connecting the bus.

In FIG. 42, the design support apparatus 100, for each connection section, establishes the tentative wiring area of the bus to be wired (step S4201). The design support apparatus 100 then executes the verification of the wiring capacity with respect to each established tentative wiring area (step S4202). The design support apparatus 100 then judges whether the number of unwired nets is zero based on the results of the verification (step S4203) and, if it is judged that the number of unwired nets is zero (step S4203: YES), determines the existing tentative wiring area established at the current moment, to be the wiring area (step S4204), ending a sequence of processing.

On the other hand, if it is judged that the number of unwired nets is not zero (step S4203: NO), the design support apparatus 100 compares the wiring capacity of the last time and the wiring capacity verified immediately before (step S4205). The design support apparatus 100 then judges from the results of the comparison at step S4205 whether the number of unwired nets has decreased as compared with that of the last time (step S4206). If the verification of the wiring capacity has been performed only once, the processing proceeds on with automatic assumption that the number of unwired nets has decreased.

If it is judged at step S4206 that the number of unwired nets has decreased (step S4206: YES), then the design support apparatus 100 expands the existing tentative wiring area according to the number of unwired nets (step S4208) and goes to step S4202 to execute the verification of the wiring capacity with respect to the tentative wiring area after the expansion.

On the other hand, if it is judged at step S4206 that the number of unwired nets has not decreased (step S4206: NO), then the design support apparatus 100 judges that the appropriate wiring area cannot be established at the current layer (e.g., first layer). Therefore, the design support apparatus 100 establishes the tentative wiring area of remaining unwired nets at a different layer (e.g., second layer) (step S4207).

If the tentative wiring area is established at a different layer by step S4207, then the design support apparatus 100 goes to the processing at step S4202 to verify the wiring capacity of the other layer. Thereafter, in the same way as in the first and the second examples, the design support apparatus 100 repeats the expansion processing until the unwired nets are resolved and, if the unwired nets are resolved (step S4203: YES), determines the existing tentative wiring area established at that time, to be the wiring area (step S4204), ending a sequence of processing. An example will be described of determining the wiring area according to the procedure described above with reference to FIGS. 43 to 49.

Figure 43:
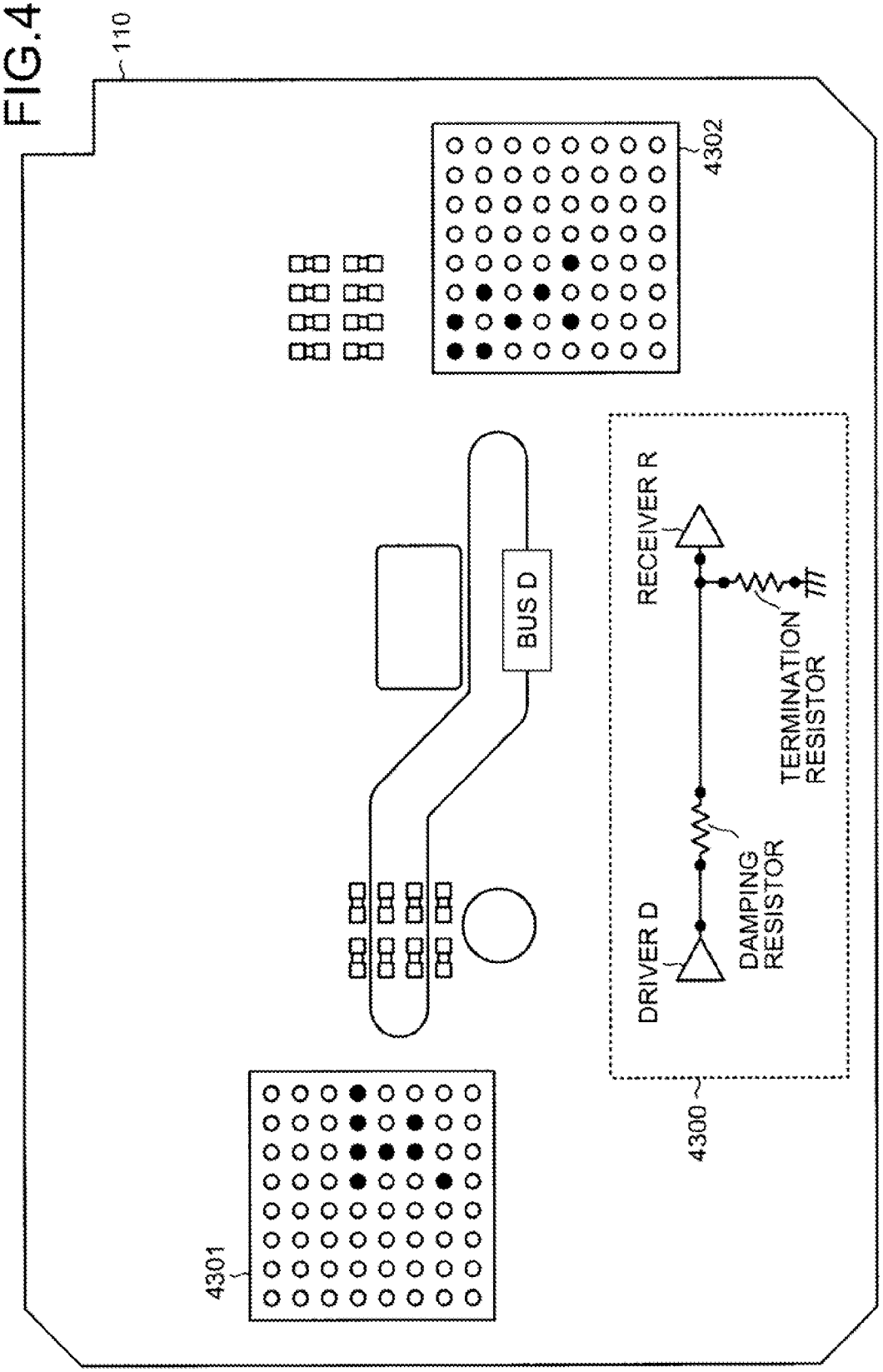
FIG. 43 is an explanatory diagram of an example of establishing the tentative wiring area in the fourth example.

FIG. 43 is an explanatory diagram of an example of establishing the tentative wiring area in the fourth example. As depicted in FIG. 43, in the fourth example, the terminal groups 4301 and 4302 on the printed circuit board 110 are connected by the bus D. The bus D includes such elements (e.g., driver D and receiver R) as depicted in a circuit diagram 4300. Each element is accompanied by various resistors (damping resistor and termination resistor) and to enable the bus D to function, wiring to the resistors is necessary. The circuit diagram 4300 exemplified in FIG. 43 is displayed on the printed circuit board for the sake of convenience and does not represent the configuration on the actual printed circuit board 110.

Figure 44:
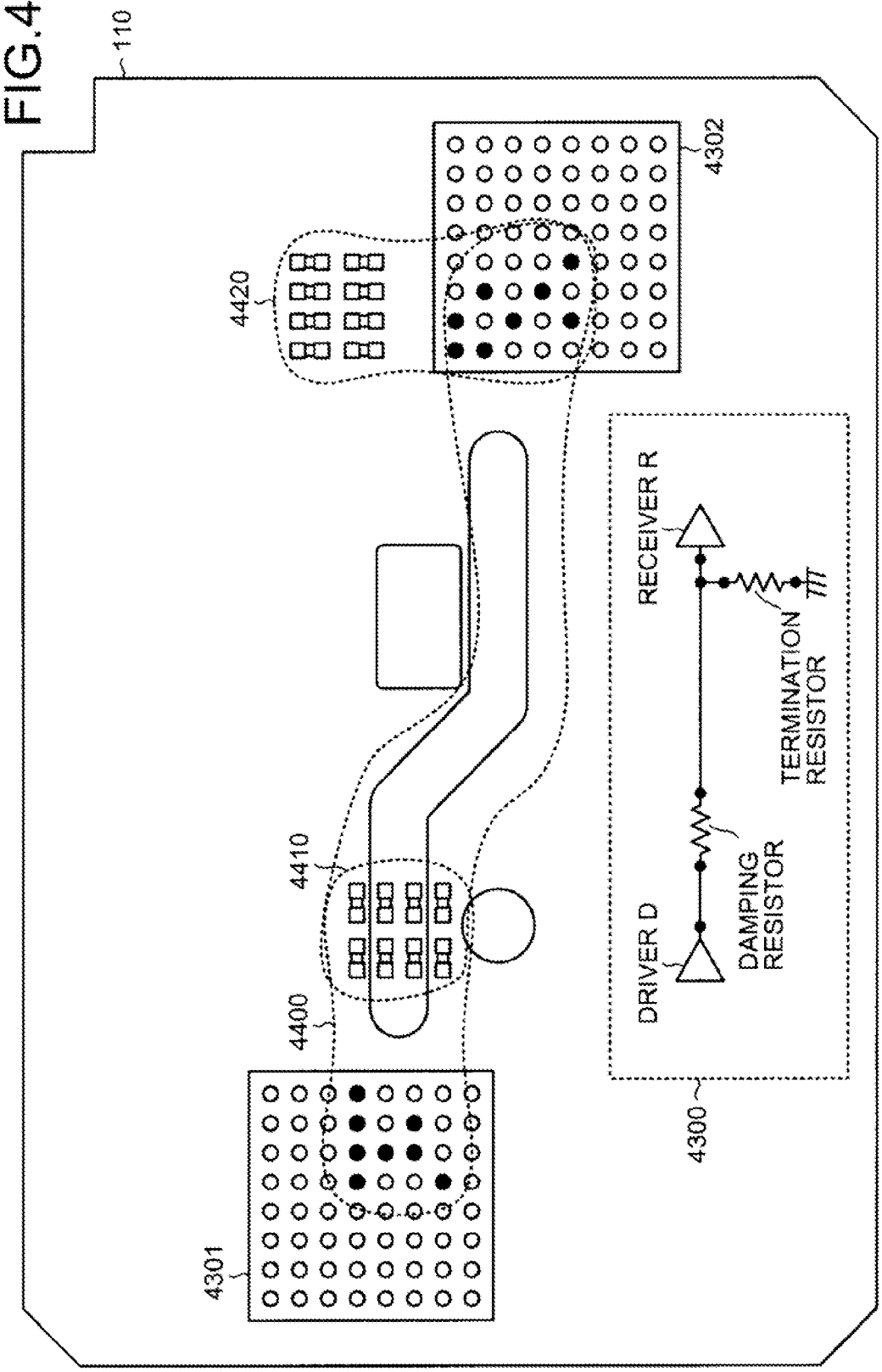
FIG. 44 is an explanatory diagram of an example of verifying the wiring capacity of each connection section in the fourth example.

FIG. 44 is an explanatory diagram of an example of verifying the wiring capacity of each connection section in the fourth example. As described above, the bus D connects the elements depicted in the circuit diagram 4300. Therefore, as depicted in FIG. 44, the verification of the wiring capacity is necessary with respect to three tentative wiring areas 4400, 4410, and 4420.

Figure 45:
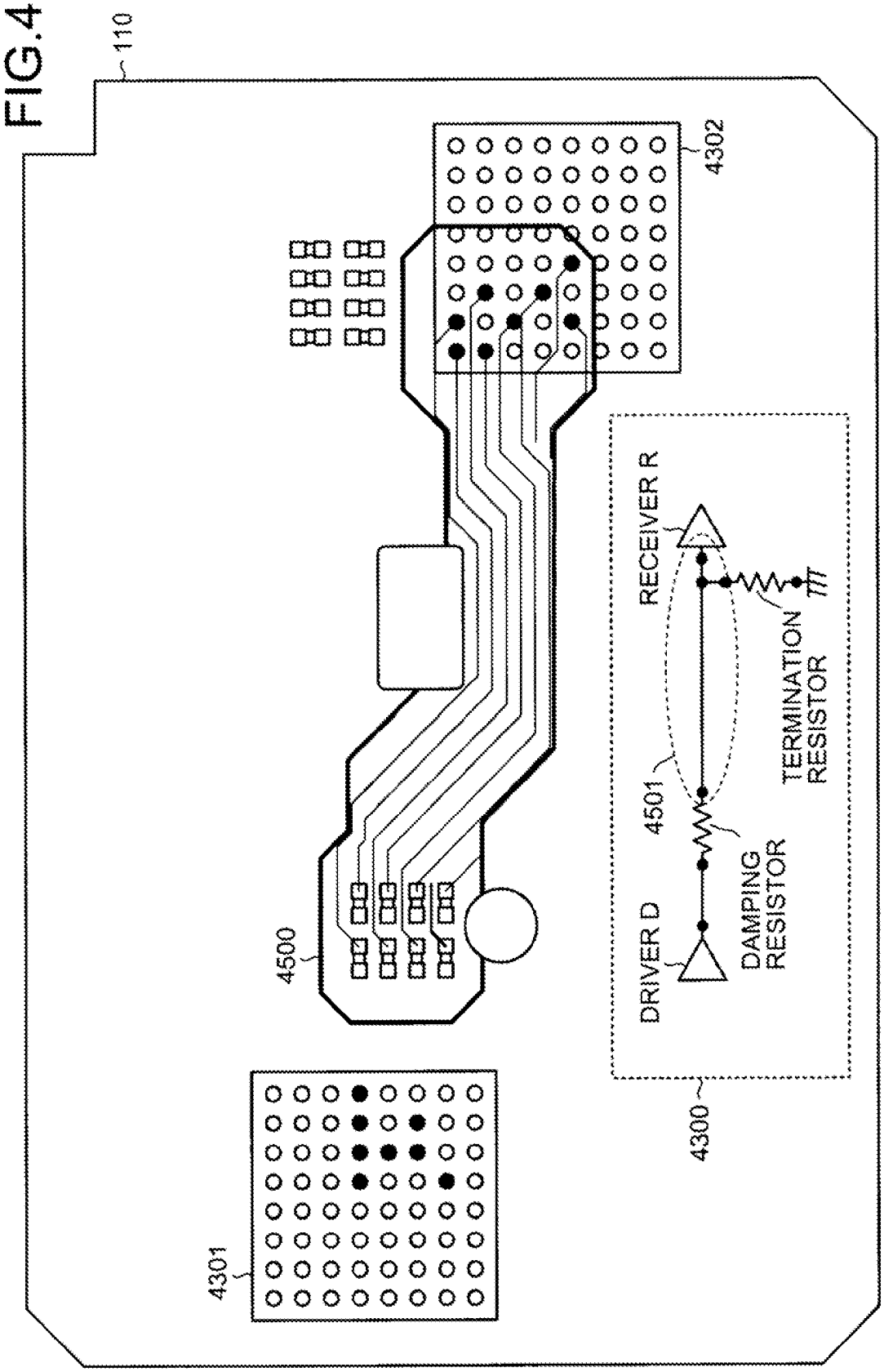
FIG. 45 is an explanatory diagram of an example of verifying the wiring capacity between a damping resistor and a receiver in the fourth example.
Figure 46:
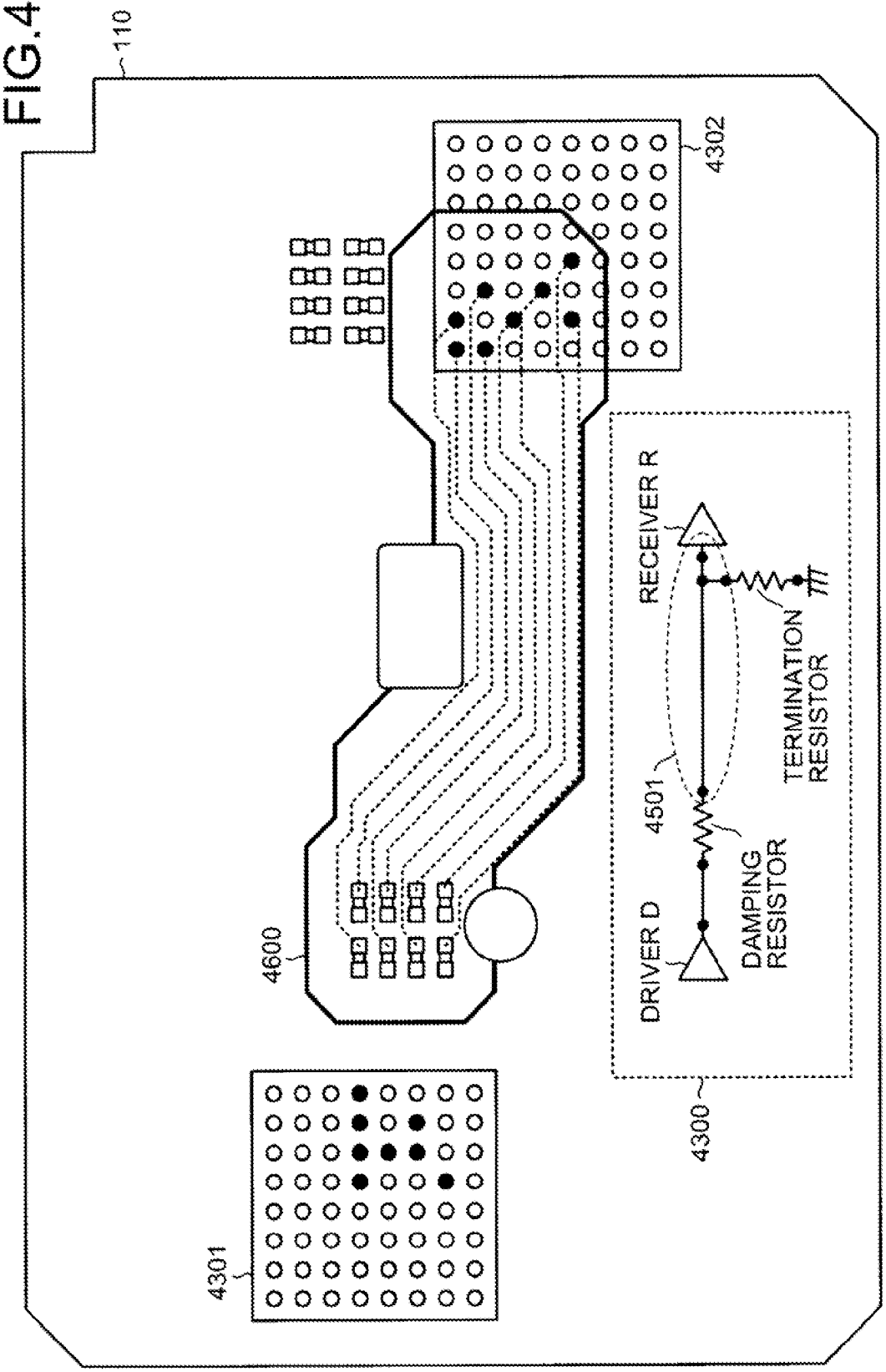
FIG. 46 is an explanatory diagram of an example of determining the wiring area between the damping resistor and the receiver in the fourth example.

FIG. 45 is an explanatory diagram of an example of verifying the wiring capacity between the damping resistor and the receiver in the fourth example. FIG. 46 is an explanatory diagram of an example of determining the wiring area between the damping resistor and the receiver in the fourth example. The design support apparatus 100 firstly verifies the wiring capacity sequentially for each connection section of the elements of the circuit diagram 4300. As depicted in FIG. 45, the design support apparatus 100 firstly verifies the wiring capacity of the tentative wiring area 4500 connecting interspace 4501 between the damping resistor and the receiver. The design support apparatus 100 then determines a wiring area 4600 depicted in FIG. 46 as a result of the execution of expansion processing appropriate according to results of the detection of the unwired net.

Figure 47:
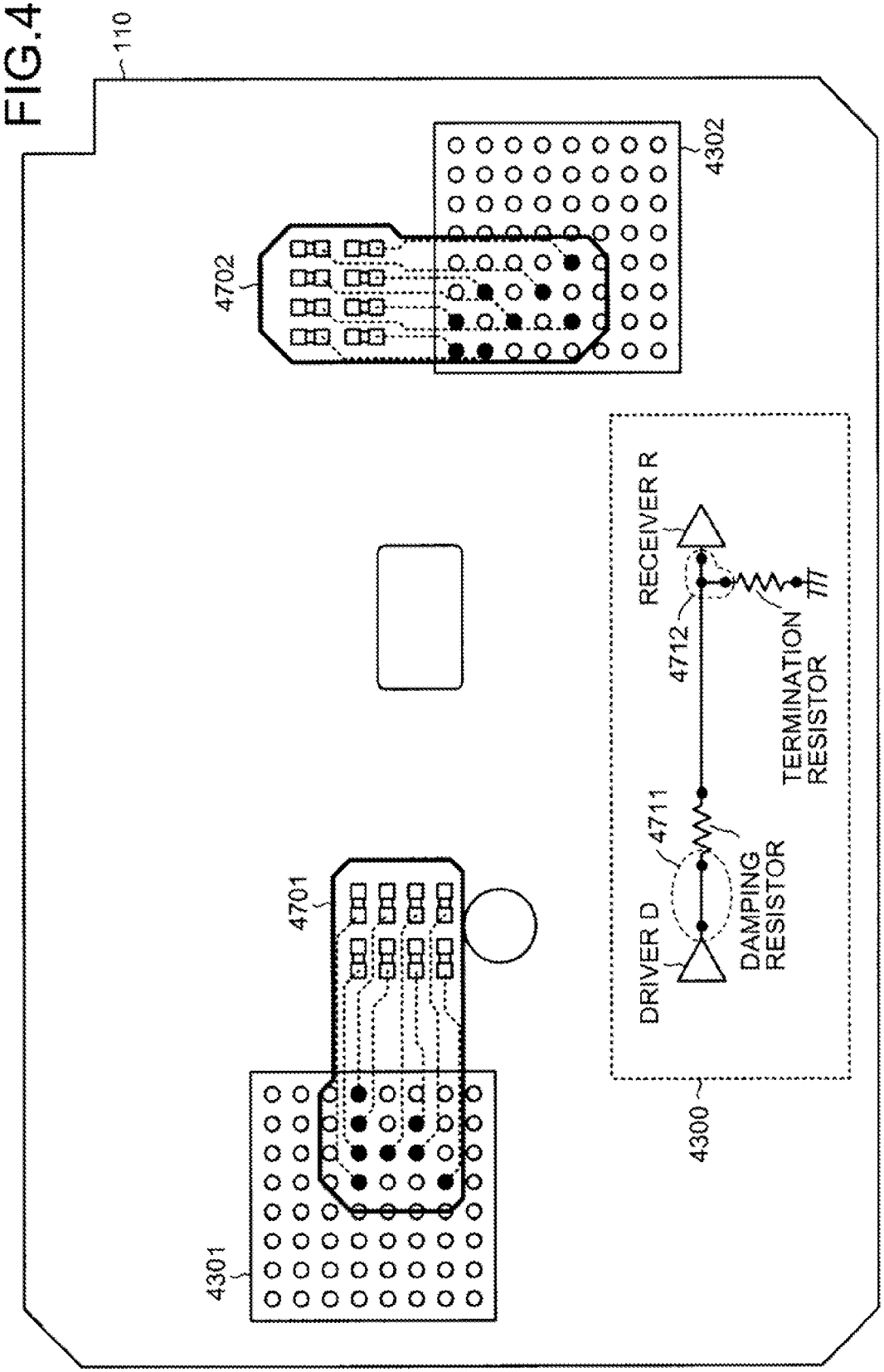
FIG. 47 is an explanatory diagram of an example of verifying the wiring capacity between remaining elements in the fourth example.
Figure 48:
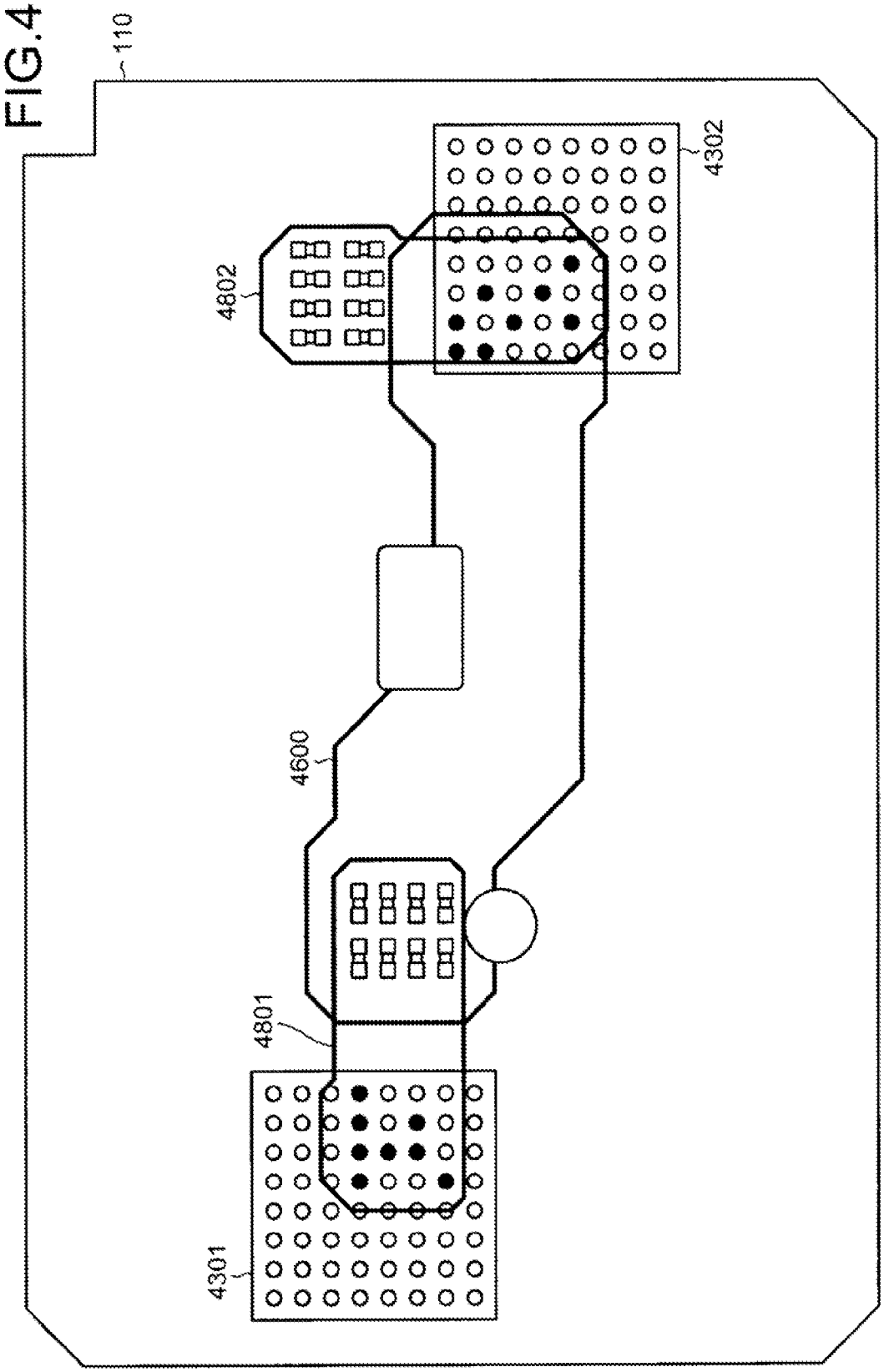
FIG. 48 is an explanatory diagram of an example of determining the wiring area between the remaining elements in the fourth example.

FIG. 47 is an explanatory diagram of an example of verifying the wiring capacity between remaining elements in the fourth example. FIG. 48 is an explanatory diagram of an example of determining the wiring area between the remaining elements in the fourth example. The design support apparatus 100 then verifies the wiring capacity with respect to a tentative wiring area 4701 connecting interspace 4711 between the driver and the damping resistor and a tentative wiring area 4702 connecting interspace 4712 between the receiver and the termination resistor, as the remaining elements of the circuit diagram 4300. As a result of the verification of the wiring capacity, the design support apparatus 100 determines a wiring area 4801 connecting the interspace 4711 between the driver and the damping resistor and a wiring area 4802 connecting the interspace 4712 between the receiver and the termination resistor. Therefore, together with the wiring area 4600 previously determined, a wiring area is determined that connects each signal line necessary for the bus D.

As described above, the fourth example is capable of determining an appropriate wiring area with respect to each connection section even if plural connection sections occur within the bus. As to a case of the plural connection sections, specifically, a case may be cited in which the wiring path of the bus is prepared only in consideration of the interconnection of active parts in the design information 120, as exemplified by FIG. 43. That is to say, the passive elements such as the resistors accompanying the active parts are not taken into consideration when caused to function. At the time of mounting, however, the connection sections connecting the active parts and the passive parts are added. Accordingly, the use of the fourth example makes it possible to determine the wiring area with respect to plural connection sections with additional connection sections added thereto as described above.

Figure 49:
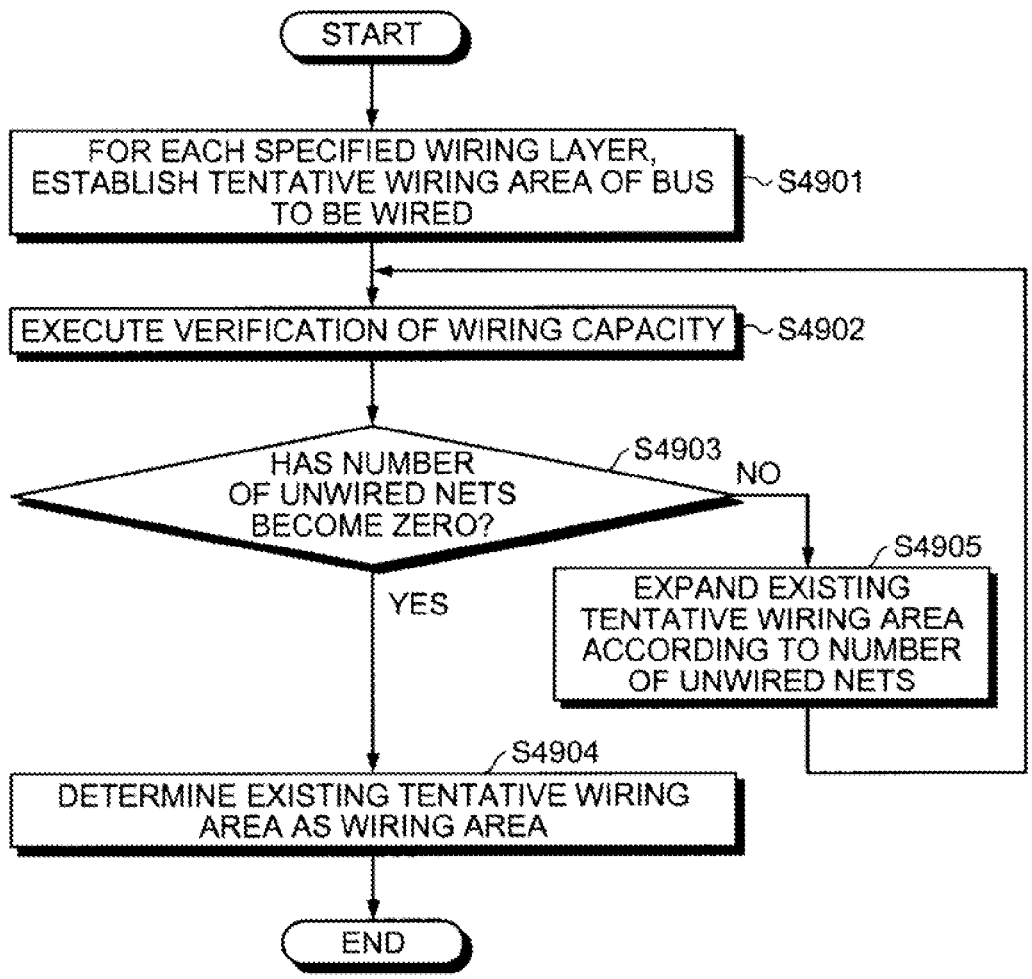
FIG. 49 is a flowchart of the wiring area determination processing in a fifth example.

FIG. 49 is a flowchart of the wiring area determination processing in the fifth example. The fifth example denoted by the flowchart of FIG. 49 determines the wiring area of a bus to be wired to another layer by way of a via in the midst of the outline path. Execution of the processing depicted in FIG. 49 enables an appropriate wiring area to be determined for each layer by way of the specified via.

In FIG. 49, the design support apparatus 100, for each specified layer, independently establishes a wiring area. Firstly, the design support apparatus 100 establishes the tentative wiring area of the bus to be wired (step S4901). The design support apparatus 100 then executes the verification of the wiring capacity with respect to the established tentative wiring areas (step S4902). Thereafter, the design support apparatus 100 independently determines a tentative wiring area for each specified layer.

FIG. 50 is an explanatory diagram of an example of establishing the tentative wiring area and a switching point in the fifth example. As depicted in FIG. 50, for example, when layered setting of a terminal group 5001-(first layer)-a switching point 5003-(second layer)-a terminal group 5002 is made to the printed circuit board 110, the design support apparatus 100 firstly determines the wiring area at the first layer with respect to the terminal group 5001-the switching point 5003. Therefore, the design support apparatus 100 judges from results of the verification at step S4902 whether the number of unwired nets is zero (step S4903) and, if it is judged that the number of unwired nets is zero (step S4903: YES), determines the existing tentative wiring area established at the current moment as the wiring area (step S4904), ending a sequence of processing.

On the other hand, if it is judged at step S4903 that the number of unwired nets is not zero (step S4903: NO), then the design support apparatus 100 expands the tentative wiring area according to the number of nets judged as unwired nets in the existing tentative wiring area currently established (step S4905). The design support apparatus 100 executes the verification of the wiring capacity with respect to the tentative wiring area expanded at step S4905 (step S4902).

Upon execution of the verification of the wiring capacity of the tentative wiring area newly established, the design support apparatus 100 judges the presence or absence of unwired nets, from results of the verification (step S4903). As described above, if it is judged that the number of unwired nets is zero (step S4903: YES), the design support apparatus 100 determines the existing tentative wiring area at the current moment as the wiring area (step S4904). The processing ends after execution at the second layer with respect to the wiring between the switching point 5003 and the terminal group 5002. An example will be described of determining the wiring area according to the procedure described above with reference to FIGS. 51 to 54.

FIG. 51 is an explanatory diagram of an example of establishing the tentative wiring area of each layer in the fifth example. FIG. 52 is an explanatory diagram of an example of verifying the wiring capacity of each layer in the fifth example. As depicted in FIG. 51, at the first layer, a tentative wiring area 5101 is established between the terminal group 5001 and the switching point 5003 and at the second layer, a tentative wiring area 5102 is established between the switching point 5003 and the terminal group 5002. The design support apparatus 100 verifies the wiring capacity with respect to each of the tentative wiring areas 5101 and 5102, as depicted in FIG. 52. The design support apparatus 100 designs a via 5100 at the switching point 5003 of each layer.

FIG. 53 is an explanatory diagram of an example of expanding the tentative wiring area of each layer in the fifth example. FIG. 54 is an explanatory diagram of an example of determining the wiring area of each layer in the fifth example. As depicted in FIG. 53, the design support apparatus 100 verifies the wiring capacity of the established tentative wiring areas 5101 and 5102 with respect to the corresponding layers thereof. The design support apparatus 100 performs suitable expansion processing according to results of the verification, establishing a tentative wiring area 5301 at the first layer and a tentative wiring area 5302 at the second layer. After establishing the tentative wiring areas 5301 and 5302, the design support apparatus 100 verifies the wiring capacity and if no unwired net is detected, directly determines the tentative wiring areas 5301 and 5302 to be the wiring area.

As described above, even if the switching point of the layer is established in the midst of the outline path of the bus in the printed circuit board 110 of a multi-layer structure, the fifth example is capable of determining an appropriate wiring area at each layer, with the via taken as a base point.

As described above, according to the design support program, the design support apparatus, and the design support method, the processing of expanding the tentative wiring area is automatically executed repeatedly according to the number of unwired nets detected from the tentative wiring area until the unwired nets have been resolved. Therefore, since unnecessary expansion processing is prevented and the appropriate wiring area is determined, the reworking due to occurrence of the unwired nets can be prevented and efficient wiring design can be supported.

The above technology is equipped with the function of performing the verification avoiding the wiring area of other bus at the time of verifying the wiring capacity. Therefore, even on the printed circuit board on which plural buses are established and the density is high, the occurrence of unwired nets can be prevented.

The above technology is equipped with the function of establishing other layer as an object of wiring when no further resolution is expected of the unwired nets by the expansion processing of the tentative wiring area at the layer to which the wiring processing is applied. Therefore, in the case of the multi-layer printed circuit board, the wiring area can be expanded to other layer, avoiding such a situation as impossible wiring.

The above technology is equipped with the function of determining the wiring area with respect to each connection section when there are plural connection sections within the bus. Therefore, the appropriate wiring area can be established so that the unwired nets will not occur, with respect to the elements, such as the passive parts, unconsidered at the time of designing as well.

The above technology can also be equipped with the function of designing the via at the switching point of the layer and making it the base point of connection with the terminal group of each layer in the case of receiving a design instruction to cause one bus to be connected to different layers. The appropriate wiring area can be established at each layer by designing the via at the switching point and verifying the wiring capacity with respect to the terminal group of each layer.

The design support method described in the present embodiment may be implemented by executing a prepared program on a computer such as a personal computer and a workstation. The program is stored on a computer-readable, non-transitory medium such as a hard disk, a flexible disk, a CD-ROM, an MO, and a DVD, read out from the recording medium, and executed by the computer. The program may be a transmission medium that can be distributed through a network such as the Internet.

The design support apparatus 100 described in the present embodiment can be realized by an application specific integrated circuit (ASIC) such as a standard cell or a structured ASIC, or a programmable logic device (PLD) such as a field-programmable gate array (FPGA). Specifically, for example, functional units (detecting unit 501 to deciding unit 510) of the design support apparatus 100 are defined in hardware description language (HDL), which is logically synthesized and applied to the ASIC, the PLD, etc., thereby enabling manufacture of the design support apparatus 100.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A computer-readable, non-transitory medium storing therein a design support program causing a computer that executes tentative wiring processing between a first terminal group and a second terminal group in a tentative wiring area to execute a process comprising:
   detecting a number of unwired nets occurring in the tentative wiring area consequent to the tentative wiring processing, each unwired net having an incomplete connection between the first terminal group and the second terminal group;
   updating the tentative wiring area by expanding the tentative wiring area according to the number of unwired nets, if any unwired nets are detected at the detecting;
   controlling to execute the tentative wiring processing and the subsequent detecting with respect to the tentative wiring area updated at the updating; and
   determining the tentative wiring area to be a wiring area if no unwired nets are detected at the detecting.

2. The computer-readable, non-transitory medium according to claim 1, wherein
   the controlling includes executing the tentative wiring processing so as to avoid the wiring area determined at the determining.

3. The computer-readable, non-transitory medium according to claim 1, the process further comprising:
   judging whether at a first layer at which the tentative wiring processing is being executed, the number of unwired nets decreases if the tentative wiring area is expanded at the updating; and
   establishing the tentative wiring area and the first and the second terminal groups at a second layer different from the first layer, if at the judging, it is judged that the number of unwired nets does not decrease, wherein
   the controlling includes executing the tentative wiring processing and the subsequent detecting with respect to the tentative wiring area established at the second layer.

4. The computer-readable, non-transitory medium according to claim 1, the process further comprising:

acquiring connection information of elements within an circuit under design;

extracting from among the acquired connection information, combinations of the elements to be wired; and setting, for each of the extracted combinations, a terminal group of one element to the first terminal group and a terminal group of another element to the second terminal group, wherein the detecting includes detecting, in the tentative wiring area, an unwired net occurring consequent to the tentative wiring processing executed between the first and the second terminal groups set at the setting.

5. The computer-readable, non-transitory medium according to claim 4, the process further comprising:

deciding for a combination, whether any one of the elements is included in the wiring area determined at the determining, wherein the establishing includes establishing the tentative wiring area at a layer different from the layer having the determined wiring area, if at the deciding, it is decided that any one of the elements is included in the determined wiring area, the tentative wiring area being for the first and the second terminal groups in the combination, and the detecting includes detecting, in the tentative wiring area established at the establishing, an unwired net occurring consequent to the tentative wiring processing executed between the first and the second terminal groups in the combination.

6. The computer-readable, non-transitory medium according to claim 4, wherein the extracting includes extracting from the acquired connection information, combinations of the elements connected between different layers, and the setting includes setting a via at a switching point of the different layers and setting a via terminal group to the first terminal group and another terminal group to the second terminal group.

7. The computer-readable, non-transitory medium according to claim 1, wherein the detecting includes detecting the unwired net in the tentative wiring area by executing a maximum flow algorithm as the tentative wiring processing.

8. A design support apparatus that executes tentative wiring processing between a first terminal group and a second terminal group in a tentative wiring area, the design support apparatus comprising:

a detecting unit that executes processing of detecting a number of unwired nets occurring in the tentative wiring area consequent to the tentative wiring processing, each unwired net having an incomplete connection between the first terminal group and the second terminal group;

an updating unit that executes updating processing of expanding the tentative wiring area according to the number of unwired nets, if any unwired nets are detected by the detecting unit;

a control unit that causes the tentative wiring processing and the detecting processing subsequent to the tentative wiring processing to be executed with respect to the tentative wiring area updated by the updating unit; and a determining unit that determines the tentative wiring area to be a wiring area if no unwired nets are detected by the detecting unit.

9. A design support method executed by a computer comprising a detecting unit, an updating unit, a control unit, and a determining unit and executing tentative wiring processing between a first terminal group and a second terminal group in a tentative wiring area, the design support method comprising:

detecting a number of unwired nets occurring in the tentative wiring area consequent to the tentative wiring processing, the detecting being performed by the detecting unit, each unwired net having an incomplete connection between the first terminal group and the second terminal group;

updating the tentative wiring area by expanding the tentative wiring area according to the number of unwired nets, if any unwired nets are detected at the detecting, the updating being performed by the updating unit;

controlling to execute the tentative wiring processing and the subsequent detecting with respect to the tentative wiring area updated at the updating, the controlling being performed by the control unit; and determining the tentative wiring area to be a wiring area if no unwired nets are detected at the detecting, the determining being performed by the determining unit.

* * * * *